United States Patent
Maruko

(10) Patent No.: US 8,232,844 B2
(45) Date of Patent: Jul. 31, 2012

(54) SYNCHRONOUS OSCILLATOR, CLOCK RECOVERY APPARATUS, CLOCK DISTRIBUTION CIRCUIT, AND MULTI-MODE INJECTION CIRCUIT

(75) Inventor: Kenichi Maruko, Kanagawa (JP)

(73) Assignee: Sony Corporation, Tokyo (JP)

( * ) Notice: Subject to any disclaimer, the term of this patent is extended or adjusted under 35 U.S.C. 154(b) by 144 days.

(21) Appl. No.: 12/805,180

(22) Filed: Jul. 16, 2010

(65) Prior Publication Data
US 2011/0063039 A1  Mar. 17, 2011

(30) Foreign Application Priority Data

Sep. 11, 2009  (JP) ................................. 2009-211009
Jun. 7, 2010   (JP) ................................. 2010-130307

(51) Int. Cl.
*H03K 3/03*  (2006.01)
*H03L 7/24*  (2006.01)

(52) U.S. Cl. ........... 331/57; 331/172; 327/141; 327/165
(58) Field of Classification Search .................... 331/57, 331/172, 173; 327/141, 161, 165, 291, 295; 375/371, 373, 355
See application file for complete search history.

(56) References Cited

U.S. PATENT DOCUMENTS
7,302,026 B2 * 11/2007 Kaeriyama et al. ........... 375/355

FOREIGN PATENT DOCUMENTS
JP  08-213979  8/1996

* cited by examiner

*Primary Examiner* — Ryan Johnson
(74) *Attorney, Agent, or Firm* — Rader Fishman & Grauer, PLLC

(57) ABSTRACT

Disclosed herein is a synchronous oscillator including at least one injection circuit having an injection signal input terminal, an internal clock signal input terminal, and a clock output terminal, and at least one delay circuit cascaded to the injection circuit.

33 Claims, 42 Drawing Sheets

Background Art

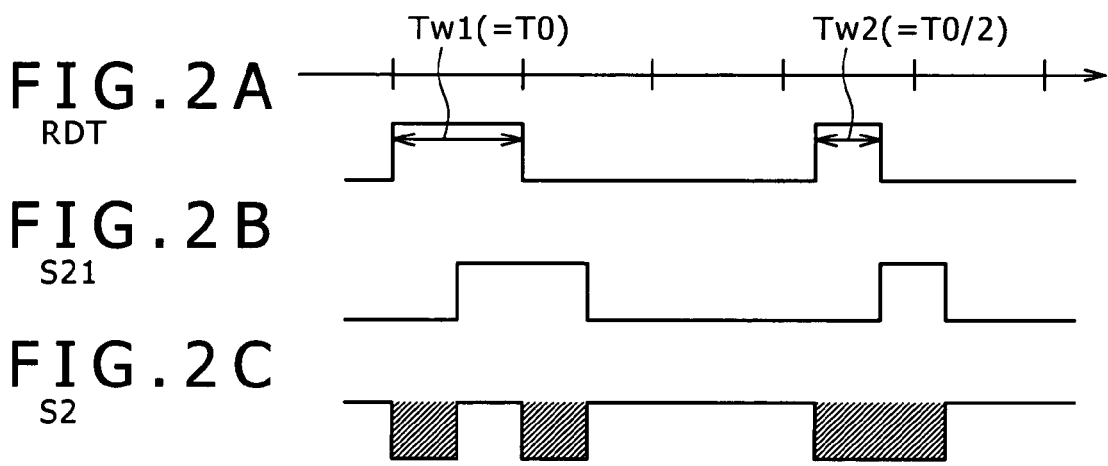
FIG. 2A RDT
FIG. 2B S21
FIG. 2C S2
FIG. 3
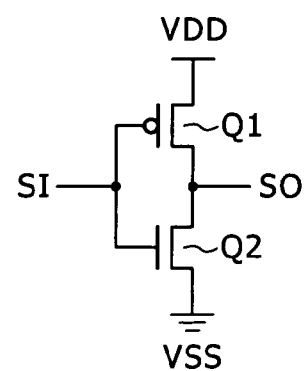

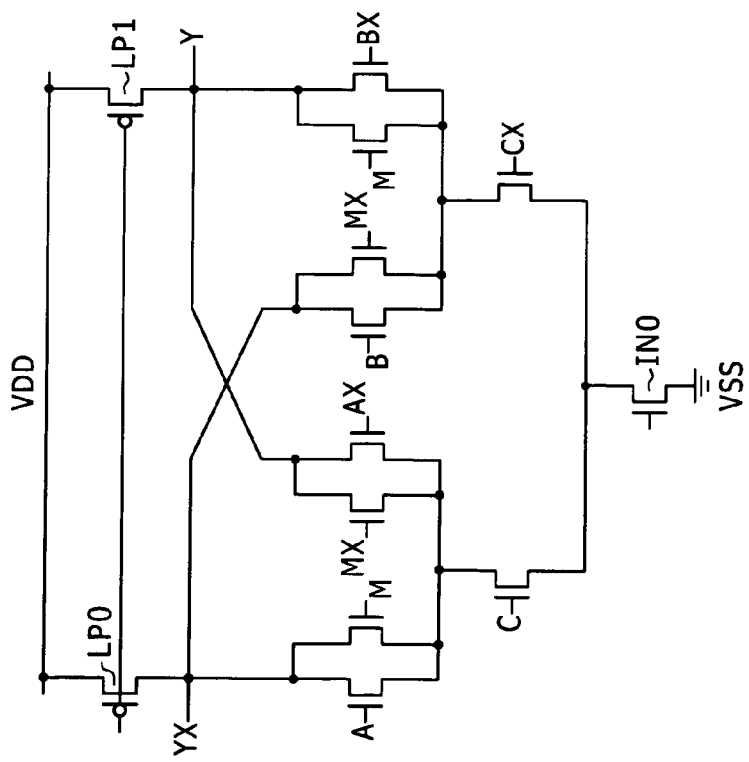

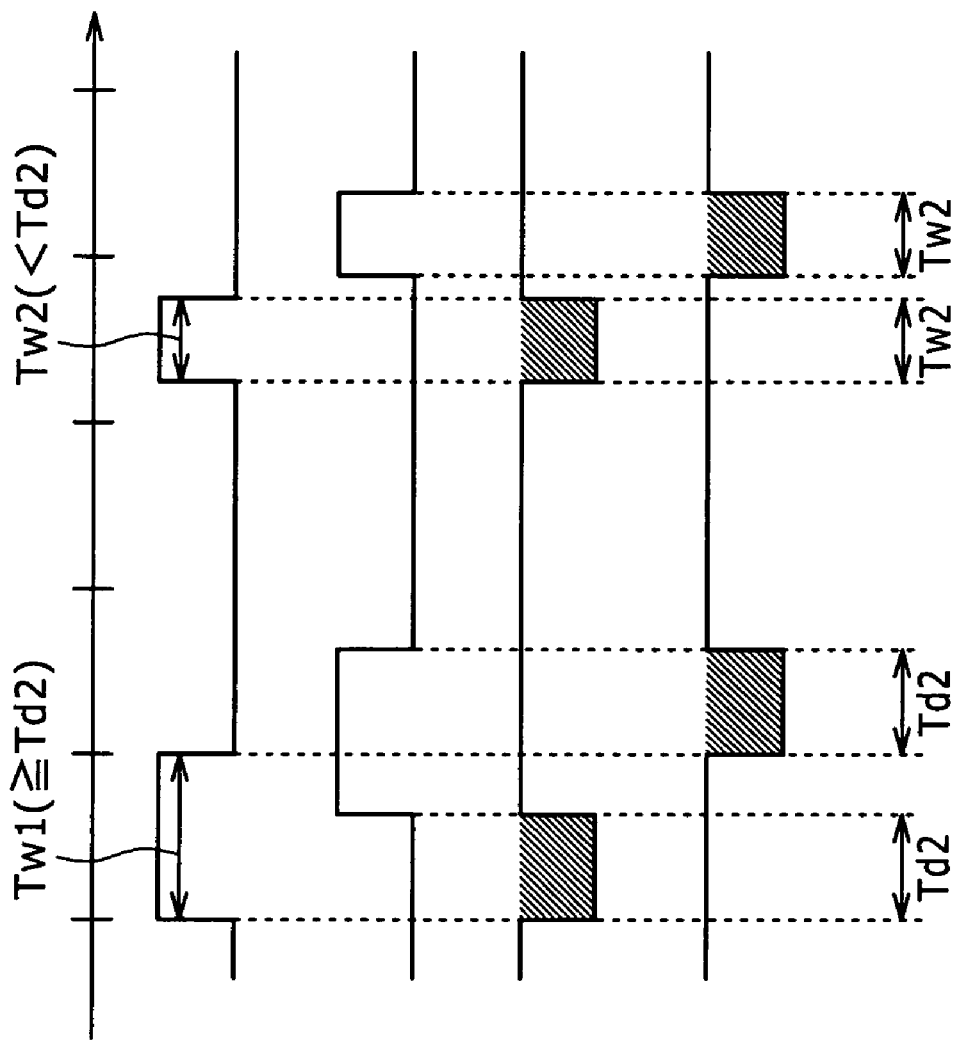

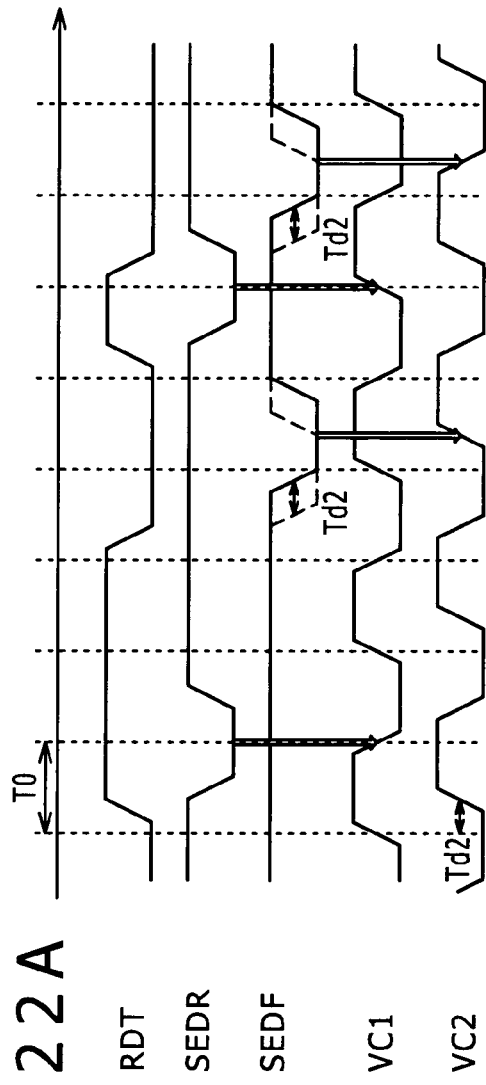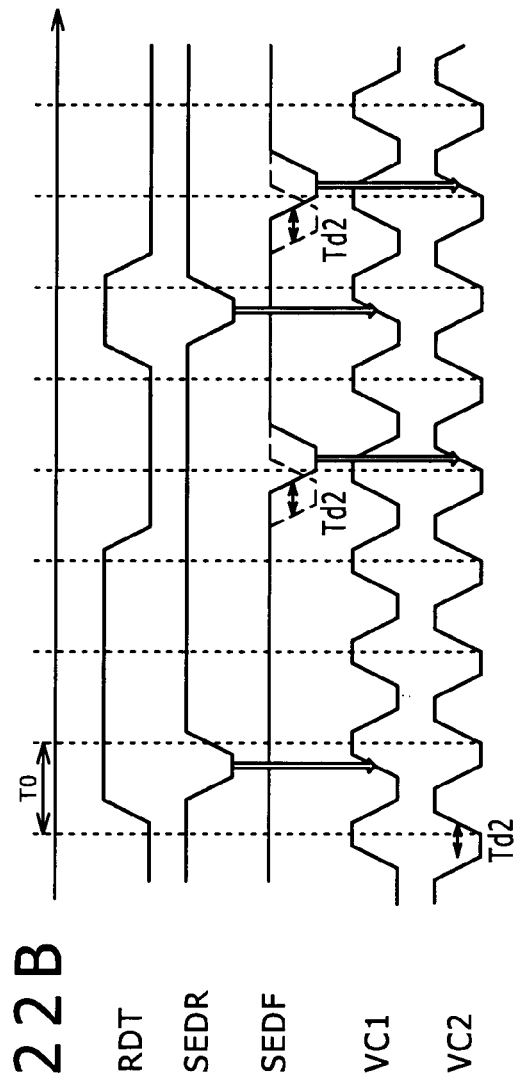

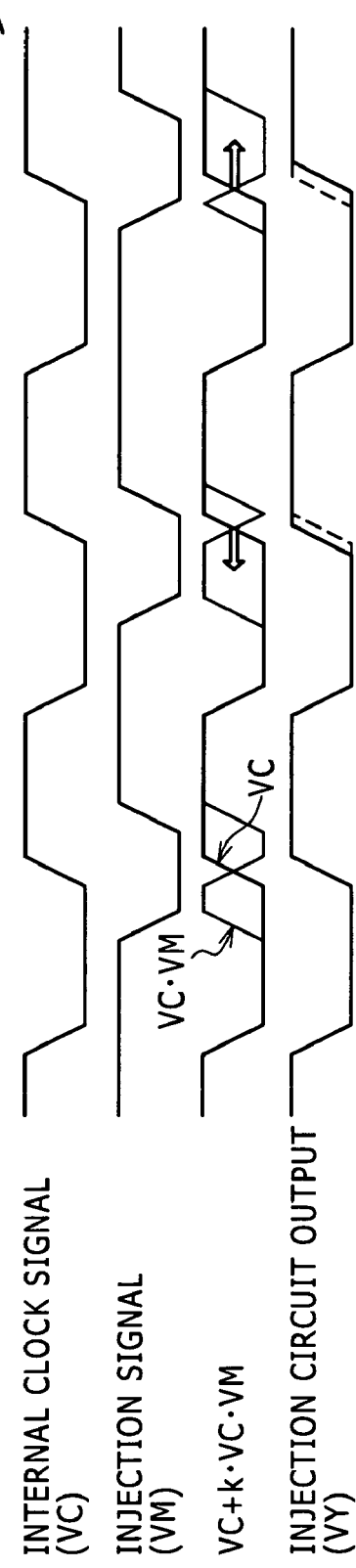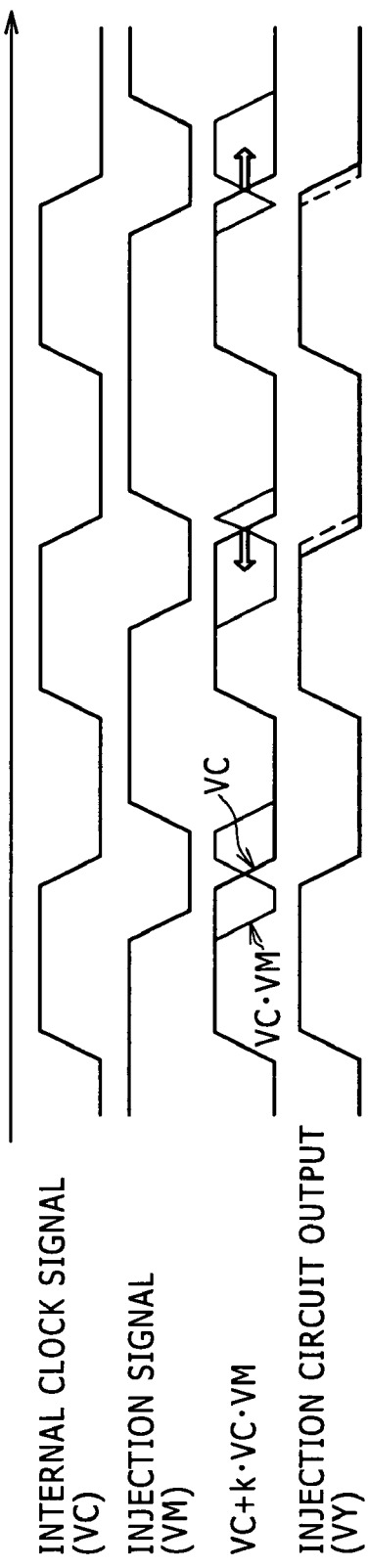

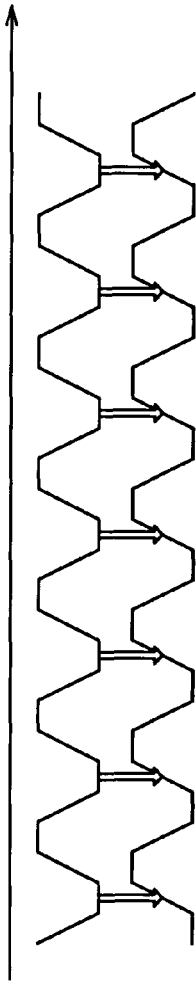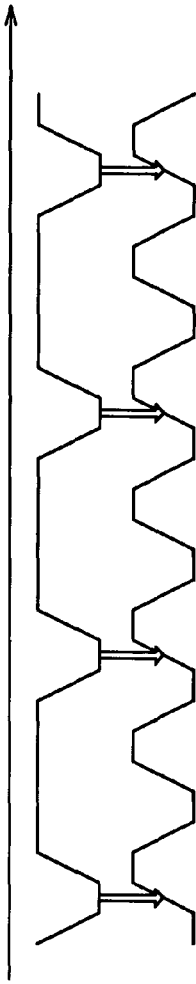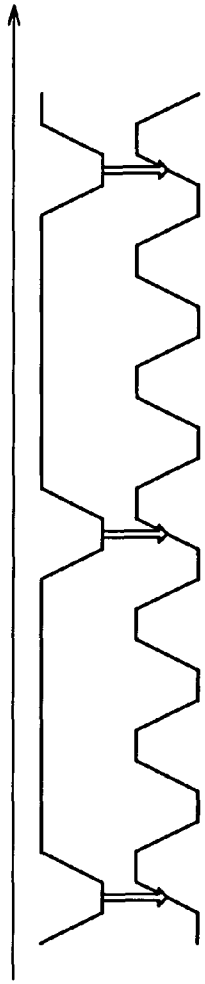
FIG.38A CKI CKO
FIG.38B CKI CKO
FIG.38C CKI CKO

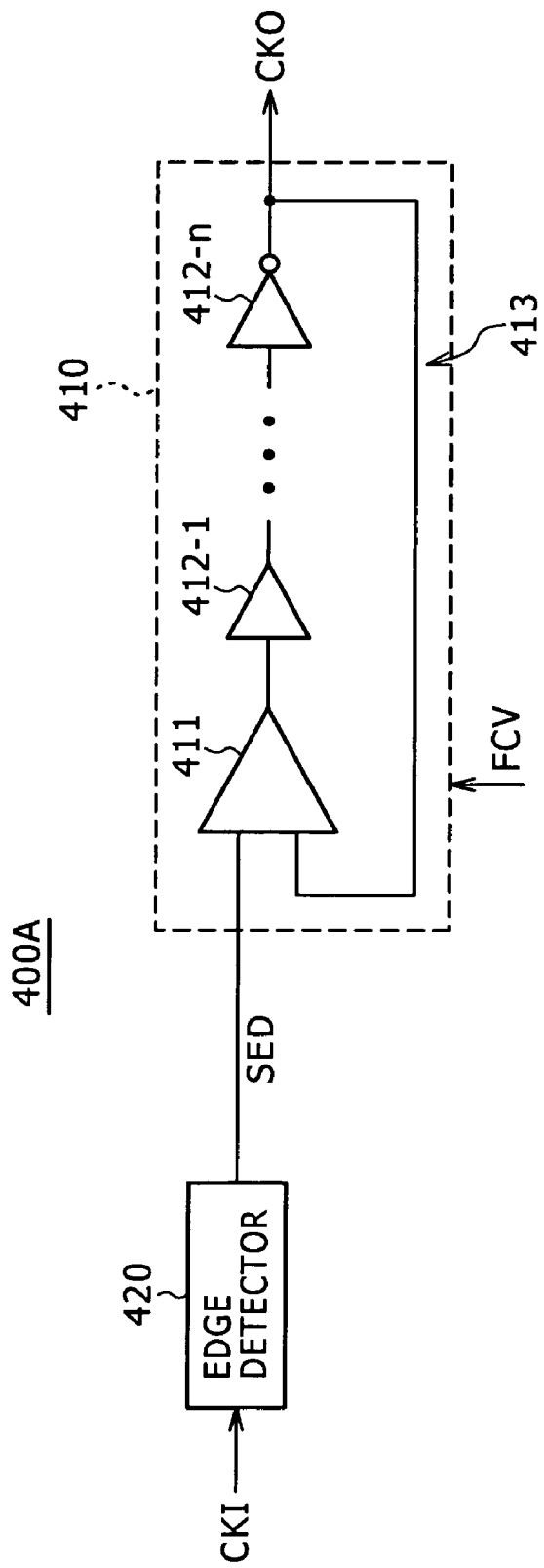

CKI
SED
VC

CKI
SED
VC

CKI
SED
VC

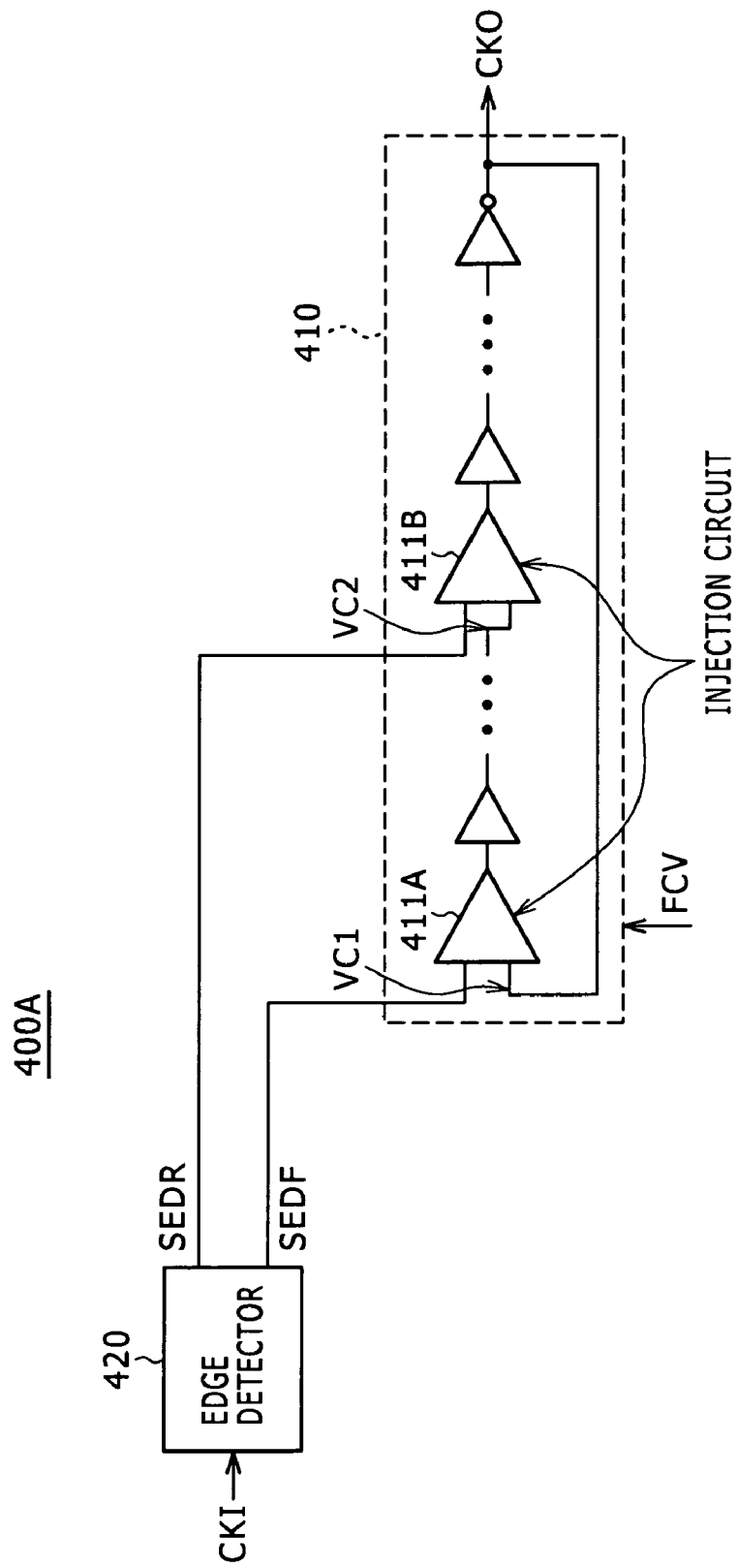

SYNCHRONOUS OSCILLATOR, CLOCK RECOVERY APPARATUS, CLOCK DISTRIBUTION CIRCUIT, AND MULTI-MODE INJECTION CIRCUIT

BACKGROUND OF THE INVENTION

1. Field of the Invention

The present invention relates to a synchronous oscillator for outputting clock signals, a clock recovery apparatus, a clock distribution circuit, and a multi-mode injection circuit.

2. Description of the Related Art

Recently, in the field of digital transmission, demands for transferring massive data at high speeds and with low power dissipation have been increasing. For the interface for this data transfer, clock recovery apparatuses are in wide use.

At the same time, the resistance against jitters is desired of high-speed interfaces due to the increased jitter components contained in signals caused by increased transfer rates.

The clock recovering includes those based on PLL application and the selection or generation of the clock of a phase locked with a reception data signal from a multi-phase clock signal.

However, these clock recovery schemes involve a problem that a high-speed operation requires a phase comparator operating at high speeds, thereby making it difficult to realize high-speed operations of clock recovery apparatuses.

In addition, because these schemes are realized depending on the negative feedback for locking with reception data signals, it takes relatively long for a clock signal to be synchronized with a reception data signal, thereby making these schemes unsuitable for the transfer of burst data that requires the locking with the reception data signal in a relatively short period of time.

Meanwhile, a clock recovery scheme based on a gated voltage controlled oscillator (hereafter referred to as a gated VCO) was proposed (refer to M. Banu and A. E. Dunlop; "Clock Recovery Circuits with Instantaneous Locking," Electronics Letters, Vol. 28, No. 23, Nov. 1992, pp. 2127-2130, for example).

This scheme does not require a phase comparator, so that high-speed operation is not limited by such a device. This scheme also enables the instantaneous locking with a reception data signal.

Now, referring to FIG. 1, there is shown a schematic diagram illustrating one example of a general clock recovery scheme based on the gated VCO (refer to Japanese Patent Laid-open No. Hei 8-213979, for example).

FIGS. 2A through 2C show operation timings of an edge detector shown in FIG. 1.

A clock recovery apparatus 1 shown in FIG. 1 has an edge detector 2 and a voltage-controlled oscillator 3. The edge detector 2 has a delay circuit 21 and an exclusive-OR (EXOR) gate 22.

In the edge detector 2, a reception data signal rdt is entered.

In the edge detector 2, the reception data signal rdt is delayed by the delay circuit 21 and a resultant delay signal S21 is supplied to the EXOR gate 22. In the EXOR gate 22, an EXOR operation is executed on the entered reception data signal rdt and the delay signal S21 and a result thereof is outputted to the voltage-controlled oscillator 3 as a gating signal S2.

In the voltage-controlled oscillator 3, an oscillation frequency is controlled by an oscillation frequency control voltage fcv and a result clock signal S3 is outputted with a timing corresponding to the gating signal S2.

SUMMARY OF THE INVENTION

However, with the above-mentioned scheme based on the gated VCO, a phase fluctuation due to the jitter component of a reception data signal likewise fluctuates the phase of a recovery clock caused by a gating operation of the gated VCO.

While this fluctuation is effective in recovering reception data because this fluctuation corresponds to the fluctuation of a reception data signal, an abrupt recovery clock phase fluctuation may cause an erroneous detection of reception data.

Further, with the above-mentioned scheme based on the gated VCO, clock signal S3 having the same frequency as the transfer rate of the reception data signal rdt is outputted, so that the full-rate voltage-controlled oscillator 3 is required.

Therefore, attempts to achieving high-speed operations by the above-mentioned scheme based on the gated VCO restrict high-speed operations by the oscillation frequency of the voltage-controlled oscillator 3.

Besides, the above-mentioned scheme based on the gated VCO requires the voltage-controlled oscillator 3 that oscillates at a high-speed oscillation frequency, thereby leading to an increased power dissipation.

Still further, let one period of transfer rate be T0 (sec) (if the transfer rate is 5 (Gbps), for example, T0=200 (psec)), gating signal S2 is outputted as follows.

Namely, the edge detector 2 of the clock recovery apparatus 1 based on the above-mentioned gated VCO scheme outputs the gating signal S2 as a pulse signal through the EXOR gate 22 of the delay circuit 21, gating signal S2 being delayed by the delay circuit 21 by T0/2.

Therefore, when the edge interface between adjacent edges of reception data signal rdt becomes T0/2 by a phase fluctuation due to the jitter component of the reception data signal rdt, the pulse signal for each edge may not be outputted as gating signal S2.

FIGS. 2A through 2C show an exemplary operation of the edge detector used in the clock recovery apparatus based on the above-mentioned gated VCO scheme. As shown in the figures, the durability against the jitter of reception data signal rdt is restricted.

Meanwhile, clock signals having high clock frequencies are in wide use in the recent LSI technologies in addition to interface clock recovery apparatuses.

In particular, as the processing speeds of microprocessors, DSPs, and other digital circuits increase, demands are increased for distributing clock signals of low-jitter, high clock frequencies inside each LSI at low power dissipations.

A clock distribution circuit is configured by the cascade arrangement of inversion circuits INV as shown in FIG. 3.

It should be noted here however that it is required to drive, at high frequencies, the parasitic capacitance for clock distribution and the parasitic capacitance for connected circuits.

For this reason, the increased power dissipation of the clock distribution circuit caused by increased LSI operation speeds and increased LSI circuit scale presents disadvantages.

For lowering the power dissipation of the clock distribution circuit, a method of distributing a clock signal by narrowing the amplitude of the clock signal is sometimes used. However, this approach presents a problem of the increased jitter, thereby preventing digital circuits from being operated at high speeds.

Therefore, the embodiments of the present invention address the above-identified and other problems associated with related-art methods and apparatuses and solve the addressed problems by providing a synchronous oscillator, clock recovery apparatus, a clock distribution circuit, and a multi-mode injection circuit that are configured to be able to correctly execution edge detection even if the edge positions are fluctuated in clock signals and reception data signals, thereby realizing increased transfer rates and low power dissipations.

In carrying out the invention and according to one mode thereof, there is provided a synchronous oscillator. This synchronous oscillator has at least one injection circuit having an injection signal input terminal, an internal clock signal input terminal, and a clock output terminal; and at least one delay circuit cascaded to the injection circuit. In this synchronous oscillator, with the cascaded injection circuit and delay circuit, an output of a last stage is connected to an internal clock signal input terminal of a first stage to form a ring oscillator and the injection circuit adds a signal component of a product of an internal clock signal entered in the clock signal input terminal and an injection signal entered in the injection signal input terminal to the internal clock signal, thereby outputting a resultant signal from the clock output terminal as a clock signal.

In carrying out the invention and according to another mode thereof, there is provided a clock recovery apparatus. This clock recovery apparatus has an edge detection block configured to detect an edge of a reception data signal to output an edge detection signal; and a synchronous oscillator configured to take in the edge detection signal as an injection signal to output a clock signal. In this clock recovery apparatus, the synchronous oscillator has at least one injection circuit having an injection signal input terminal, an internal clock signal input terminal, and a clock output terminal and at least one delay circuit cascaded to the at least one injection circuit, the injection circuit and the delay circuit cascaded to each other with an output of a last stage connected to an internal clock signal input terminal of a first stage, thereby forming a ring oscillator and the injection circuit having a function of adding a signal component of a product of the internal clock signal and an edge detection signal that is an injection signal to be entered in the injection signal input terminal to the internal clock signal that is entered in the internal clock signal input terminal, thereby outputting a resultant signal from the clock output terminal as a clock signal.

In carrying out the invention and according to still another mode thereof, there is provided a clock distribution circuit. This clock distribution circuit has a synchronous oscillator configured to output a clock signal in accordance with an input clock signal. In this clock distribution circuit, the synchronous oscillator has at least one injection circuit having an injection signal input terminal, an internal clock signal input terminal, and a clock output terminal and at least one delay circuit cascaded to the injection circuit. The injection circuit and the delay circuit cascaded thereto are connected at an output of a last stage to an internal clock signal input terminal of a first stage to form a ring oscillator and the injection circuit has a function of adding a signal component of a product of the internal clock signal and an injection signal entered in the injection signal input terminal to the internal clock signal entered in the clock signal input terminal to output a resultant signal from the clock output terminal as a clock signal.

In carrying out the invention and according to yet another mode thereof, there is provided a multi-mode injection circuit. This multi-mode injection circuit has a first load impedance and a second load impedance; a first transistor through a tenth transistor; a first node connected to one of a current source and a predetermined potential; a second node connected to the first load impedance; and a third node connected to the second load impedance. In this multi-mode injection circuit, a source of the first transistor and a source of the second transistor are connected to the first node, the third transistor and the fourth transistor are connected with each other in sources thereof and drains thereof, a connection node between the sources being connected to a drain of the first transistor and a connection node between the drains are connected to the second node, a gate of the third transistor is connected to an input terminal of a first signal, a gate of the fourth transistor is connected to the injection signal input terminal, the fifth transistor and the sixth transistor are connected with each other in sources thereof and in drains thereof, a connection node between the sources being connected to the drain of the first transistor and a connection node between the drains being connected to the third node, a gate of the fifth transistor is connected to an input terminal of an inverted signal of the injection signal, a gate of the sixth transistor is connected to an input terminal of an inverted signal of the first signal, the seventh transistor and the eighth transistor are connected with each other in sources thereof and drains thereof, a connection node between the sources is connected to a drain of the second transistor and a connection node between the drains being connected to the second node, a gate of the seventh transistor is connected to an input terminal of a second signal, a gate of the eighth transistor is connected to an input terminal of an inverted signal of the injection signal, the ninth transistor and the tenth transistor are connected with each other in sources thereof and drains thereof, a connection node between the sources is connected to the drain of the second transistor and a connection node between the drains being connected to the third node, a gate of the ninth transistor is connected to the injection signal input terminal, and a gate of the tenth transistor is connected to an input terminal of an inverted signal of the second signal.

As described and according to embodiments of the invention, the clock recovery apparatus may only output a recovery clock signal having a clock frequency that is one half of the data rate of a reception data signal, thereby achieving the reduced power dissipation and increased operation speed of the clock recovery apparatus. Further, even if the edge position of a reception data signal varies, edge detection can be correctly executed, thereby enhancing the durability against the jitter of a reception data signal. In addition, the clock distribution circuit need not distribute high-frequency clock signals, thereby achieving the reduced power dissipation of the clock distribution circuit.

BRIEF DESCRIPTION OF THE DRAWINGS

FIG. 3 is a circuit diagram illustrating an exemplary configuration of a general inversion circuit;

FIGS. 8A and 8B are a circuit diagram of the multi-mode injection circuit associated with embodiments and relations between the signal setting level and the input/output obtained when the multi-mode injection circuit is functioned as an injection circuit, a delay circuit, and an AND circuit;

FIGS. 20A, 20B, 20C, and 20D are timing charts indicative of operation timings of an edge detector shown in FIGS. 19A through 19D;

FIGS. 22A and 22B are timing charts indicative of exemplary operations of the clock recovery apparatus practiced as the third embodiment of the invention;

FIGS. 23A and 23B are timing charts indicative of a synchronous oscillator associated with the third embodiment of the invention;

FIGS. 38A, 38B, 38C are timing charts indicative of exemplary operations of the clock distribution circuit associated with the sixth embodiment of the invention;

FIG. 39 is a schematic diagram illustrating an exemplary configuration of a clock distribution circuit practiced as a seventh embodiment of the invention;

FIG. 41 is a schematic diagram illustrating an exemplary configuration of a clock distribution circuit practiced as an eighth embodiment of the invention;

DETAILED DESCRIPTION OF THE PREFERRED EMBODIMENTS

This invention will be described in further detail by way of embodiments thereof with reference to the accompanying drawings. The description will be made in the following order:

(1) The first embodiment (an exemplary configuration of a synchronous oscillator);

(2) The second embodiment (a first exemplary configuration of a clock recovery apparatus);

(3) The third embodiment (a second exemplary configuration of the clock recovery apparatus);

(4) The fourth embodiment (a third exemplary configuration of the clock recovery apparatus);

(5) The fifth embodiment (a fourth exemplary configuration of the clock recovery apparatus);

(6) The sixth embodiment (a first exemplary configuration of a clock distribution circuit);

(7) The seventh embodiment (a second exemplary configuration of the clock distribution circuit); and (8) The eighth embodiment (a third exemplary configuration of the clock distribution circuit).

(1) The First Embodiment

Figure 1:
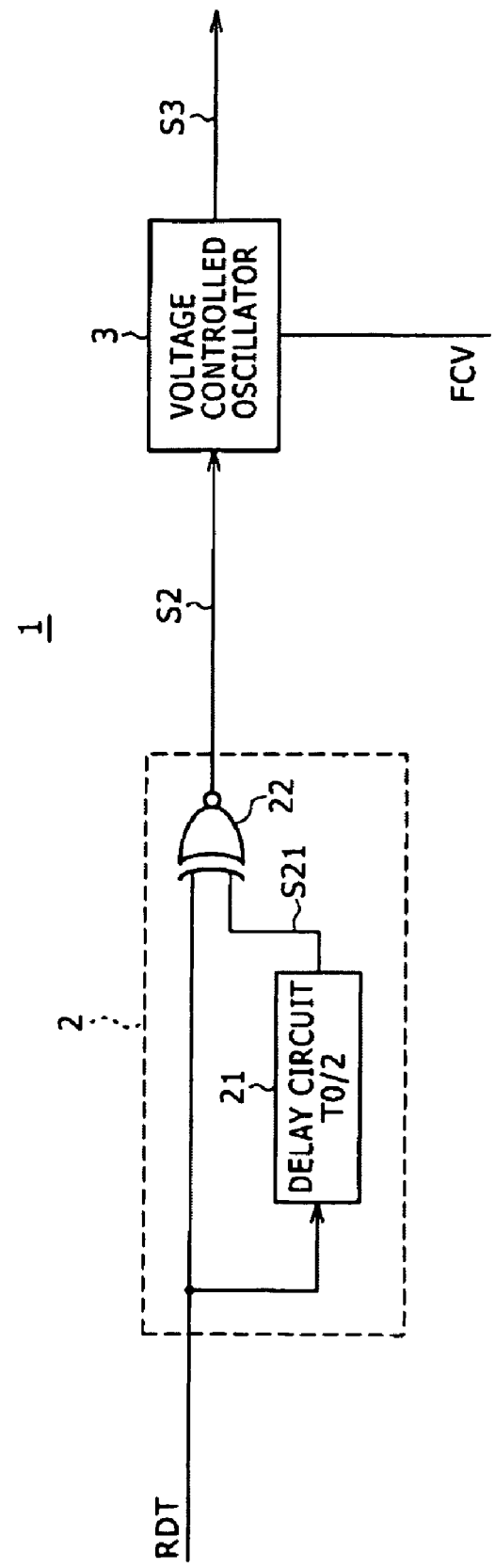
FIG. 1 is a schematic diagram illustrating one example of a general clock recovery method based on gated VCO.
Figure 2:
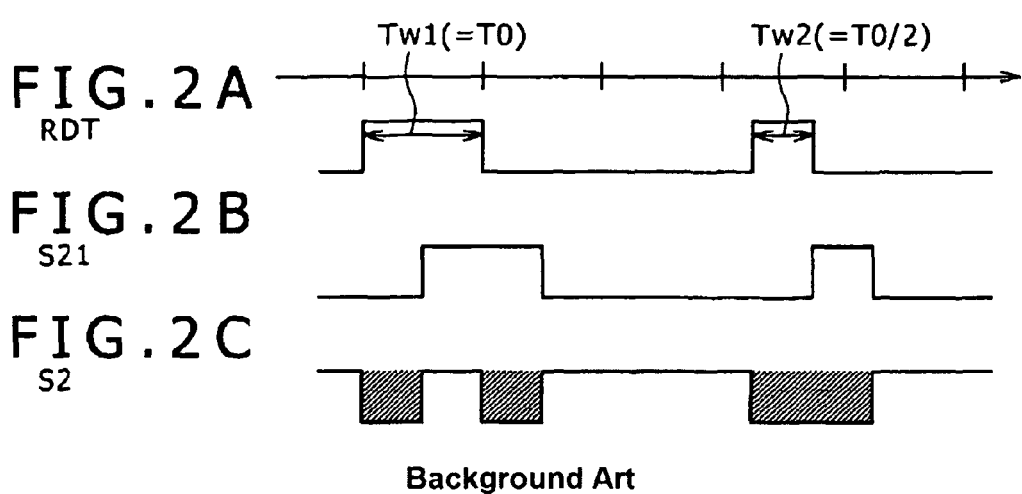
FIGS. 2A, 2B, and 2C show operation timings of an edge detector shown in FIG. 1.
Figure 4:
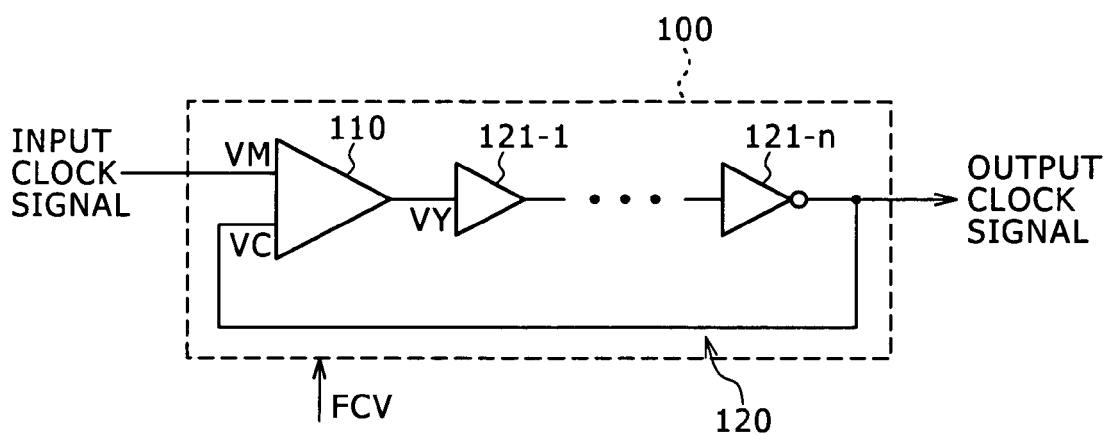
FIG. 4 is a block diagram illustrating an exemplary configuration of a synchronous oscillator practiced as a first embodiment of the invention.

Configuration of the Synchronous Oscillator:

Now, referring to FIG. 4, there is shown a block diagram illustrating an exemplary configuration of a synchronous oscillator practiced as the first embodiment of the invention.

A synchronous oscillator 100 is configured by a ring oscillator 120 that includes at least one injection circuit 110 as shown in FIG. 4.

The synchronous oscillator 100 functions as a voltage-controlled oscillator (VCO) with the oscillation frequency thereof controlled by a oscillation frequency control signal FCV.

The ring oscillator 120 shown in FIG. 4 has the 2-input injection circuit 110 at the first stage, followed by cascade-connected delay circuits 121-1 through 121-n connected to the output of the injection circuit 110, the output of the delay circuit 121-n at the last stage being connected to one of the input of the injection circuit 110 at the first stage.

The ring oscillator 120 is basically formed such that the delay circuits 121-1 through 121-n forming a ring have the inverter function of odd-number stages.

The inverter may be configured by a CMOS inverter, for example.

The configuration shown in FIG. 4 is singled-ended; however, this configuration may also be made in a differential manner.

The injection circuit 110 of the first embodiment has injection signal input terminal M, internal clock signal input terminal C (hereafter also referred to simply as a clock signal input terminal), and clock output terminal Y.

The injection circuit 110 has a function of adding clock signal VC entered in clock signal input terminal C to a signal component that is a product of this internal clock signal VC and injection signal VM that is entered in injection signal input terminal M and outputting a resultant signal from clock output terminal Y as clock signal VY.

Figure 5:
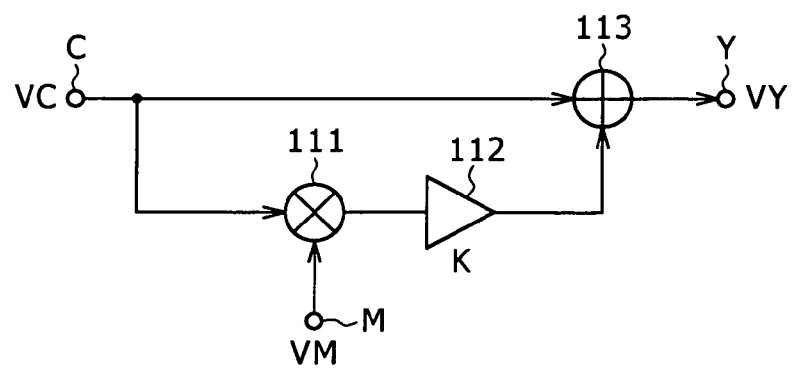
FIG. 5 is a schematic diagram illustrating a basic exemplary configuration of an injection circuit associated with embodiments of the invention.

Referring to FIG. 5, there is shown a exemplary basic functional configuration of an injection circuit associated with embodiments of the invention.

In order to realize the functions described above, the injection circuit 110 shown in FIG. 5 has a multiplier 111, a coefficient attacher 112, and an adder 113.

The multiplier 111 multiplies clock signal VC entered in clock signal input terminal C by injection signal VM entered in the injection signal input terminal M and outputs a resultant signal to the coefficient attacher 112.

The coefficient attacher 112 attaches coefficient K to the output signal of the multiplier 111 and outputs a resultant signal to the adder 113. Coefficient K is given as a parameter indicative of an injection amount into the injection circuit 110.

The adder 113 adds a signal component of the product of the clock signal VC attached with coefficient K and injection signal VM to an internal clock signal VC entered in clock signal input terminal C, thereby outputting a resultant signal to clock output terminal Y.

The following describes more specific circuit configurations and functions of the injection circuit having the functions described above.

The following describes an exemplary configuration of a multi-mode injection circuit that has the functions of the delay circuit and the logic circuit, an AND circuit for example, in addition to the function of the injection circuit.

Exemplary Configurations of the Multi-Mode Injection Circuit

As described above, the injection circuit 110 has the function of adding a signal component of a product of clock signal VC and injection signal VM to input clock signal VC and outputting a resultant signal.

It should be noted that the circuit shown below can be used for other applications than an injection circuit, so that the circuit shown below is hereafter especially referred to as a multi-mode injection circuit.

The First Exemplary Configuration of the Multi-mode Injection Circuit

Figure 6:
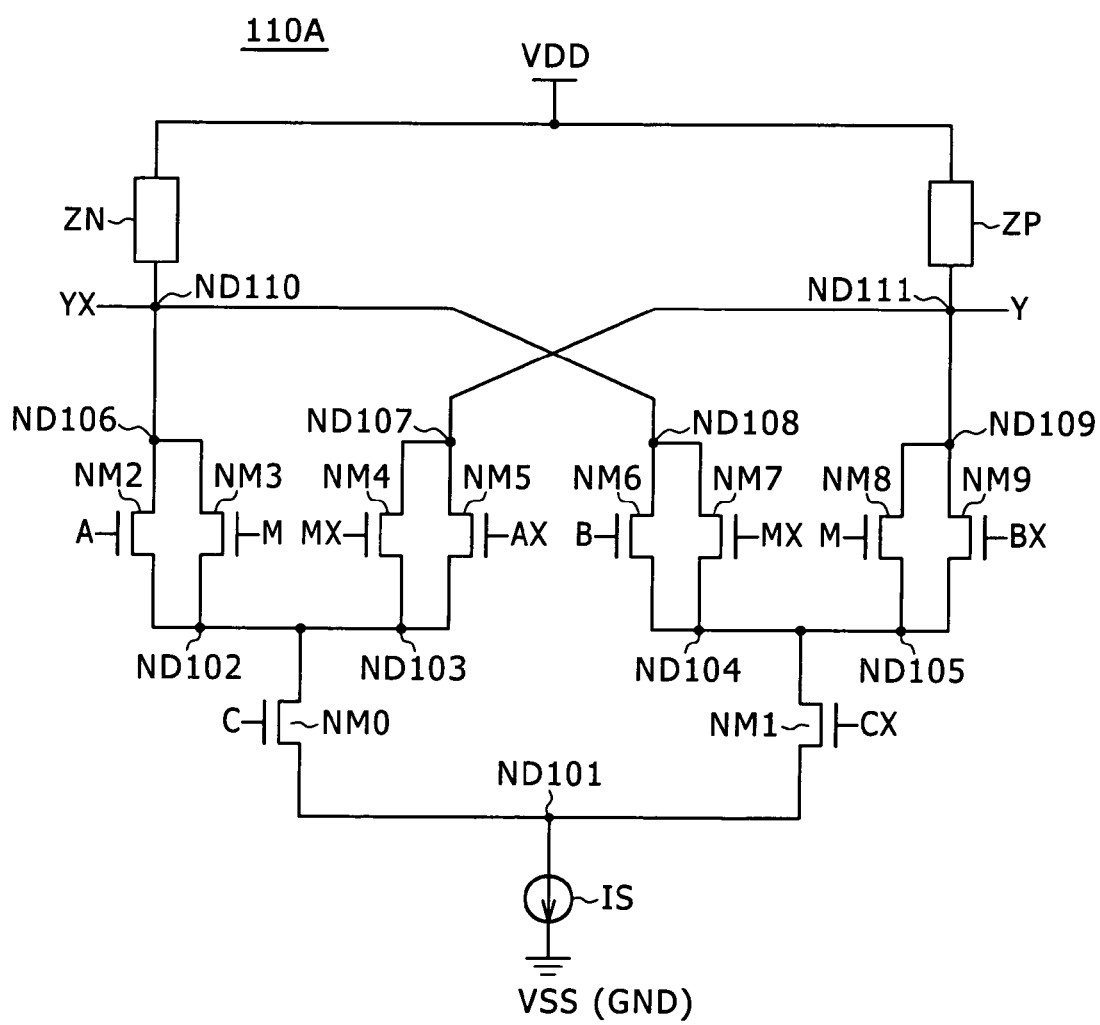
FIG. 6 is a circuit diagram illustrating a first exemplary configuration of a multi-mode injection circuit associated with embodiments of the invention.

Now, referring to FIG. 6, there is shown a circuit diagram illustrating the first exemplary configuration of a multi-mode injection circuit associated with embodiments of the invention.

A multi-mode injection circuit 110A has n-channel MOS (NMOS) transistors NM0 through NM9 as the first through tenth transistors, load impedance ZP and ZN, current source IS, and nodes ND101 through ND111.

NMOS transistor NM0 forms a first field-effect transistor and NMOS transistor NM1 forms a second field-effect transistor.

NMOS transistor NM2 forms a third field-effect transistor and NMOS transistor NM3 forms a fourth field-effect transistor.

NMOS transistor NM4 forms a fifth field-effect transistor and NMOS transistor NM5 forms a sixth field-effect transistor.

NMOS transistor NM6 forms a seventh field-effect transistor and NMOS transistor NM7 forms a eighth field-effect transistor.

NMOS transistor NM8 forms a ninth field-effect transistor and NMOS transistor NM9 forms a tenth field-effect transistor.

Load impedance ZN forms a first load impedance and load impedance ZP forms a second load impedance.

Node ND 101 forms a first node, node ND110 forms a second node, and node ND 111 forms a third node.

The source of NMOS transistor NM0 is connected to the source of NMOS transistor NM1 and the connection point thereof forms node ND101. Current source IS is connected between the node ND101 and reference potential VSS (ground GND for example).

The source of NMOS transistor NM2 is connected to the source of NMOS transistor NM3 and the connection point thereof forms node ND102.

The source of NMOS transistor NM4 is connected to the source of NMOS transistor NM5 and the connection point thereof forms node ND103.

Node ND102 and node ND103 are connected to the drain of NMOS transistor NM0.

The drain of NMOS transistor NM2 is connected to the drain of NMOS transistor NM3 and the connection point thereof forms node ND106. Node ND106 is connected to node ND110.

The drain of NMOS transistor NM4 is connected to the drain of NMOS transistor NM5 and the connection point thereof forms node ND107. Node ND107 is connected to node ND111.

The source of NMOS transistor NM6 is connected to the source of NMOS transistor NM7 and the connection point thereof forms node ND104.

The source of NMOS transistor NM8 is connected to the source of NMOS transistor NM9 and the connection point thereof forms node ND105.

Node ND104 and node ND105 are connected to the drain of NMOS transistor NM1.

The drain of NMOS transistor NM6 is connected to the drain of NMOS transistor NM7 and the connection point thereof forms node ND108. Node ND108 is connected to node N110.

The drain of NMOS transistor NM8 is connected to the drain of NMOS transistor NM9 and the connection point thereof forms node ND109. Node ND109 is connected to node N111.

Node ND110 is connected to one end of load impedance ZN and output terminal YX (X denotes inversion) of inverted signal VYX of clock signal VY.

Node ND111 is connected to one end of load impedance ZP and output terminal Y of clock signal VY.

The other ends of load impedance ZN and load impedance ZP are connected to the supply line of the supply voltage VDD.

The gate of NMOS transistor NM0 is connected to input terminal C of clock signal VC and the gate of NMOS transistor NM1 is connected to input terminal CX of inverted signal VXC of clock signal VC.

The gate of NMOS transistor NM2 is connected to input terminal A of first signal VA and the gate of NMOS transistor NM3 is connected to input terminal M of injection signal VM.

The gate of NMOS transistor NM4 is connected to input terminal MX of inverted signal VMX of injection signal VM and the gate of NMOS transistor NM5 is connected to input terminal AX of inverted signal VAX of first signal VA.

The gate of NMOS transistor NM6 is connected to input terminal B of second signal VB and the gate of NMOS transistor NM7 is connected to input terminal MX of inverted signal VMX of injection signal VM.

The gate of NMOS transistor NM8 is connected to input terminal M of injection signal VM and the gate of NMOS transistor NM9 is connected to input terminal BX of inverted signal VBX of second signal VB.

Of NMOS transistors NM0 through NM9, at least NMOS transistors NM0, NM1, NM3, NM4, NM7 and NM8 function as transconductance circuits.

Figure 7:
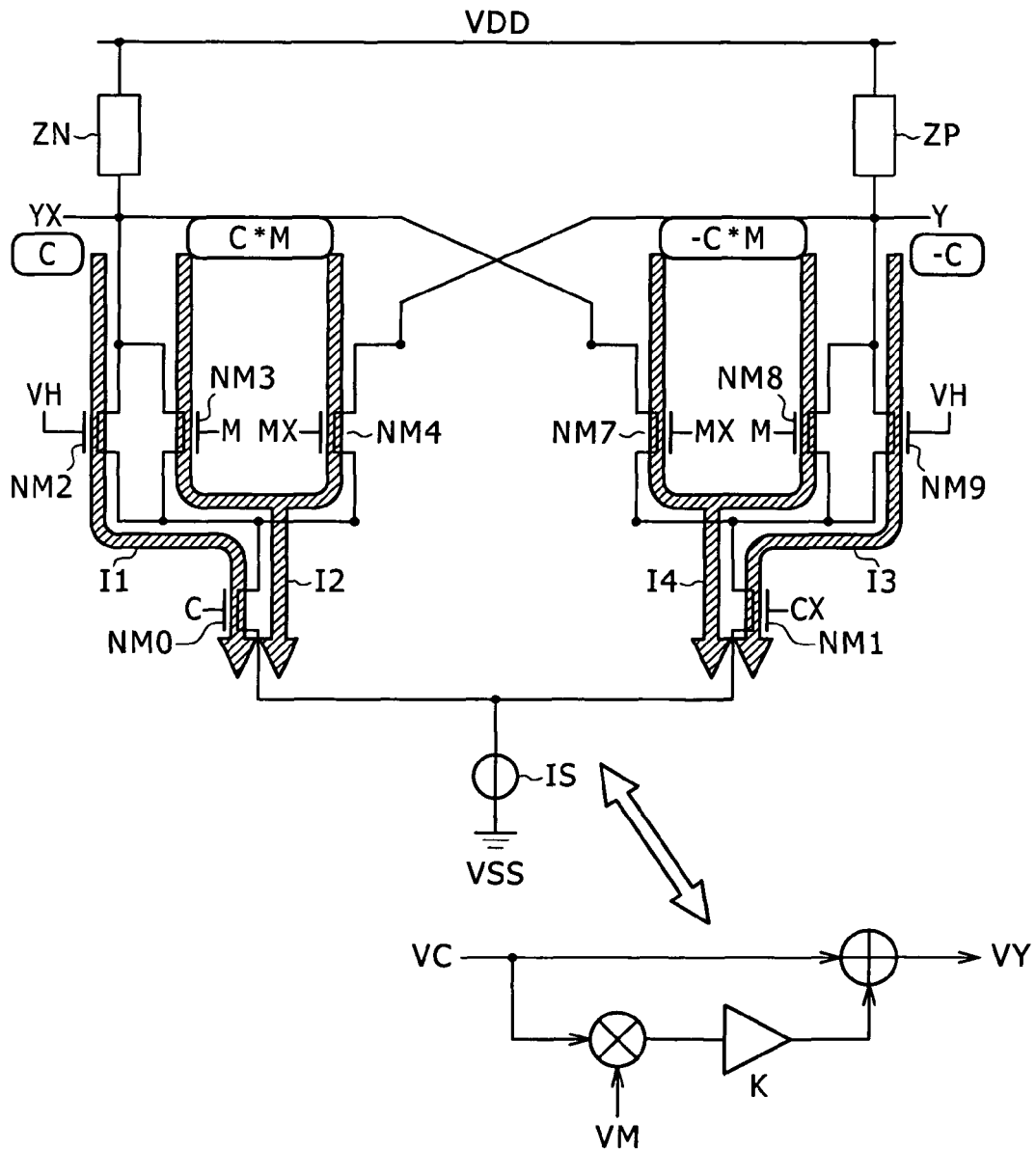
FIG. 7 is a schematic diagram illustrating operations of the multi-mode injection circuit shown in FIG. 6 as an injection circuit.

The following describes operations of the injection circuit having the configuration described above. FIG. 7 schematically shows operations of the multi-mode injection circuit shown in FIG. 6 that functions as an injection circuit.

If the multi-mode injection circuit 110A functions as injection circuit INJ, first signal VA is set to high level (VA=H) and inverted signal VAX thereof is set to low level (VAX=L). Second signal VB is set to low level (VB=L) and inverted signal VBX thereof is set to high level (VBX=H).

As a result, the NMOS transistors NM2 and NM9 are turned on and NMOS transistors NM5 and NM6 are turned off.

Then, injection signals VM and VMX and clock signals VC and VCX are supplied to injection circuit INJ.

In this case, as shown in FIG. 7, current component I1 for input terminal C flows to load impedance ZN by NMOS transistors NM0 and NM2.

Next, current component I2 of the product of input terminal C and input terminal M flows to load impedance ZN by NMOS transistors NM0, NM3, and NM4.

Thus, injection circuit INJ adds a signal component of the product of input clock signal VC and input injection signal VM to input clock signal VC and outputs a resultant signal to output terminal YX.

Likewise, current component I3 for input terminal C flows to load impedance ZP by NMOS transistors NM1 and NM9.

Next, current component I4 of the product of input terminal C and input terminal M flows to load impedance ZP by NMOS transistors NM1, NM8, and NM7.

Thus, injection circuit INJ adds a signal component of the product of input clock signal VC and input injection signal VM to input clock signal VC and outputs a resultant signal to output terminal Y.

As described above, injection circuit INJ adds the signal component of VC×VM to input clock signal VC. If clock signal VC is the reserve phase, the injection circuit INJ inverts the component of injection signal VM.

It should be noted that, for injection signal VM, reception data signal RDT and edge detection signal SED of clock signal CKI are supplied by the edge detector as will be described later.

In the above-mentioned configuration, varying the size ratio of NMOS transistors NM2, NM3 and NM4 can adjust the injection amount of injection signal VM, edge detection signal SED for example.

Therefore, increasing the sizes of NMOS transistors NM3 and NM4 can increase the injection amount of injection signal VM into output terminal YX.

If the injection amount of injection signal VM is relatively large, the phase of the synchronous oscillator (VCO) relatively strongly locks by reception data signal RDT and input clock signal CKI.

On the other hand, decreasing the sizes of NMOS transistors NM3 and NM4 can decrease the injection amount of injection signal VM into output terminal YX.

If the injection amount of injection signal VM is relatively small, the locking with reception data signal RDT and input clock signal CKI is relatively weak.

If the injection amount is relatively large, the phase of reception data signal RDT more follows the phase of reception data signal and clock signal, so that the phase of the synchronous oscillator (VCO) 100 more follows the phase of reception data signal RDT and clock signal CKI.

Hence, the jitter caused by the VCO itself is suppressed, at the cost of the increased susceptibility to the jitters of reception data signal RDT and clock signal CKI.

On the other hand, if the injection amount is relatively smaller, the susceptibility to the jitters of reception data signal RDT and clock signal CKI is reduced, but at the cost of the reduced effect of suppressing the jitter caused by the VCO itself.

Therefore, in order to reduce the jitter of recovery clock signal VY, the injection amount of injection signal VM (SED) is increased if the jitter caused by the VCO is larger than the jitters of reception data signal RDT and clock signal CKI. If the jitters of reception data signal RDT and clock signal CKI are larger than the jitter caused by the VCO, the injection amount of injection signal VM (SED) may be decreased.

In this case, a recovery clock signal of a clock frequency one half the data rate of reception data signal RDT is outputted, so that the synchronous oscillator 100 may oscillate at the frequency one half of the data rate, resulting in lower power dissipation and higher operation speeds.

Referring to FIGS. 8A and 8B, there are shown the multi-mode injection circuit associated with embodiments of the invention and the signal setting level and input/output relationship at the time when the multi-mode injection circuit is functioned as an injection circuit, a delay circuit, and an AND circuit.

Figure 9A:
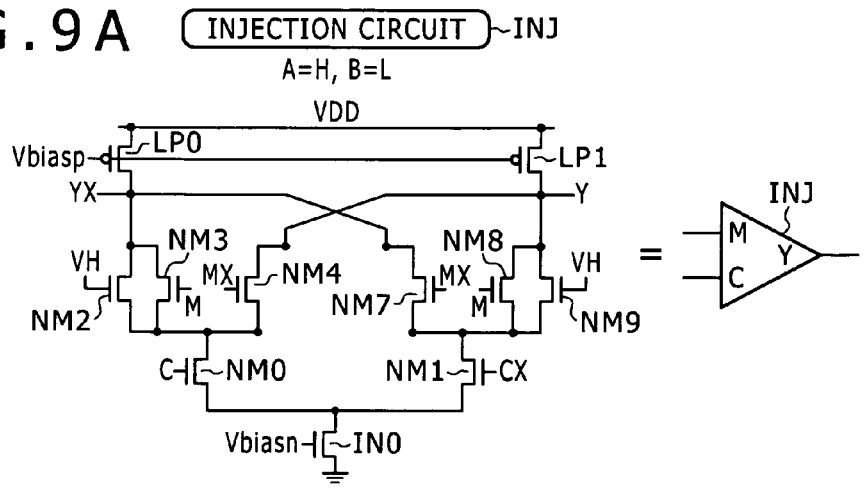
FIGS. 9A, 9B, and 9C are circuit diagrams illustrating equivalent circuits obtained when the multi-mode injection circuit shown in FIG. 6 is functioned as an injection circuit, a delay circuit, and an AND circuit.
Figure 9B:
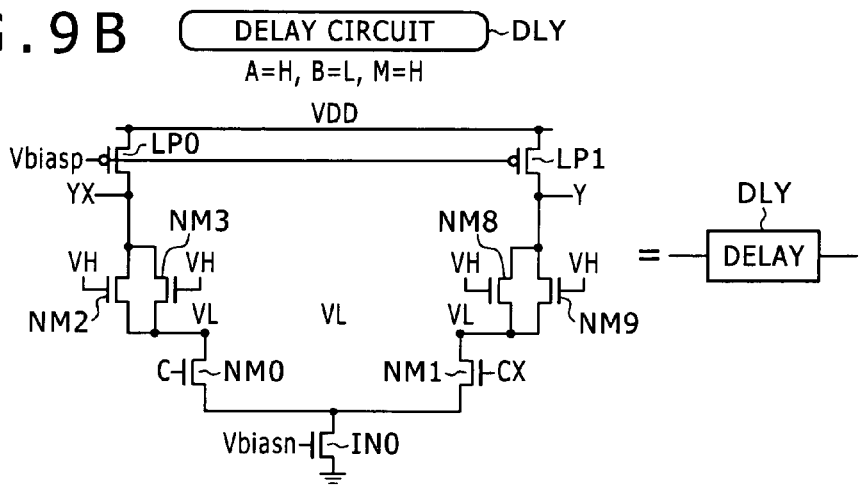
Figure 9C:
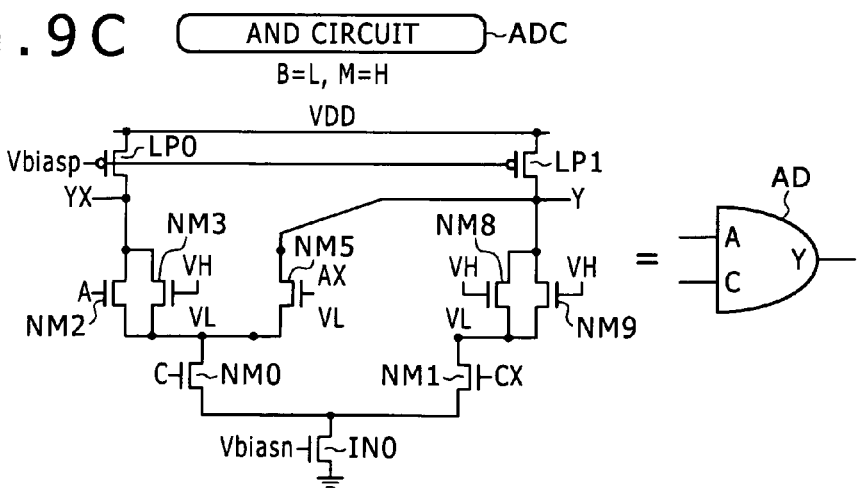

FIGS. 9A through 9C show equivalent circuits at the time when the multi-mode injection circuit shown in FIG. 6 is functioned as an injection circuit, a delay circuit, and an AND circuit.

It should be noted that, in the circuit diagrams shown in FIGS. 8A through 9C, load impedances ZN and ZP are formed by p-channel MOS (PMOS) transistors LP0 and LP1, respectively, and current source IS is formed by NMOS transistor IN0, for example.

The gates of PMOS transistors LP0 and LP1 are connected to the supply line of bias voltage Vbiasp and the gate of NMOS transistor IN0 is connected to the supply line of bias voltage Vbiasn.

If the multi-mode injection circuit 110A functions as injection circuit INJ, first signal VA is set to high level (VA=H) and inverted signal VAX thereof is set to low level (VAX=L). Second signal VB is set to low level (VB=L) and inverted signal VBX thereof is set to high level (VBX=H).

As a result, NMOS transistors NM2 and NM9 are turned on and NMOS transistors NM5 and NM6 are turned off.

Next, injection signals VM and VMX and clock signals VC and VCX are supplied to injection circuit INJ.

If the multi-mode injection circuit 110A functions as delay circuit DLY, first signal VA is set to high level (VA=H) and inverted signal VAX thereof is set to low level (VAX=L). Second signal VB is set to low level (VB=L) and inverted signal VBX thereof is set to high level (VBX=H).

Further, injection signal VM is set to high level (VM=H) and inverted signal VMX thereof is set to low level (VMX=L).

As a result, NMOS transistors NM2, NM3, NM8, and NM9 are turned on and NMOS transistors NM4, NM5, NM6, and NM7 are turned off.

Consequently, input clock signal VC is delayed to be outputted from output terminal YX as clock signal VYX and input clock signal VCX is delayed to be outputted from output terminal Y as clock signal VY (VY=VC).

If the multi-mode injection circuit 110A functions as AND circuit ADC, second signal VB is set to low level (VB=L) and inverted signal VBX thereof is set to high level (VBX=H). Injection signal VM is set to high level (VM=H) and inverted signal VMX thereof is set to low level (VMX=L).

As a result, NMOS transistors NM2, NM3, NM5, NM8 and NM9 are turned on and NMOS transistors NM4, NM6 and NM7 are turned off.

Consequently, a logical product (AND) is taken between input clock signal VC and first signal VA to be outputted from output terminal Y as signal Y (=A×C).

With the synchronous oscillator 100 practiced as the first embodiment of the invention, the injection circuit 110 is arranged in the first stage of the ring oscillator 120 and delay circuits 121-1 through 121-n are cascaded to the output of the 2-input injection circuit 110, as described above.

Figure 10:
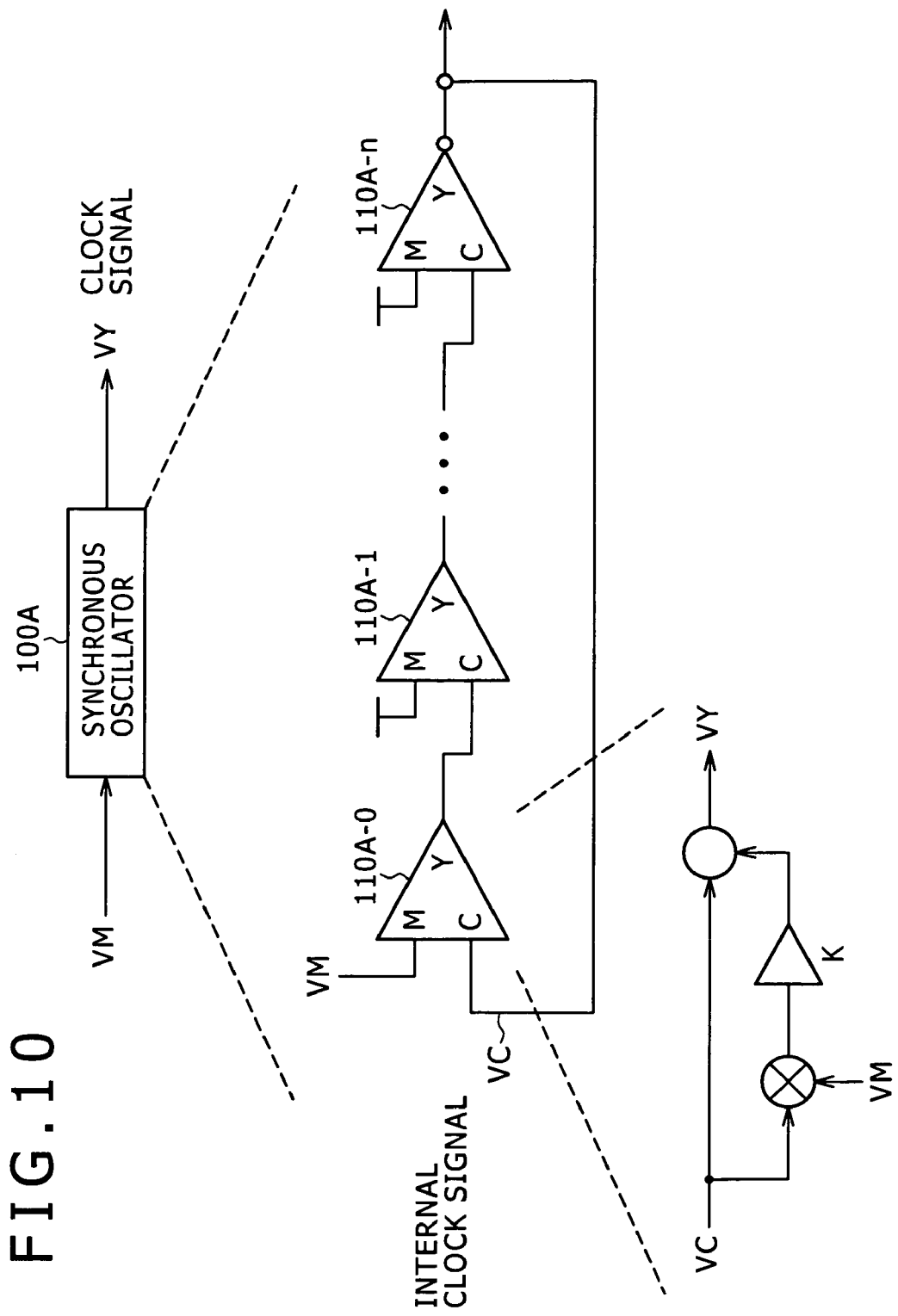
FIG. 10 is a schematic diagram illustrating an exemplary configuration of a synchronous oscillator formed by two or more multi-mode injection circuits.

Therefore, as shown in FIG. 10, use of an injection circuit with the input terminal M fixed to high level (connected to the supply line of supply voltage VDD) for these delay circuits 121-1 through 121-n forms the synchronous oscillator 100.

With the synchronous oscillator 100 shown in FIG. 10, multi-mode injection circuits 110A (n+1) having the same configuration are cascaded and only one multi-mode injection circuit 110A, namely, 110A-0, is used as injection circuit INJ with input terminal M supplied with injection signal VM.

With the other multi-mode injection circuits 110A-1 through 110A-n, input terminal M is connected to the supply line of supply voltage VDD, so that these multi-mode injection circuits are used as delay circuits DLY.

Then, the output of multi-mode injection circuit 110A-n in the last stage is connected to input terminal C of injection circuit INJ in the first stage.

The ring oscillator 120 is basically configured such that the odd-numbered stages of multi-mode injection circuits 110A-1 through 110A-n functioning as the delay circuits forming a ring have an inverter function.

As described below, the multi-mode injection circuit can be used as delay circuits and AND circuits that make up a clock recovery apparatus and a clock distribution circuit, in addition to an injection circuit.

The Second Exemplary Configuration of the Multi-Mode Injection Circuit

Figure 11:
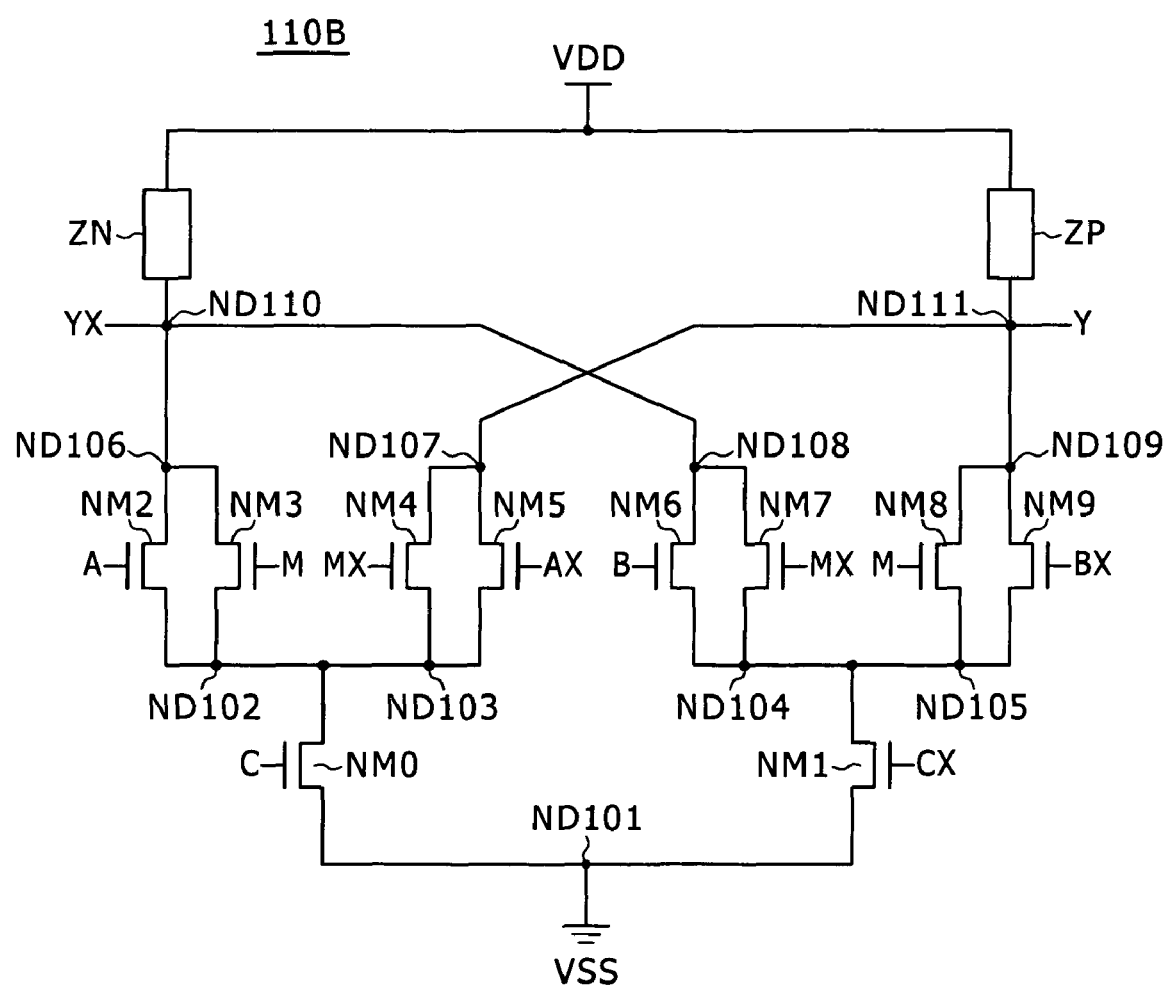
FIG. 11 is a circuit diagram illustrating a second exemplary configuration of the multi-mode injection circuit associated with embodiments of the invention.

Referring to FIG. 11, there is shown a circuit diagram illustrating the second exemplary configuration of the multi-mode injection circuit associated with embodiments of the invention.

A multi-mode injection circuit 110B shown in FIG. 11 differs from the multi-mode injection circuit 110A shown in FIG. 6 in that node ND101 is directly connected to reference voltage VSS without connected to the current source. Other configurations are the same as those shown in FIG. 6.

According to the multi-mode injection circuit 110B shown in FIG. 11, substantially the same function as that of the multi-mode injection circuit 110A shown in FIG. 6 can be realized.

The Third Exemplary Configuration of the Multi-Mode Injection Circuit

Figure 12:
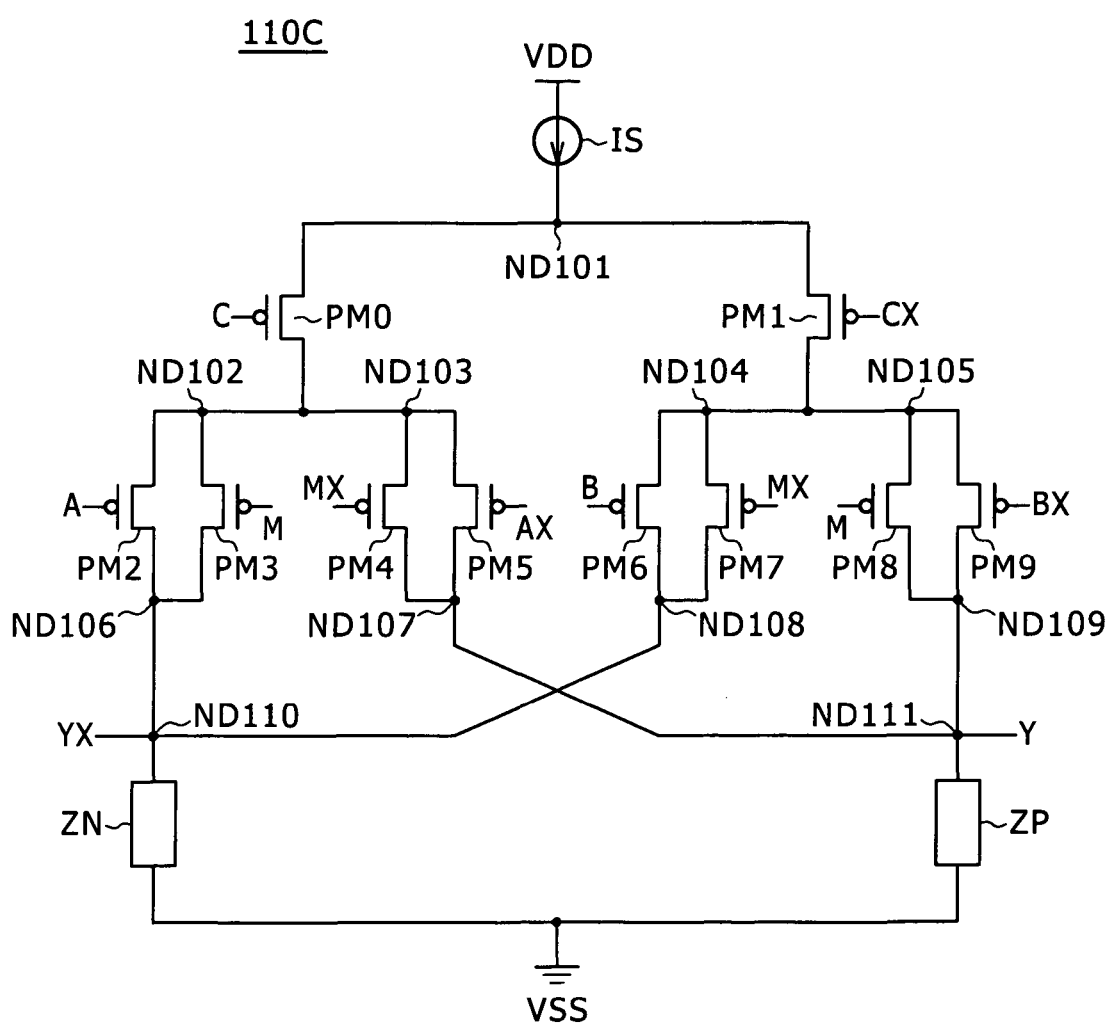
FIG. 12 is a circuit diagram illustrating a third exemplary configuration of the multi-mode injection circuit associated with embodiments of the invention.

Referring to FIG. 12, there is shown a circuit diagram illustrating the third exemplary configuration of the multi-mode injection circuit associated with embodiments of the invention.

The multi-mode injection circuit 110C shown in FIG. 12 differs from the multi-mode injection circuit 110A shown in FIG. 6 in that PMOS transistors PN0 through PN9 are used instead of NMOS transistors NM0 through NM9.

In connection relationship, the connection forms for the power supply potential side and the reference potential side and the signal levels are basically reversed to those of the multi-mode injection circuit 110A shown in FIG. 6. According to the multi-mode injection circuit 110C shown in FIG. 12, substantially the same function as that of the multi-mode injection circuit 110A shown in FIG. 6 can be realized.

Detail description of the connection relationship is skipped here.

It should be noted that, in FIG. 12, reference numerals ND101 through ND111 indicates of the nodes are given in correspondence with the positions in the same relationship as that shown in FIG. 6 for ease of understanding.

The Fourth Exemplary Configuration of the Multi-Mode Injection Circuit

Figure 13:
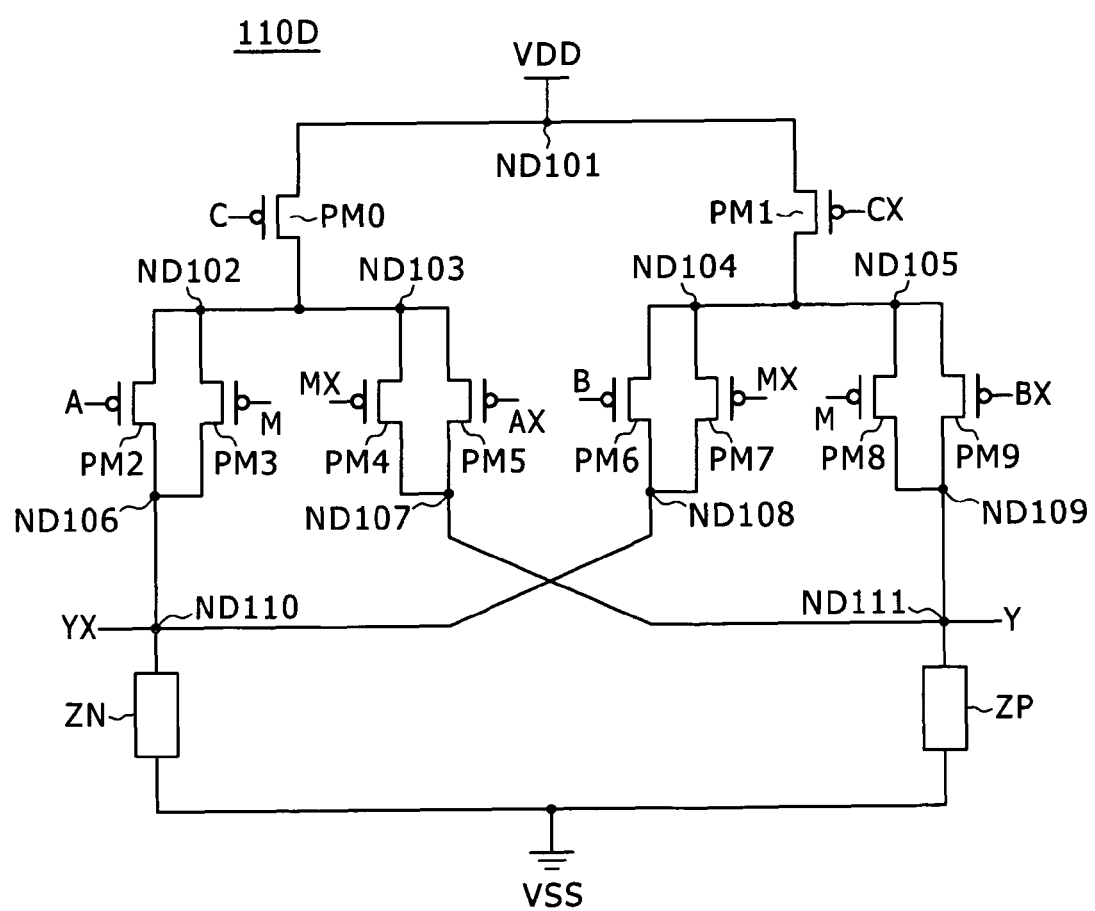
FIG. 13 is a circuit diagram illustrating a fourth exemplary configuration of the multi-mode injection circuit associated with embodiments of the invention.

Referring to FIG. 13, there is shown a circuit diagram illustrating the fourth exemplary configuration of the multi-mode injection circuit associated with embodiments of the invention.

The multi-mode injection circuit 110D shown in FIG. 13 differs from the multi-mode injection circuit 110C shown in FIG. 12 in that node ND101 is not connected to the current source but is directly connected to the supply line of supply voltage VDD.

Other configurations are substantially the same as those shown in FIG. 6.

According to the multi-mode injection circuit 110D shown in FIG. 13, substantially the same function as that of the multi-mode injection circuit 110A shown in FIG. 6 and the multi-mode injection circuit 110C shown in FIG. 12 can be realized.

Basic Operations in the Synchronous Oscillator

In the synchronous oscillator 100 having the configuration described above, the injection circuit 110 adds a signal component of the product of injection signal VM and input clock signal VC to input clock signal VC and outputs resultant injection circuit output signal VY.

Consequently, the phase of the synchronous oscillator 100 locks with injection signal VM.

Thus, the injection circuit 110 adds signal component of the product of injection signal VM and input clock signal VC to input clock signal VC and outputs resultant injection circuit output signal VY. Therefore, by the component of VC×VM, the phase of output signal VY adjusts the phase of clock signal VC in accordance with the phase of injection signal VM.

Further, the component of VC×VM is inverted or not inverted in accordance with the direction of the edge of VC. Hence, both the rising edge and the falling edge of clock signal VC can be locked, the edges of clock signal input VC being locked with the center of injection signal VM.

As described above, a clock signal having a clock frequency one half of the data rate of the reception data signal associated with injection signal VM can be outputted.

Therefore, the synchronous oscillator may only oscillate at a frequency one half the data rate, thereby lowering power dissipation.

(2) The Second Embodiment

The First Exemplary Configuration of the Clock Recovery Apparatus

Figure 14:
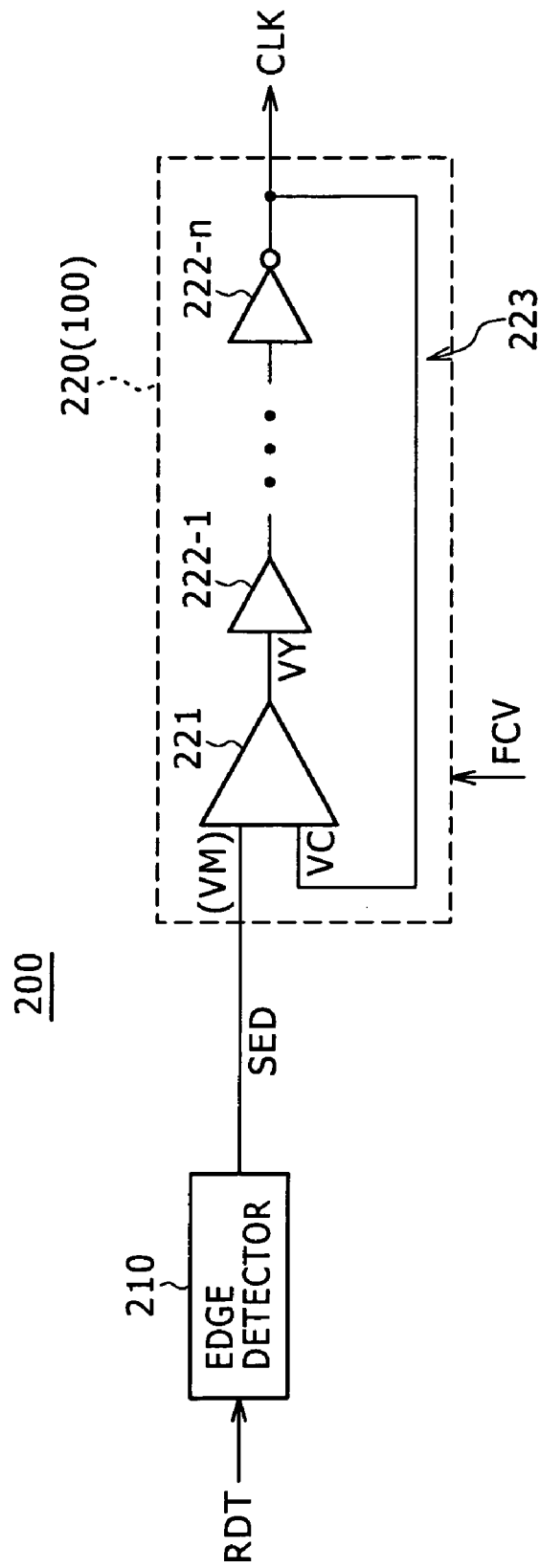
FIG. 14 is a block diagram illustrating an exemplary configuration of a clock recovery apparatus practiced as a second embodiment of the invention.

Referring to FIG. 14, there is shown a block diagram illustrating an exemplary configuration of the clock recovery apparatus practiced as the second embodiment of the invention.

A clock recovery apparatus 200 practiced as the second embodiment of the invention has an edge detector 210 and a synchronous oscillator 220.

For the synchronous oscillator 220, the synchronous oscillator 100 associated with the first embodiment described above is applied.

Therefore, the description of the detail configuration and function of the synchronous oscillator 220 is skipped here.

The edge detector 210 detects the edge of reception data signal RDT and outputs resultant edge detection signal SED to the synchronous oscillator 220 as an injection signal (VM).

Figure 15:
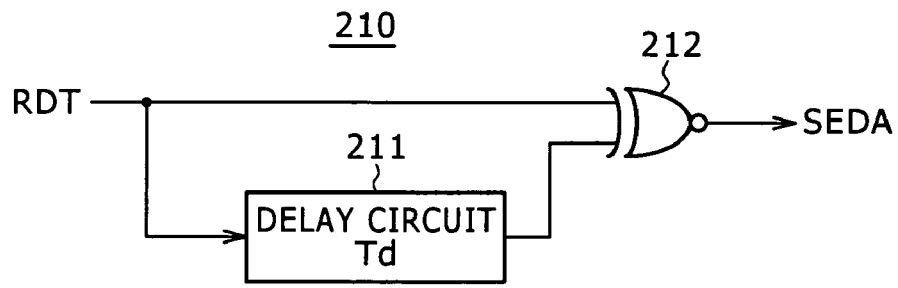
FIG. 15 is a circuit diagram illustrating an exemplary configuration of an edge detector associated with the second embodiment of the invention.

Referring to FIG. 15, there is shown a circuit diagram illustrating an exemplary configuration of the edge detector associated with the second embodiment.

The edge detector 210 shown in FIG. 15 has a delay circuit 211 and an exclusive-OR (EXOR) gate 212.

The first input of the EXOR gate 212 is connected to the input line of reception data signal RDT and the second input is connected to the output of the delay circuit 211.

The edge detector 210 detects the rising edge and the falling edge through one EXOR gate 212 and outputs a detection result to the synchronous oscillator 220 as edge detection signal SED as shown in FIG. 15.

Figure 16A:
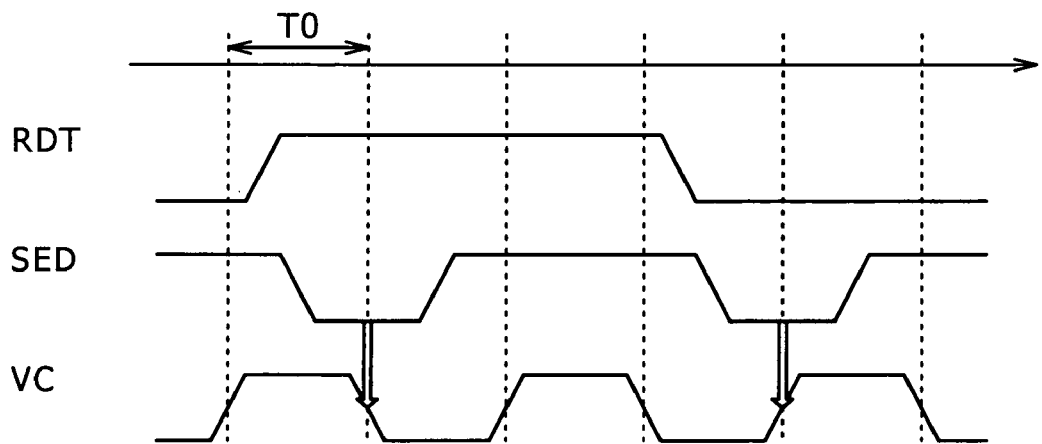
FIGS. 16A and 16B are timing charts indicative of exemplary operations of the clock recovery apparatus practiced as the second embodiment of the invention.
Figure 16B:
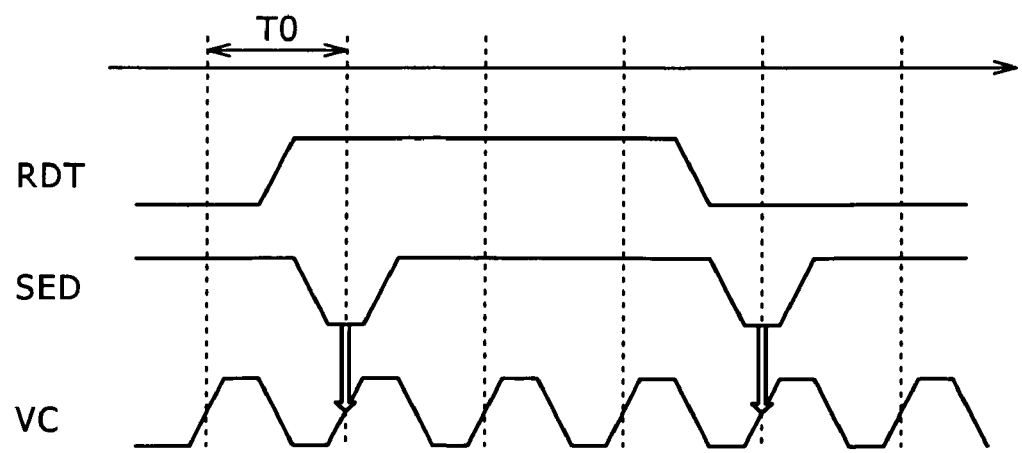

FIGS. 16A and 16B are flowcharts indicative of exemplary operations of the clock recovery apparatus associated with the second embodiment of the invention.

FIG. 16A is indicative of the timing in the case of a half rate operation. FIG. 16B is indicative of the timing in the case of a full rate operation.

With the synchronous oscillator 220, the oscillation frequency is controlled by oscillation frequency control signal FCV. The synchronous oscillator 220 takes in edge detection signal SED and is formed by a ring oscillator having at least one injection circuit.

The injection circuit 221 adds a signal component of the product of edge detection signal SED that is an injection signal (VM) and clock signal VC to input clock signal VC and outputs a resultant signal.

Consequently, as shown in FIGS. 16A and 16B, the edge of input clock signal VC is locked with the center of edge detection signal SED.

Thus, as shown in the timing chart shown in FIG. 16, the clock recovery apparatus 200 outputs recovery clock signal CLK locked with reception data signal RDT.

It should be noted that the clock recovery apparatus 200 is also able to output a recovery clock signal having the same frequency as the data rate as shown in the timing chart shown in FIG. 16.

In this case, the oscillation frequency of the synchronous oscillator 220 also becomes the same as the data rate, so that it may be difficult to obtain the effect of reduced power dissipation.

However, recovery data is obtained by use of one of the edges, rising or falling, of recovery clock signal CLK, so that there is no necessity of considering the influence of the duty ratio of recovery clock signal CLK.

With the synchronous oscillator 220 associated with the second embodiment, an injection circuit 221 is arranged in the first stage of a ring oscillator 223 and delay circuits 222-1 through 222-n are cascaded to the output of the injection circuit 221.

Figure 17:
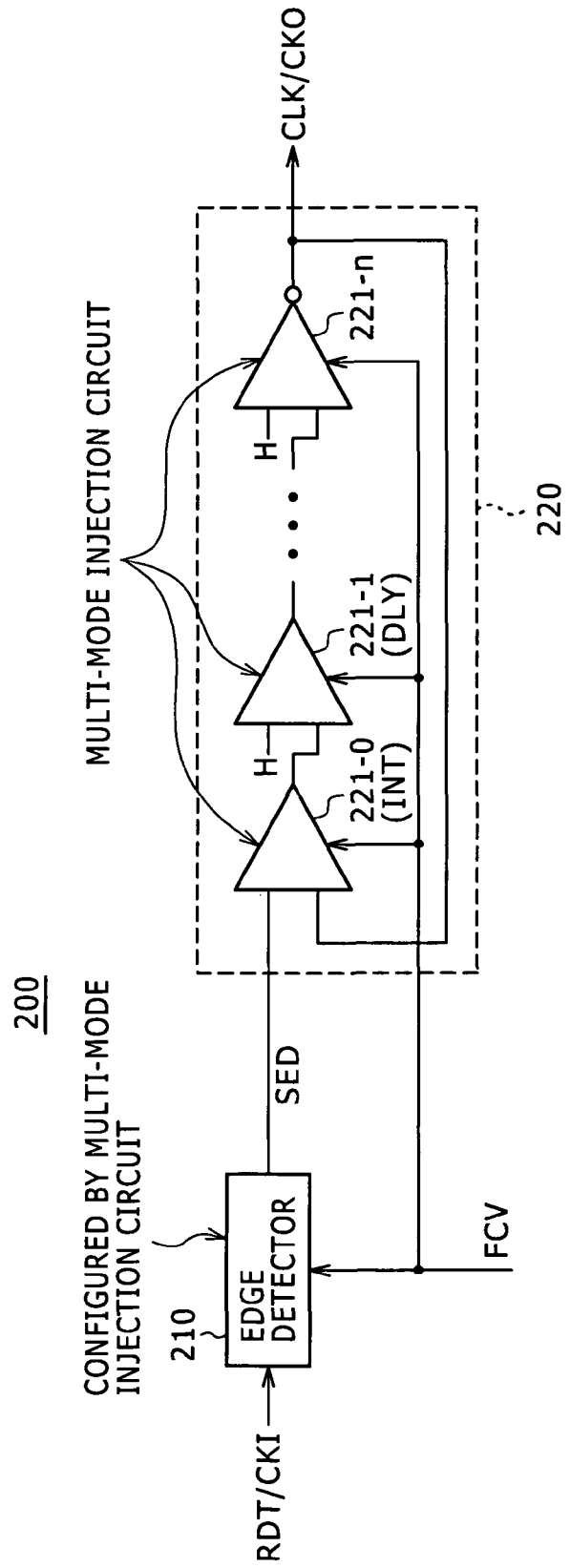
FIG. 17 is a schematic diagram illustrating an exemplary configuration of a synchronous oscillator formed by two or more multi-mode injection circuits in the second embodiment of the invention.

Therefore, as shown in FIG. 17, the synchronous oscillator 220 can be formed by use of injection circuits with input terminal M fixed to high level (connected to the supply line of supply voltage VDD) instead of these delay circuits 222A-1 through 222A-n as shown in FIG. 10.

With the synchronous oscillator 220 shown in FIG. 17, multi-mode injection circuits having the same configuration are cascaded and only the multi-mode injection circuit 221-0 in the first stage is used for injection circuit INJ with injection signal VM supplied at input terminal M.

The other multi-mode injection circuits 221-1 through 221-n are connected at input terminal M thereof to the supply line of supply voltage VDD, thereby being used for delay circuits DLY.

The output of multi-mode injection circuit 221-n in the last stage is connected to input terminal C of injection circuit INJ in the first stage.

The ring oscillator 223 is basically configured such that the odd-numbered stages of multi-mode injection circuits 221-1 through 221-n functioning as the delay circuits forming a ring have an inverter function.

With the edge detector 210 associated with the second embodiment, the delay circuit 211 and the NAND gate can be formed by multi-mode injection circuits.

(3) The Third Embodiment

The Second Exemplary Configuration of the Clock Recovery Apparatus

Figure 18:
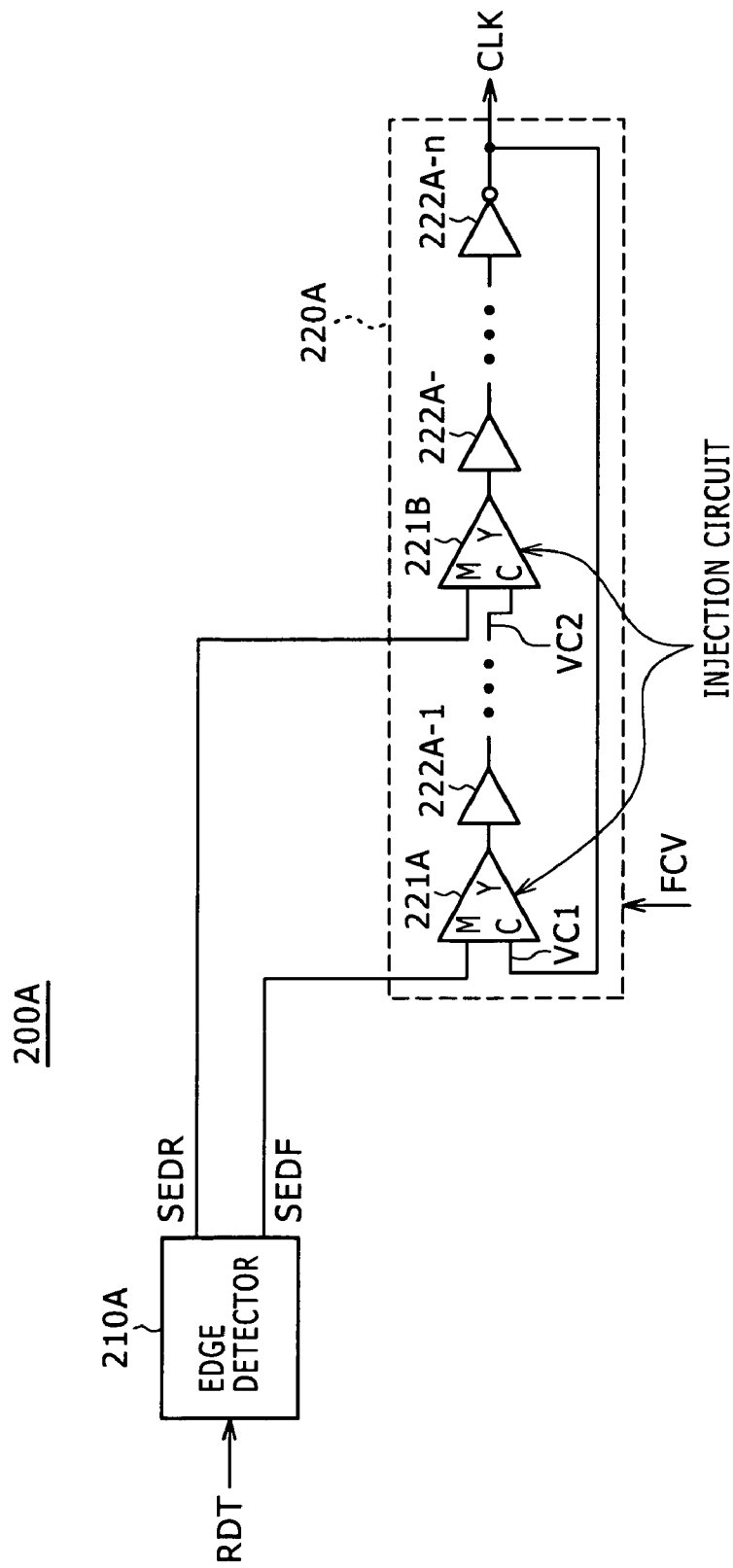
FIG. 18 is a schematic diagram illustrating an exemplary configuration of a clock recovery apparatus practiced as a third embodiment of the invention.

Referring to FIG. 18, there is shown a block diagram illustrating an exemplary configuration of a clock recovery apparatus practiced as the third embodiment of the invention.

A clock recovery apparatus 200A associated with the third embodiment has an edge detector 210A and a synchronous oscillator 220A as shown in FIG. 18.

The edge detector 210A detects the rising edge of reception data signal RDT to generate rising-edge detection signal SEDR indicative of the presence or absence of rising edge and falling-edge detection signal SEDF indicative of the presence and absence of falling edge.

The edge detector 210A outputs generated rising-edge detection signal SEDR and falling-edge detection signal SEDF to the synchronous oscillator 220A.

Exemplary Configuration of the Edge Detector

FIGS. 19A through 19D show circuit diagrams indicative of exemplary configurations of the edge detectors associated with the third embodiment.

FIGS. 20A through 20D show operation timings of the edge detectors shown in FIGS. 19A through 19D.

FIG. 20A shows reception data signal RDT, FIG. 20B shows delay signal S211, FIG. 20C shows rising-edge detection signal SEDR, and FIG. 20D shows falling-edge detection signal SEDF.

Figure 19A:
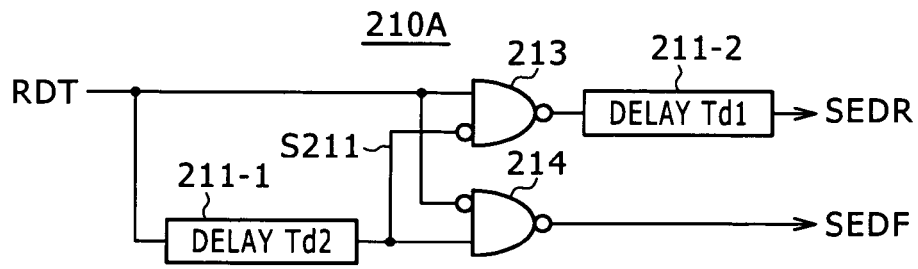
FIGS. 19A, 19B, 19C, and 19D are circuit diagrams illustrating edge detectors associated with the third embodiment of the invention.
Figure 19B:
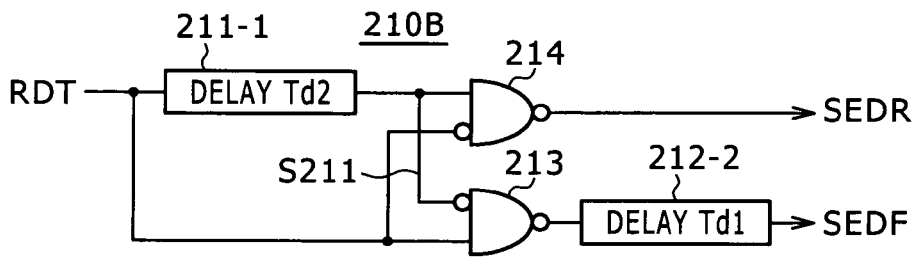

Edge detectors 210A and 210B shown in FIG. 19A and 19B include the delay circuits 211-1 and 211-2 and the 2-input NAND gates 213 and 214.

Figure 19C:
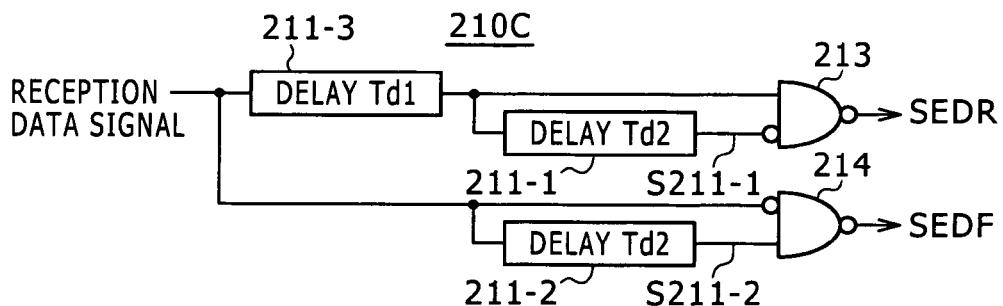
Figure 19D:
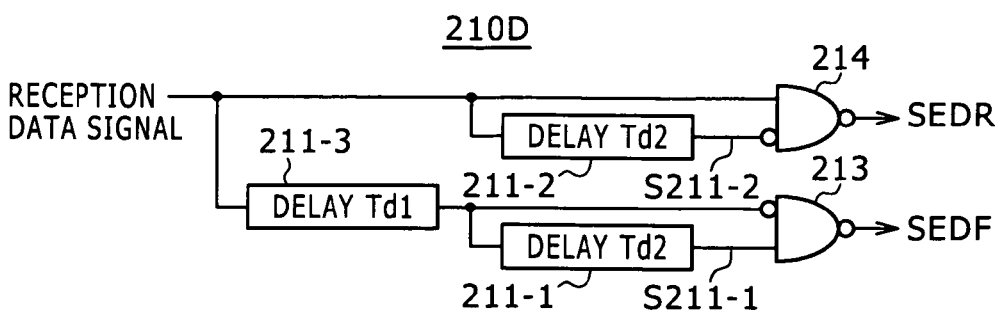

Edge detectors 210C and 210D shown in FIG. 19C and 19D include the delay circuits 211-1, 211-2 and 211-3 and the 2-input NAND gates 213 and 214.

The delay circuits 211-1 and 211-2 delay reception data signal RDT by time Td2 and output the delayed reception data signal to the NAND gates 213 and 214 as delay signal S211, respectively.

Delay time Td2 of the delay circuits 211-1 and 211-2 is set to a value that is shorter than period T0 of reception data signal RDT (Td2<T0).

For example, in FIGS. 19A and 19B, the NAND gate 213 is supplied at the first input with reception data signal RDT and at the second input that is negative with delay signal S211.

The NAND gate 214 is supplied at the first input with delay signal S211 and at the second input that is negative with reception data signal RDT.

With the edge detector 210A shown in FIG. 19A, the output of the NAND gate 213 is delayed by the delay circuit 211-3 by time Td1 and resultant rising edge detection signal SEDR is outputted.

From the NAND gate 214, falling-edge detection signal SEDF is outputted.

With the edge detector 210B shown in FIG. 19B, the output of the NAND gate 213 is delayed by the delay circuit 211-3 by time Td1 and resultant falling-edge detection signal SEDF is outputted.

From the NAND gate 214, rising-edge detection signal SEDR is outputted.

In FIG. 19C, the NAND gate 213 is supplied at the first input with reception data signal RDT through the delay circuit 211-3 and at the second input that is negative with delay signal S211-1 through the delay circuits 211-3 and 211-1.

The NAND gate 214 is supplied at the first input with delay signal S211-2 and at the second input that is negative with reception data signal RDT.

In FIG. 19D, the NAND gate 213 is supplied at the first input with delay signal S211-1 through delay circuits 211-3 and 211-1 and the second input that is negative with reception data signal RDT through the delay circuit 211-3.

The NAND gate 214 is supplied at the first input with reception data signal RDT and the second input that is negative with delay signal S211-2.

With the edge detector 210C shown in FIG. 19C, rising-edge detection signal SEDR is outputted from the NAND gate 213.

From the NAND gate 214, falling-edge detection signal SEDF is outputted.

With the edge detector 210D shown in FIG. 19D, falling-edge detection signal SEDF is outputted from the NAND gate 213.

From the NAND gate 214, rising-edge detection signal SEDR is outputted.

The edge detectors 210A through 210D shown in FIGS. 19A through 19D, respectively, operate as follows if jitters of reception data signal RDT are few and interval Tw between adjacent edges is higher than Td2.

Namely, the edge detectors 210A through 210D each outputs a pulse signal that goes low level L during period of Td2 for each edge as rising-edge detection signal SEDR or falling-edge detection signal SEDF as shown in FIGS. 20A, 20B, 20C, and 20D.

On the other hand, the edge detectors 210A through 210D operate as follows if interval Tw between adjacent edges is lower than Td2 due to the jitter.

Namely, the edge detectors 210A through 210D each outputs a pulse signal that goes low level L during a period of Tw for each edge as rising-edge detection signal SEDR or falling-edge detection signal SEDF as shown in FIGS. 20A, 20B, 20C, and 20D.

Thus, with the each of edge detectors 210A through 210D shown in FIGS. 19A through 19D, the circuits for detecting rising edge and falling edge are separated from each other and the edges of each reception data signal rise and fall alternately, that is, one edge does not occur consecutively.

Therefore, even if the adjacent edges are made close to each other by the jitter, these edges can be detected.

With the synchronous oscillator 220A associated with the third embodiment, the injection circuits 221A and 221B are arranged in the first and middle states of the ring oscillator 223 and delay circuits 222A-1 through 222A-n are cascaded to the outputs of the 2-input injection circuit 221A and 221B.

Figure 21:
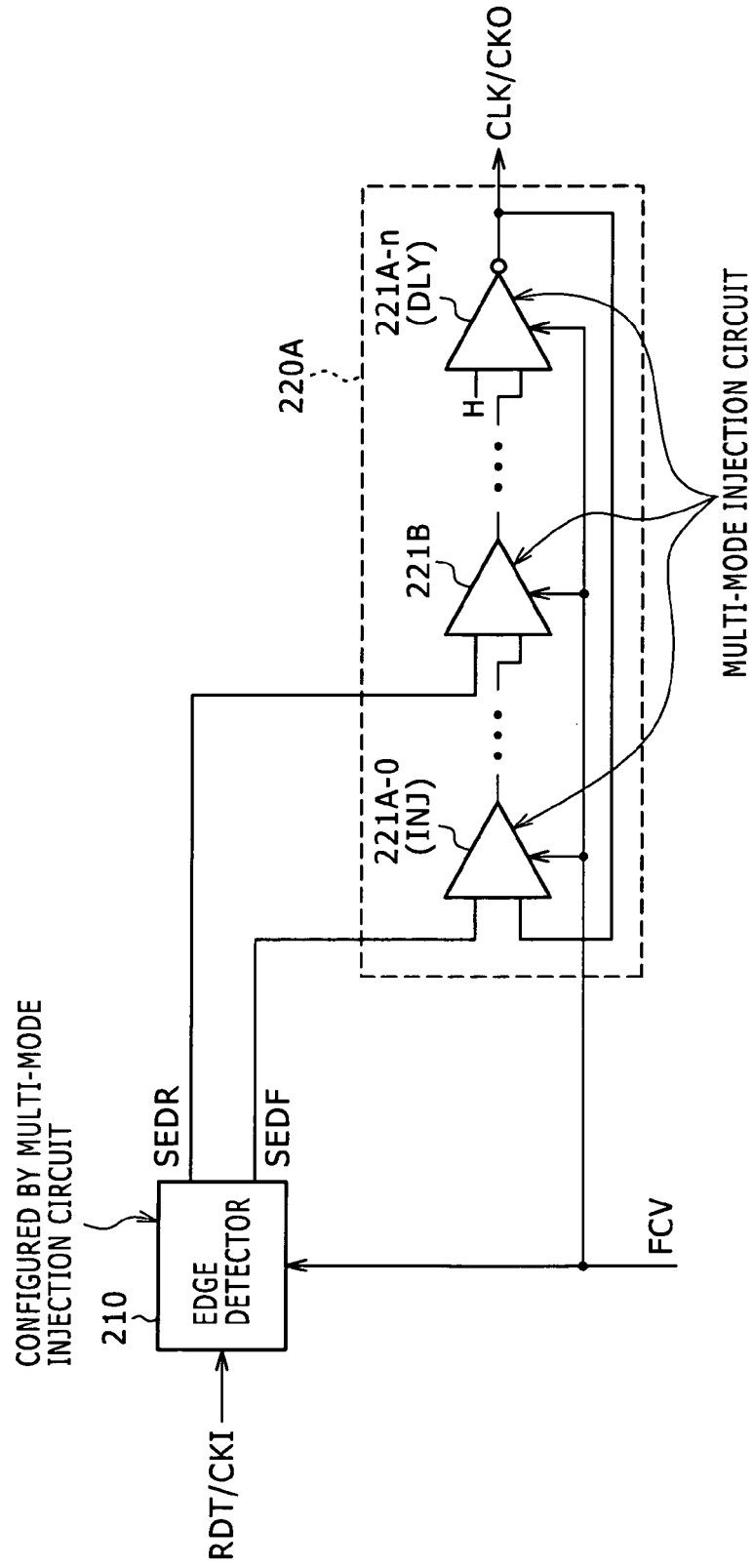
FIG. 21 is a schematic diagram illustrating an exemplary configuration of a synchronous oscillator formed by two or more multi-mode injection circuits in the third embodiment of the invention.

Therefore, as with the examples shown in FIGS. 10 and 17, the synchronous oscillator 220A can be formed by using injections circuits with input terminal M fixed to high level H (connected to the supply line of supply voltage VDD) for these delay circuits 222A-1 through 222A-n as shown in FIG. 21.

With the synchronous oscillator 220A shown in FIG. 21, multi-mode injection circuits 221A and 221B having the same configuration are cascaded and only two multi-mode injection circuits 221A-0 and 221B are used for injection circuit INJ with injection signal VM supplied at input terminal M thereof.

With the other multi-mode injection circuits 221A-1 through 221A-n, input terminal M thereof is connected to the supply line of supply voltage VDD and are used as delay circuits DLY.

The output of multi-mode injection delay circuit 221A-n in the last stage is connected to input terminal C of the injection circuit (INJ) 221A in the first stage.

The ring oscillator 223 is basically configured such that the odd-numbered stages of multi-mode injection circuits 221A-1 through 221A-n functioning as the delay circuits forming a ring have an inverter function.

The frequency of the synchronous oscillator 220A is controlled by oscillation frequency control signal FCV.

The synchronous oscillator 220A is formed by a ring oscillator that takes in rising-edge detection signal SEDR and falling-edge detection signal SEDF and has at least two injection circuits 221A and 221B the delay time of clock oscillation loop being Td2.

One or more delay circuits DLY is cascaded to clock output Y of the injection circuit 221A in the first stage and clock input C of the injection circuit 221B in a subsequent stage.

It is assumed that the injection circuit 221B be delayed by delay time Td2 relative to the injection circuit 221A-0.

In FIG. 18, falling-edge detection signal SEDF is entered in injection signal input M of the injection circuit 221A-0 in the first stage and rising-edge detection signal SEDR is entered in injection signal input M of the injection circuit 221B in a subsequent stage.

FIGS. 22A and 22B are timing charts indicative of exemplary operations of the clock recovery apparatus practiced as the third embodiment of the invention.

FIG. 22A shows a timing at the time of a half-rate operation. FIG. 22B shows a timing at the time of a full-rate operation.

FIGS. 23A and 23B are timing charts indicative of exemplary operations of the synchronous oscillator practiced as the third embodiment of the invention.

FIG. 23A shows a timing at the time when the rising edge of a clock signal locks. FIG. 23B shows a timing at the time when the falling edge of a clock signal locks.

For example, as shown in FIGS. 22A and 22B, internal clock VC1 that is a clock signal input of the injection circuit 221A is delayed by time Td2 to provide internal clock signal VC2 that is a clock signal input of the injection circuit 221B.

Of the two edge detection signals SEDR and SEDF, rising-edge detection signal that is entered delayed by time Td2 is supplied to input terminal M of the injection circuit 221B and falling-edge detection signal SEDF is supplied to input terminal M of the injection circuit 221A-0.

The inject circuits 221A-0 and 221B add a signal component of the product of injection signal VM and input clock signal VC to input clock signal VC and output resultant injection circuit output VY.

Thus the phase of the synchronous oscillator 220A locks with the edge detection signal, of which operation will be described below with reference to the timing chart shown in FIGS. 23A and 23B.

As described above, the inject circuits 221A-0 and 221B add a signal component of the product of injection signal VM and input clock signal VC to input clock signal VC and output resultant injection circuit output VY. Therefore, by the component of VC×VM, the phase of VY is adjusted in accordance with the phase of injection signal (edge detection signal) VM as shown in FIGS. 23A and 23B.

Further, because the component of VC×VM is inverted or not inverted in accordance with the direction of the edge of input clock signal VC, both the rising edge and falling edge of input clock signal VC can be locked, thereby locking the edge of input clock signal VC with the center of the edge injection signal (VM).

Thus, as shown in the timing chart shown in FIGS. 22A and 22B, the clock recovery apparatus 200A outputs a recovery clock signal locked with reception data signal RDT.

Consequently, the clock recovery apparatus 200A practiced as the third embodiment of the invention outputs recovery clock signal CLK having a clock frequency that is one half the data rate of reception data signal RDT. Hence, the synchronous oscillator 220A may only oscillate at a frequency one half the data rate, thereby realizing low power dissipation.

It should be noted that as shown in the timing chart shown in FIGS. 22A and 22B, the clock recovery apparatus 200A can also output recovery clock signal CLK having the same frequency as the data rate.

In this case, the oscillation frequency of the synchronous oscillator also becomes the same as the data rate, so that it may be difficult to obtain the effect of low power dissipation.

However, recovery data is obtained by use of only one of the rising edge or the falling edge of recovery clock signal CLK, so that there is no necessity of considering the influence of the duty ratio of the recovery clock signal.

Figure 24:
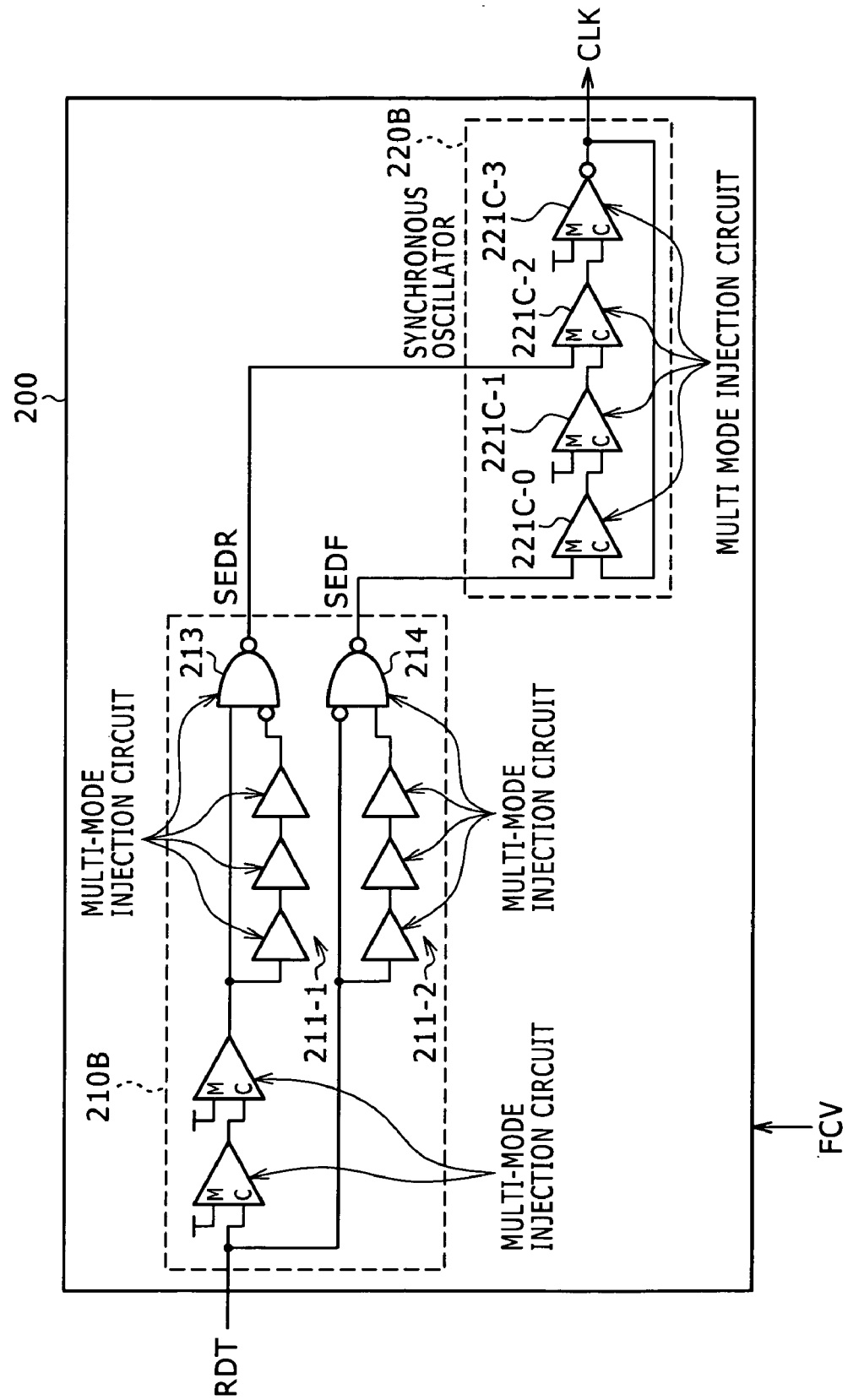
FIG. 24 is a schematic diagram illustrating exemplary configurations of an edge detector formed by two or more multi-mode injection circuits and a synchronous oscillator formed by two or more injection circuits in the third embodiment of the invention.

Referring to FIG. 24, there is shown an exemplary configuration of an edge detector and a synchronous oscillator each configured by two or more multi-mode injection circuits in the third embodiment of the invention.

With clock recovery apparatus and a clock distribution circuit to be described later, if the injection circuits in the synchronous oscillators making up these apparatus and circuit are configured by multi-mode injection circuits shown in FIG. 6 and other figures, not only injection circuits but also all of edge detectors and synchronous oscillators can be configured by multi-mode injection circuits.

Each edge detector is configured by NAND circuits and delay circuits as shown in FIGS. 19A through 19D and each synchronous oscillator is configured by injection circuits and delay circuits.

It should be noted however that the multi-mode injection circuit associated with the third embodiment can be used as an injection circuit, an AND circuit, and a delay circuit as described above.

Therefore, the edge detector can be configured by multi-mode injection circuits alone as shown in FIG. 24; in this case, the delay times become the same, thereby facilitating timing prediction. In addition, these multi-mode injection circuits can be arranged in an array, thereby making the arrangement area relatively small.

The edge detector 210B shown in FIG. 24 is equivalent to the configuration shown in FIG. 19C.

The delay circuit 212B of the edge detector 210B is formed by two stages of multi-mode injection circuits with input M connected to the power supply.

The two stages of multi-mode injection circuits are the same as two stages of multi-mode injection circuits 221C-0, 221C-1, 221C-2 and 221C-3 for rising-edge detection signal SEDF and falling-edge detection signal SEDR.

Figure 25:
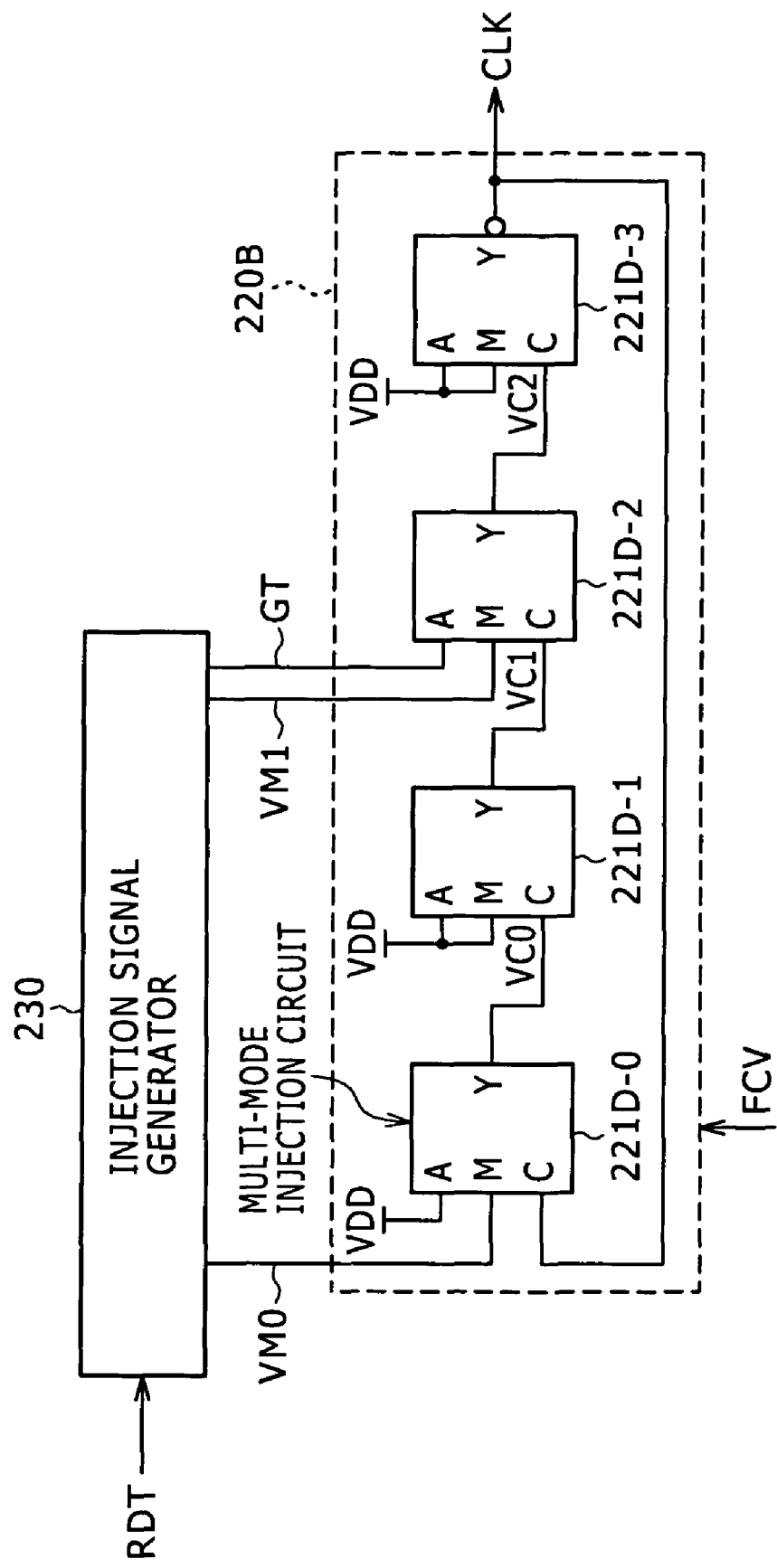
FIG. 25 is a block diagram illustrating an exemplary configuration of a clock recovery apparatus practiced as a fourth embodiment of the invention.

(4) The Fourth Embodiment
The Third Exemplary Configuration of the Clock Recovery Apparatus Referring to FIG. 25, there is shown a block diagram illustrating an exemplary configuration of a clock recovery apparatus practiced as a fourth embodiment of the invention.

A clock recovery apparatus 200D associated with the fourth embodiment has an injection signal generator 230 and a synchronous oscillator 220D as shown in FIG. 25.

The injection signal generator 230 generates an edge detection signal for only the first edge of reception data signal RDT, thereby generating gating signal GT.

The injection signal generator 230 generates an edge detection signal for edges of reception data signal RDT, thereby generating injection signals VM0 and VM1.

The injection signal generator 230 outputs generated gating signal GT and generated injection signals VM0 and VM1 to the synchronous oscillator 220D.

Exemplary Configuration of the Injection Signal Generator

Figure 26:
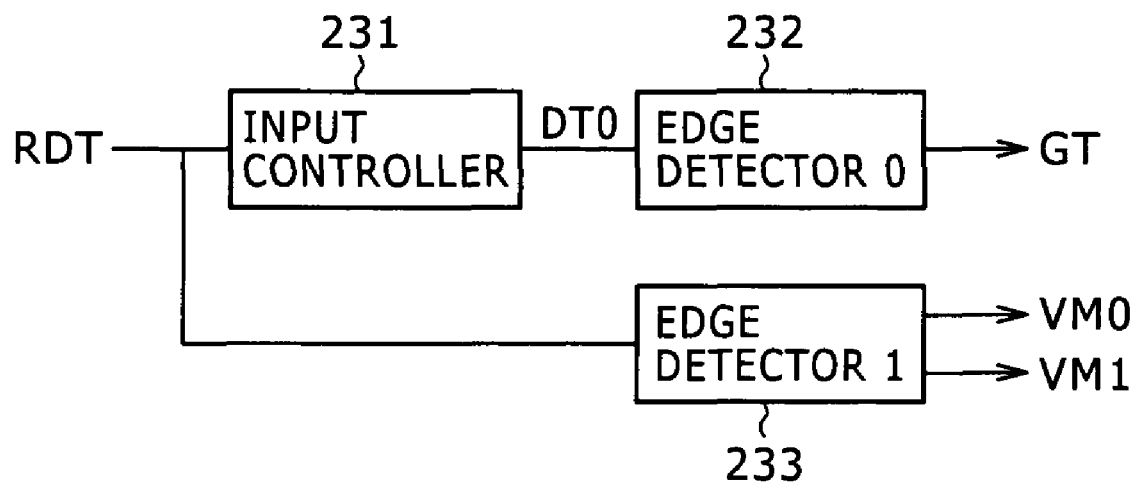
FIG. 26 is a block diagram illustrating an exemplary configuration of an injection signal generator associated with the fourth embodiment of the invention.

Referring to FIG. 26, there is shown a block diagram illustrating an exemplary configuration of a injection signal generator associated with the fourth embodiment.

Figure 27:
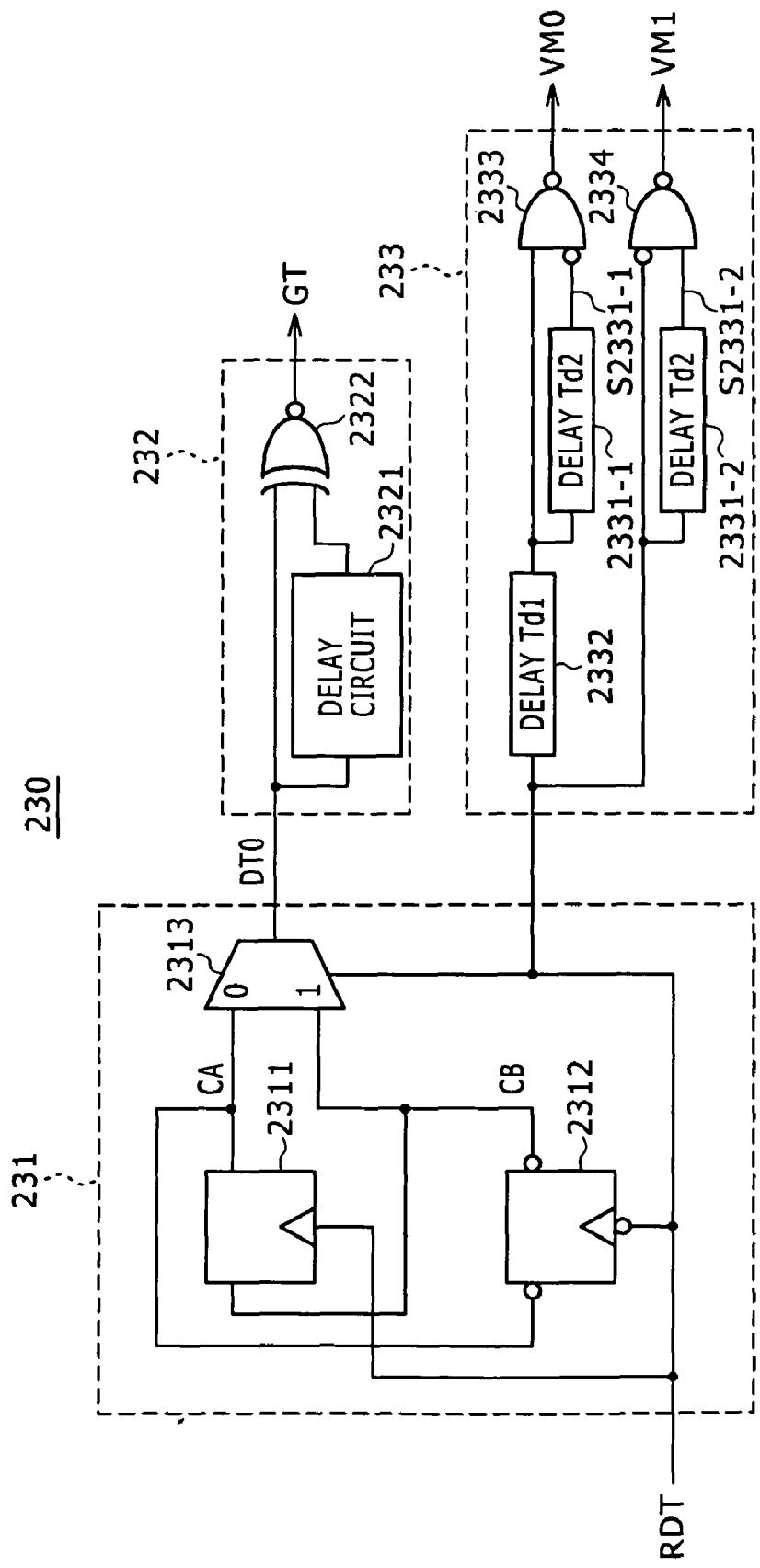
FIG. 27 is a circuit diagram illustrating an exemplary configuration of the injection signal generator associated with the fourth embodiment of the invention.

Referring to FIG. 27, there is shown a circuit diagram illustrating an exemplary configuration of the injection signal generator associated with the fourth embodiment.

Figure 28A:
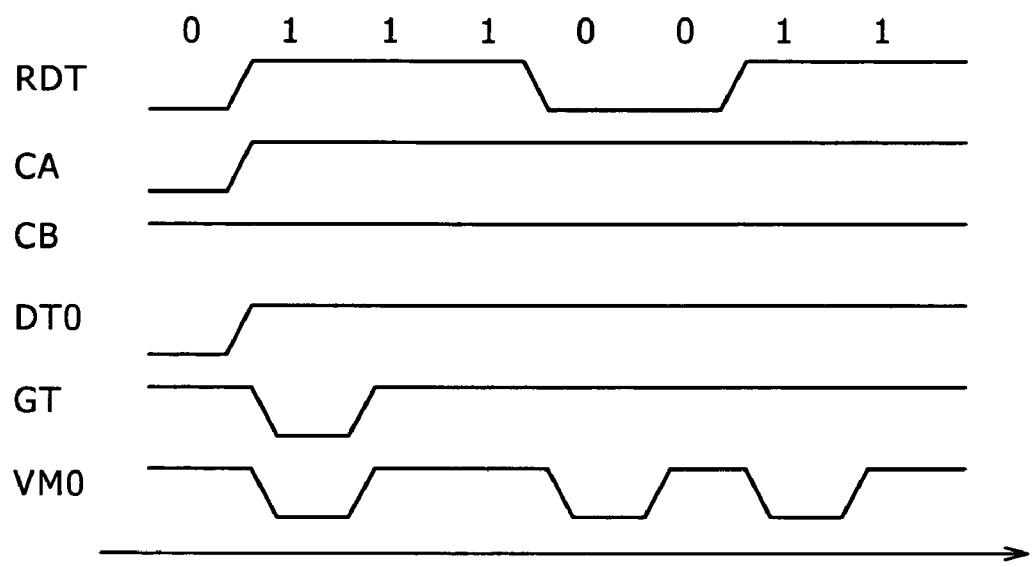
FIGS. 28A and 28B are timing charts indicative of operations of the injection signal generator associated with the fourth embodiment of the invention.
Figure 28B:
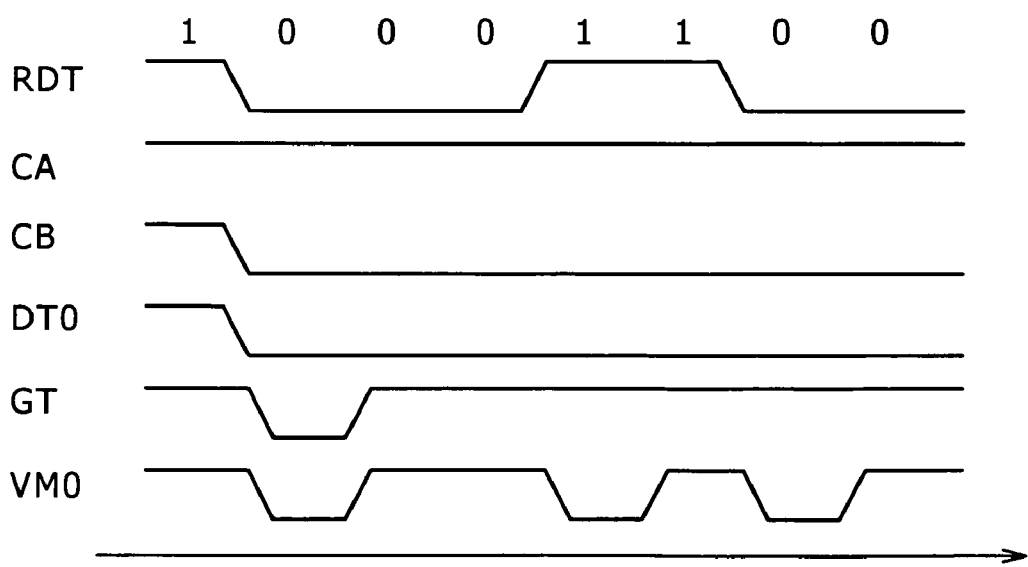

FIGS. 28A and 28B show timing charts for the injection signal generator associated with the fourth embodiment. FIG. 28A is a timing chart at the time when the first bit of a reception data signal sequence is at low level L. FIG. 28B is a timing chart at the time when the first bit of a reception data signal sequence is at high level H.

As shown in FIG. 26, the injection signal generator 230 is configured by an input controller 231 and edge detectors 232 and 233.

The input controller 231 passes only the first edge of a reception data signal sequence.

The edge detector 233 detects the edge of output signal DT0 of the input controller 231 to generate and output gating signal GT.

The edge detector 232 detects the rising edge and the falling edge of reception data signal RDT to generate and output injection signal VM0 and injection signal VM1.

The input controller 231 is configured by two flipflops (FF) 2311 and 2312 and one multiplexer (MUX) 2313 as shown in FIG. 27.

These two flipflops FF2311 and FF2312 are reset at the time an operation starts and outputs CA and CB are in the states of CA=L and CB=H, respectively.

When the first edge of reception data signal RDT is entered, output signal DT0 changes in accordance with reception data signal RDT as shown in FIGS. 28A and 28B.

At the same time, output signal DT0 changes to CA=H at the first rising edge of reception data signal RDT and changes to CB=L at the falling edge, becoming CA=CB.

Hence, when the second and subsequent edges of reception data signal RDT are entered, output signal DT0 does not change as shown in FIGS. 28A and 28B; therefore, the input controller 231 passes only the first edge of a reception data signal sequence.

Like the edge detector 210 shown in FIG. 15, the edge detector 232 has a delay circuit 2321 and an exclusive-OR (EXOR) gate 2322.

The first input of the EXOR gate 2322 is connected to the input line of output signal DT0 of the input controller 231 and the second input is connected to the output of the delay circuit 2321.

The edge detector 232 detects the edge of output signal DT0 to output gating signal GT. Therefore, gating signal GT is outputted as a pulse signal by detecting only the first edge of reception data signal sequence.

Like the edge detector 210C shown in FIG. 19C, the edge detector 233 has delay circuits 2331-1, 2331-2, and 2332, and 2-input NAND gates 2333 and 2334.

The delay circuits 2331-1 and 2331-2 delay the signal by time Td2 and the delay circuit 2332 delays reception data signal RDT by time Td1.

The NAND gate 2333 is supplied at the first input with reception data signal RDT through the delay circuit 2332 and at the second input that is negative input with delay signal S2331-1 through the delay circuits 2332 and 2331-1.

The NAND gate 2334 is supplied at the first input with delay signal S2331-2 and at the second input that is negative input with reception data signal RDT.

The edge detector 233 detects the rising edge and the falling edge of reception data signal RDT to output injection signal VM0 and injection signal VM1, respectively.

As described before, the synchronous oscillator 220D is a ring oscillator 223 that has at least one multi-mode injection circuit.

Like the case shown in FIG. 24 for example, the synchronous oscillator 220D has 2-stage configuration for injection signals VM0 and VM1 and is formed by the multi-mode injection circuits 221D-0 and 221D-1 and 221D-2 and 221D-3. The multi-mode injection circuits 221D-0, 221D-1, 221D-2, and 2321D-3 each have input A in addition to inputs C and M.

With the synchronous oscillator 220D, the edge of a recovery clock signal locks with the center of a pulse wave of injection signal VM0 and the edge of internal clock signal VC1 locks with the center of a pulse wave of injection signal VM1. The connections of injection signals VM0 and VM1 are the same as falling-edge detection signal SEDF and rising-edge detection signal SEDR of the second and third embodiments.

To be more specific, as shown in FIG. 25, injection signal VM0 is entered in injection signal input M of the multi-mode injection circuit 221D-0 of the first stage and injection signal VM1 is entered in injection signal input M of the multi-mode injection circuit 221D-2 in a subsequent stage.

Gating signal GT is entered in input A of the multi-mode injection circuit 221D-2 of a subsequent stage. Because gating signal GT is entered in input A of the multi-mode injection circuit 221D-2, this injection circuit provides an AND circuit (Y=A×C) as described before.

Input A of the multi-mode injection circuit 221D-0 of the first stage is connected to the supply line of power supply VDD, thereby being fixed to high level H.

Input A and input M of the multi-mode injection circuits 221D-0 and 221D-3 of the second and fourth stages are connected to the supply line of supply voltage VDD, thereby being fixed to high level H. Therefore, the multi-mode injection circuits 221D-0 and 221D-3 of the second and fourth stages function as delay circuits DLY as described before.

The following describes operations of the clock recovery apparatus practiced as the fourth embodiment of the invention.

Figure 29:
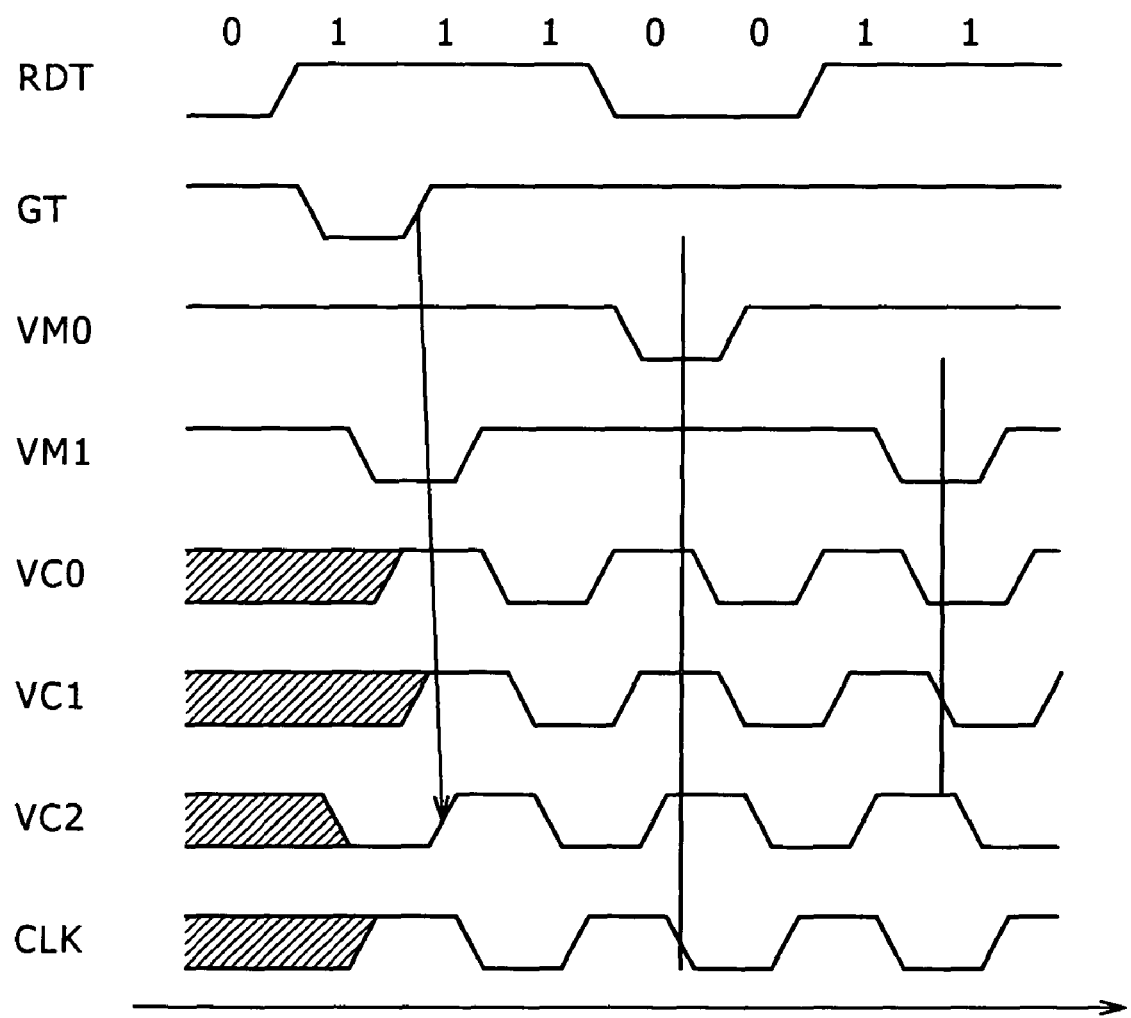
FIG. 29 is a timing chart indicative of exemplary operations of the clock recovery apparatus associated with the fourth embodiment of the invention.

Referring to FIG. 29, there is shown a timing chart indicative of exemplary operations of the clock recovery apparatus associated with the fourth embodiment.

The clock recovery apparatus 200D is configured by the injection signal generator 230 and the synchronous oscillator 220D as described above.

The injection signal generator 230 outputs gating signal GT and injection signals VM0 and VM1 to the synchronous oscillator 220D. Gating signal GT is an edge detection signal for detecting the first edge of a reception data signal sequence. Injection signals VM0 and VM1 are injection signals for edges of a reception data signal sequence.

The synchronous oscillator 220D is a ring oscillator having at least one multi-mode injection circuit, in which the edge of recovery clock signal CLK is locked with the center of a pulse wave of injection signal VM0 and the edge of internal clock signal VC1 is locked with the center of a pulse wave of injection signal VM1.

Gating signal GT is connected to input A of the multi-mode injection circuit 221D-2 of the synchronous oscillator 220D, so that the multi-mode injection circuit 220D-2 provides an AND circuit (Y=A×C).

Hence, internal clock signal VC2 is as shown in FIG. 29 by the pulse input of gating signal GT.

As described above, one pulse input of gating signal GT allows the phase of the synchronous oscillator 220D to be locked with reception data signal RDT, so that the locking time is shorter than that of the above-mentioned second and third clock recovery apparatuses. Therefore, this clock reproducing apparatus 200D is able to realize a locking time equivalent to those of related-art clock recovery apparatuses based on gated VC0.

Gating signal GT is an edge detection signal for detecting the first edge of a reception data signal sequence as described above. Therefore, the phase of the synchronous oscillator 220D is adjusted by injection signals VM0 and VM1 for the edges subsequent to the first edge of the reception data signal RDT, thereby being locked with reception data signal RDT.

Consequently, this clock recovery apparatus 200D can execute locking on one bit basis.

Further, because the locking time can be shortened by this injection signal generator 230, there is no necessity of considering a locking time in designing an injection amount of injection signal VM into clock output Y of each multi-mode injection circuit.

For this reason, the injection amount can be designed by considering jitter resistance and power dissipation, thereby improving jitter resistance and power dissipation for the second and third clock recovery apparatuses mentioned above.

(5) The Fifth Embodiment

The Fourth Exemplary Configuration of the Clock Recovery Apparatus

Figure 30:
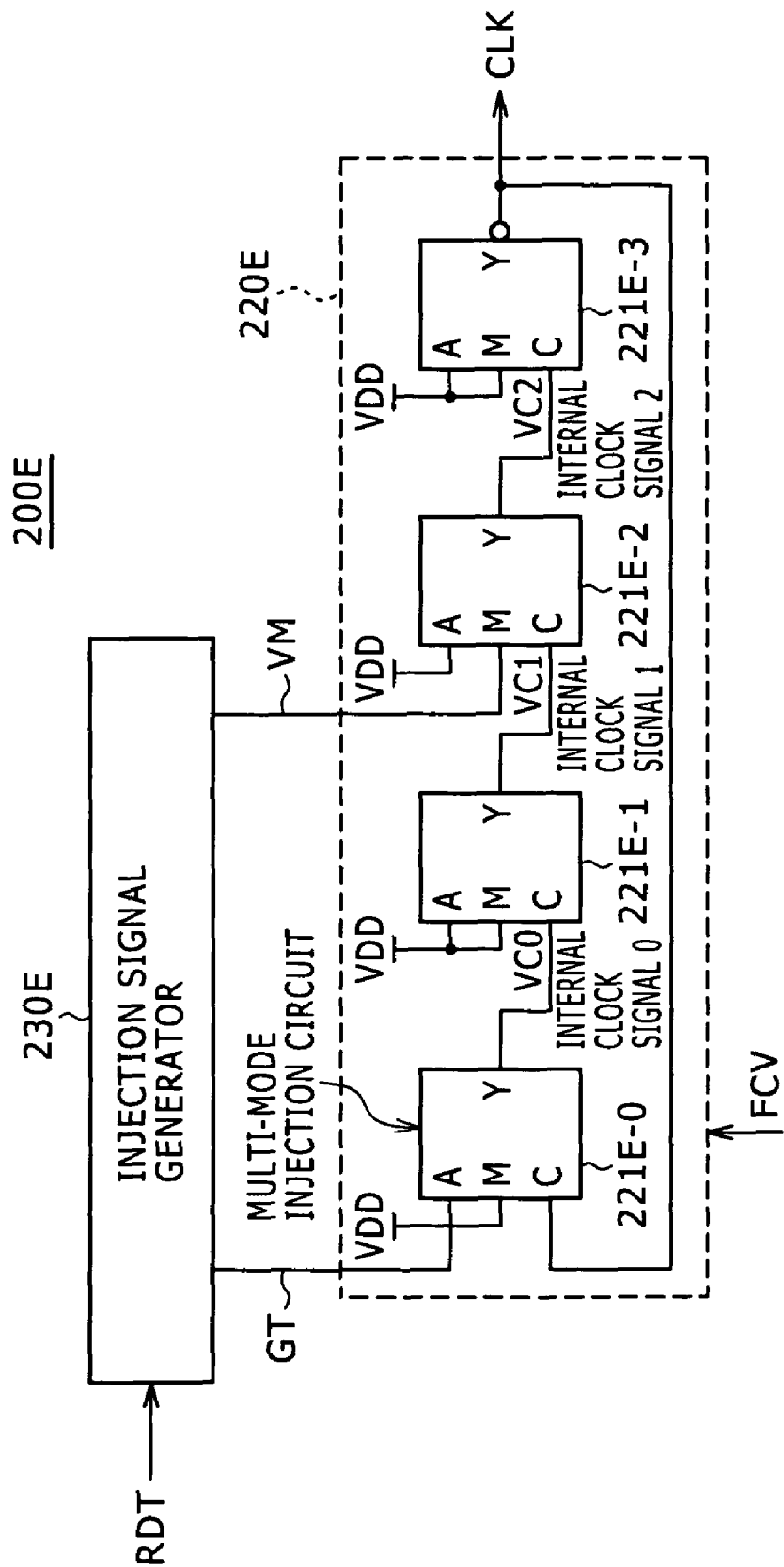
FIG. 30 is a block diagram illustrating an exemplary configuration of a clock recovery apparatus practiced as a fifth embodiment of the invention.

Referring to FIG. 30, there is shown a block diagram illustrating an exemplary configuration of a clock recovery apparatus practiced as a fifth embodiment of the invention.

A clock recovery apparatus 200E associated with the fifth embodiment has an injection signal generator 230E and a synchronous oscillator 220E as shown in FIG. 30.

The injection signal generator 230E generates an edge detection signal only for the first edge of reception data signal RDT, thereby generating gating signal GT.

The injection signal generator 230E generates an edge detection signal for edges of reception data signal RDT, thereby generating injection signal VM0.

The injection signal generator 230E outputs generated gating signal GT and generated injection signal VM to the synchronous oscillator 220E.

Exemplary Configuration of the Injection Signal Generator

Figure 31:
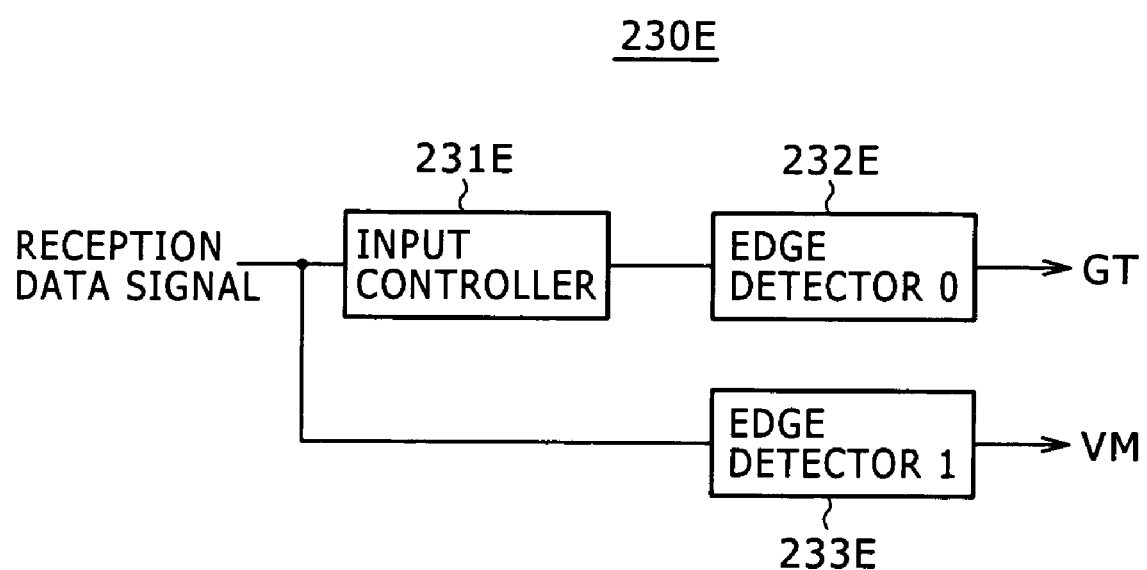
FIG. 31 is a block diagram illustrating an exemplary configuration of an injection signal generator associated with the fifth embodiment of the invention.

Referring to FIG. 31, there is shown a block diagram illustrating an exemplary configuration of the injection signal generator associated with the fifth embodiment.

Figure 32:
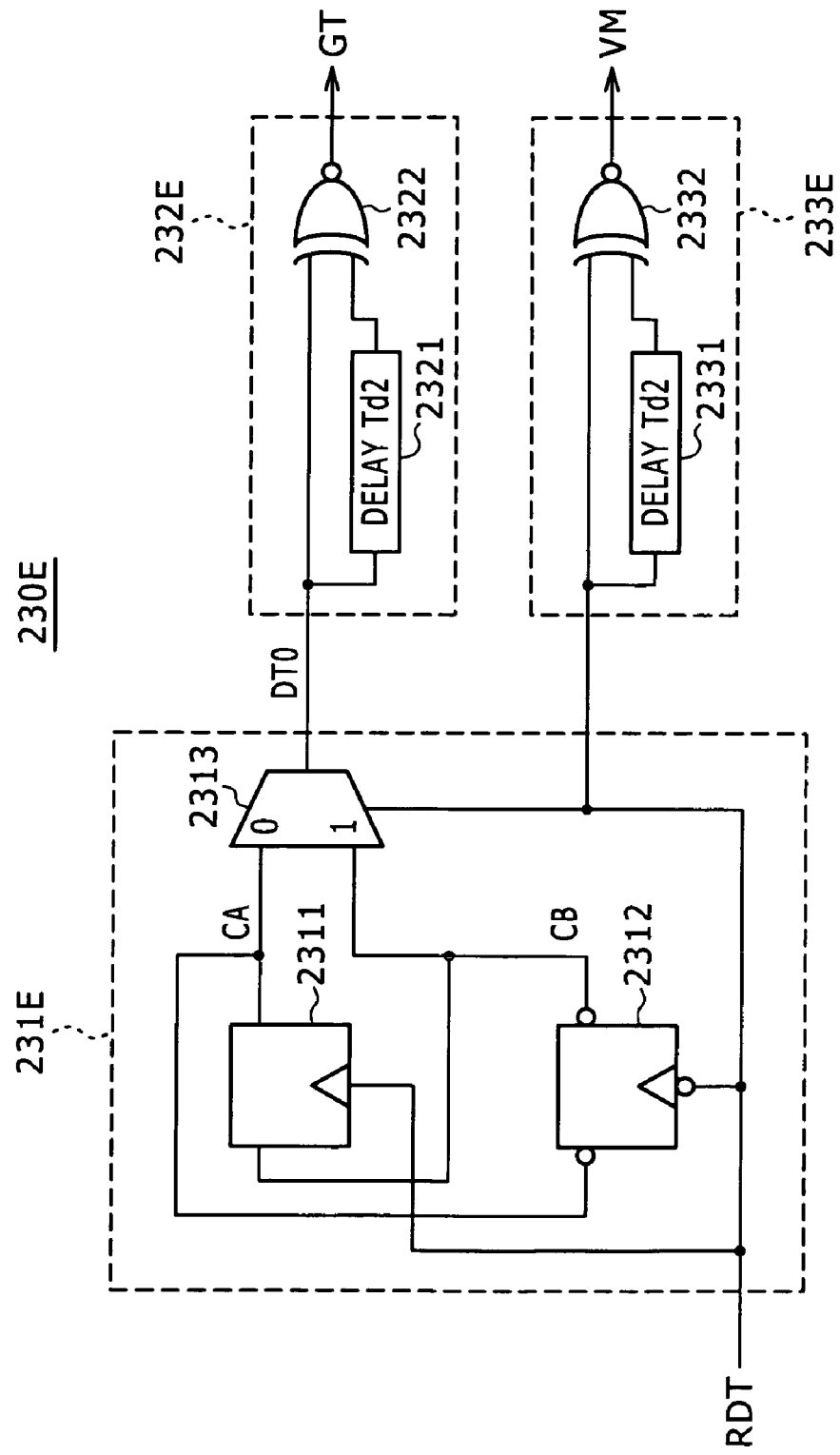
FIG. 32 is a circuit diagram illustrating an exemplary configuration of the injection signal generator associated with the fifth embodiment of the invention.

Referring to FIG. 32, there is shown a circuit diagram illustrating an exemplary configuration of the injection signal generator associated with the fifth embodiment.

Figure 33A:
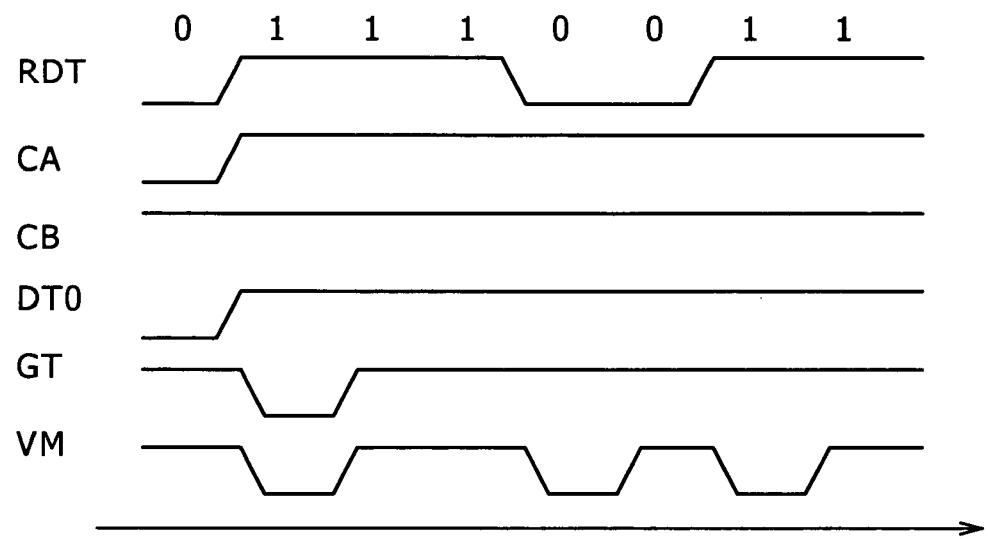
FIGS. 33A and 33B are timing charts indicative of operations of the injection signal generator associated with the fifth embodiment of the invention.
Figure 33B:
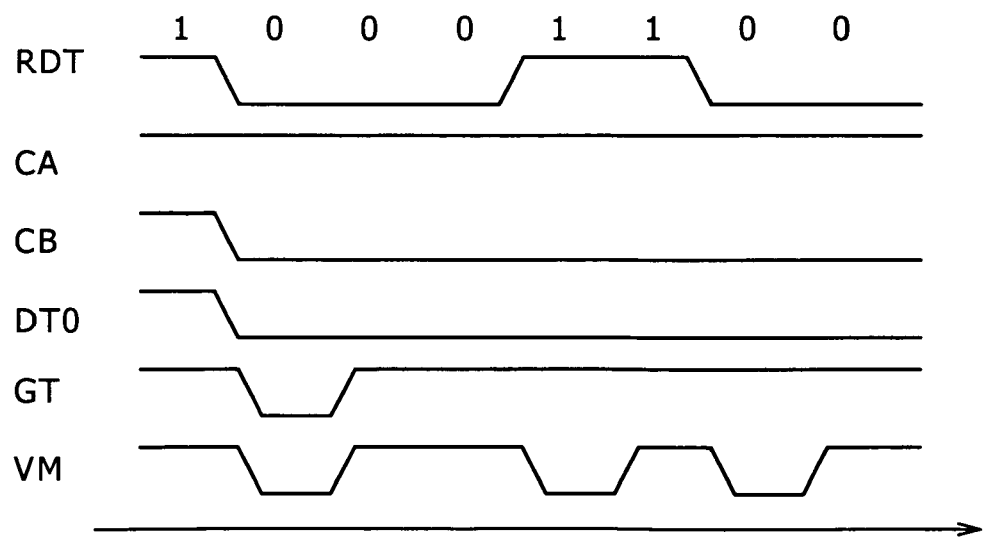

Referring to FIGS. 33A and 33B, there are shown timing charts indicative of the timings of the injection signal generator associated with the fifth embodiment. FIG. 33A is a timing chart at the time when the first bit of a reception data signal sequence is at low level L. FIG. 33B is a timing chart at the time when the first bit of a reception data signal sequence is at high level H.

As shown in FIG. 31, the injection signal generator 230E is configured by an input controller 231E and edge detectors 232E and 233E.

The input controller 231E passes only the first edge of a reception data signal sequence.

The edge detector 232E detects an edge of output signal DT0 of the input controller 231 to generate and output gating signal GT.

The edge detector 233E detects an edge of reception data signal RDT to generate and output injection signal VM.

Like the input controller 231 shown in FIG. 27, the input controller 231E is configured by two flipflops (FF) 2311 and 2312 and one multiplexer (MUX) 2313.

The input controller 231E is substantially the same as the input controller 231 shown in FIG. 27 in configuration and function, so that the description thereof is skipped.

Like the edge detector 232 shown in FIG. 27, the edge detector 232E has a delay circuit 2321 and an EXOR gate 2322.

The first input of the EXOR gate 2322 is connected to the input line of output signal DT0 of the input controller 231E and the second input is connected to the output of the delay circuit 2321.

The edge detector 232E detects an edge of output signal DT0 to output gating signal GT. Therefore, gating signal GT is outputted as a pulse signal by detecting only the first edge of a reception data signal sequence.

Like the edge detector 232E, the edge detector 233E has a delay circuit 2331 and an EXOR gate 2332.

The first input of the EXOR gate 2331 is connected to the input line of reception data signal RDT and the second input is connected to the output of the delay circuit 2331.

The edge detector 233E detects an edge of reception data signal RDT to output injection signal VM.

As described above, the synchronous oscillator 220E is the ring oscillator 223 having at least one multi-mode injection circuit.

Like the case shown in FIG. 25 for example, the synchronous oscillator 220D has a 2-stage configuration for gating signal GT and injection signal VM and is formed by multi-mode injection circuits 221E-0, 221E-1, and 221E-2 and 221-E-3. The multi-mode injection circuits 221E-0, 221E-1, and 221E-2 and 221-E-3 each have input A in addition to inputs C and M.

Injection signal VM is supplied to one M input of any one of the multi-mode injection circuits.

With the synchronous oscillator 220E, the edge of internal clock signal VC1 is locked with the center of a pulse wave of injection signal VM. Injection signal VM is entered in injection signal input M of the multi-mode injection circuit 221E-2 of a subsequent stage.

Gating signal GT is entered in input A of the multi-mode injection circuit 221E-0 of the first stage. Because gating signal GT is entered in input A, the multi-mode injection circuit 221E-0 provides an AND circuit (Y=A×C) as described above.

Input M of the multi-mode injection circuit 221E-0 of the first stage is connected to the supply line of supply voltage VDD, thereby being fixed to high level H.

Inputs A and M of the multi-mode injection circuit 221E-0 and the multi-mode injection circuit 221E-3 of the second and fourth stages, respectively, are connected to the supply line of supply voltage VDD, thereby being fixed to high level H. Therefore, the multi-mode injection circuit 221E-0 and the multi-mode injection circuit 221E-3 of the second and fourth stages function as delay circuits DLY as described above.

The following describes operations of the clock recovery apparatus practiced as the fifth embodiment of the invention.

Figure 34:
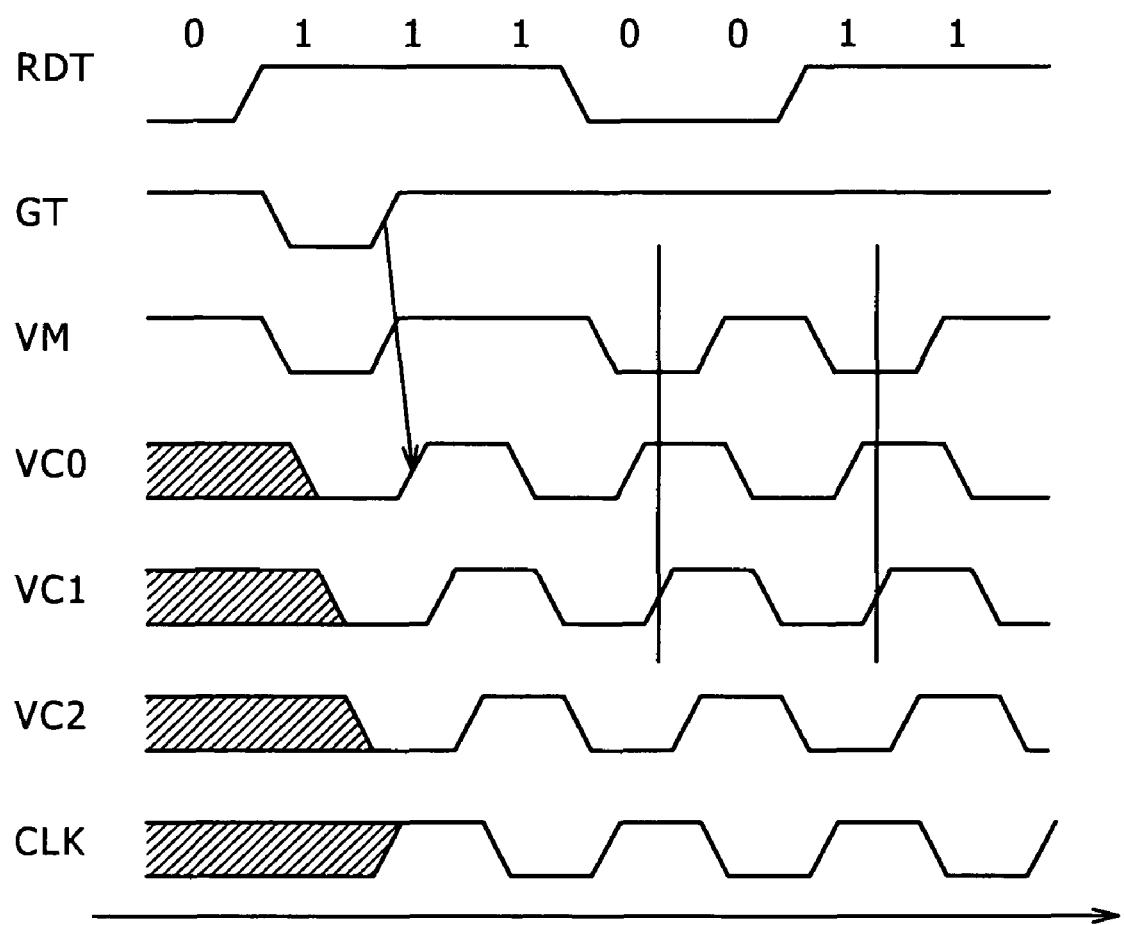
FIG. 34 is a timing chart indicative of operations of the clock recovery apparatus practiced as the fifth embodiment of the invention.

Referring to FIG. 34, there is shown a timing chart indicative of exemplary operations of the clock recovery apparatus associated with the fifth embodiment.

The clock recovery apparatus 200E is configured by the injection signal generator 230E and the synchronous oscillator 220E.

The injection signal generator 230E outputs gating signal GT and injection signal VM to the synchronous oscillator 220E. Gating signal GT is an edge detection signal for detecting the first edge of a reception data signal sequence. Injection signal VM is an injection signal for an edge of a reception data signal sequence.

The synchronous oscillator 220E is a ring oscillator having at least one multi-mode injection circuit. The edge of internal clock VC1 is locked with the center of a pulse wave of injection signal VM.

Gating signal GT is connected to input A of multi-mode injection circuit 221E-0 of the synchronous oscillator 220E, so that the multi-mode injection circuit 221E-0 provides an AND circuit (Y=A×C).

Hence, internal clock signal VCO becomes as shown in FIG. 34 by the pulse input of gating signal GT.

As described above, one pulse input of gating signal GT allows the phase of the synchronous oscillator 220E to be locked with reception data signal RDT, thereby shortening the locking time as compared with the second and third clock recovery apparatuses described above. Therefore, this clock recovery apparatus 200E is able to realize substantially the same locking time as those of related-art clock recovery apparatuses based on gated VCO.

Gating signal GT is an edge detection signal for detecting the first edge of a reception data signal sequence as described above. Therefore, the phase of the synchronous oscillator 220E is adjusted by injection signal VM0 for the edges subsequent to the first edge of the reception data signal RDT, thereby being locked with reception data signal RDT.

Consequently, this clock recovery apparatus 200E can execute locking on one bit basis.

Further, because the locking time can be shortened by this injection signal generator 230E, there is no necessity of considering a locking time in designing an injection amount of injection signal VM into clock output Y of each multi-mode injection circuit.

For this reason, the injection amount can be designed by considering jitter resistance and power dissipation, thereby improving jitter resistance and power dissipation for the second and third clock recovery apparatuses mentioned above.

First Exemplary Connection of the Clock Recovery Apparatus

Figure 35:
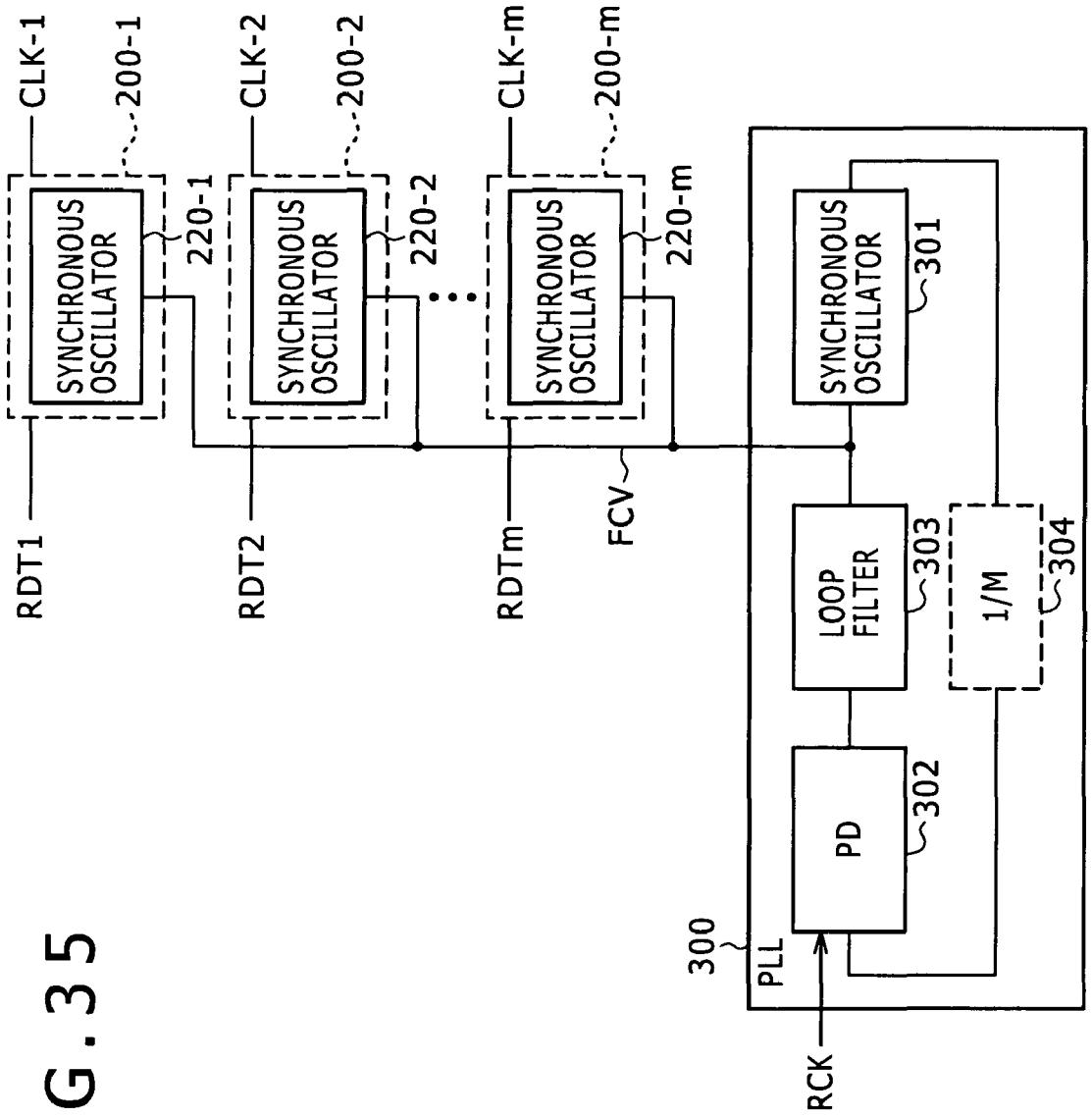
FIG. 35 is a block diagram illustrating a first exemplary connection of the clock recovery apparatus practiced as embodiments of the invention.

Referring to FIG. 35, there is shown a block diagram illustrating a first exemplary connection of the clock recovery apparatus practiced as embodiments of the invention.

In this connection example, two or more clock recovery apparatuses 200-1 through 200-*m* are arranged and oscillation frequency controlled voltage FCV is supplied to these clock recovery apparatuses 200-1 through 200-*m* from a phase locking circuit (PLL) 300.

In FIG. 35, the clock recovery apparatuses described with reference to the second and third embodiments are applied to the clock recovery apparatus 200-1 through 200-*m*.

In FIG. 35, for the brevity of drawing, only the synchronous oscillators 220-1 through 220-*m* to which oscillation frequency controlled voltage (signal) FCV is supplied are shown for the clock recovery apparatuses 200-1 through 200-*m*.

The PLL 300 has a synchronous oscillator 301, a phase comparator (PD) 302, and a loop filter 303. Alternatively, a divider 304 is arranged on the output side of a voltage-controlled oscillator 201.

The output of the loop filter 303 of the PLL 300 is outputted as oscillation frequency control voltage FCV.

The synchronous oscillator 301 of the PLL 300 is substantially the same in configuration as the synchronous oscillators 220-1 through 220-*m* of the clock recovery apparatuses 200-1 through 200-*m*.

Consequently, the precision oscillation frequency control can be executed.

Clocks CLK-1 through CLK-m locked with reception data signal RDT are outputted from the clock recovery apparatuses 200-1 through 200-*m*.

The Second Exemplary Connection of the Clock Recovery Apparatus

Figure 36:
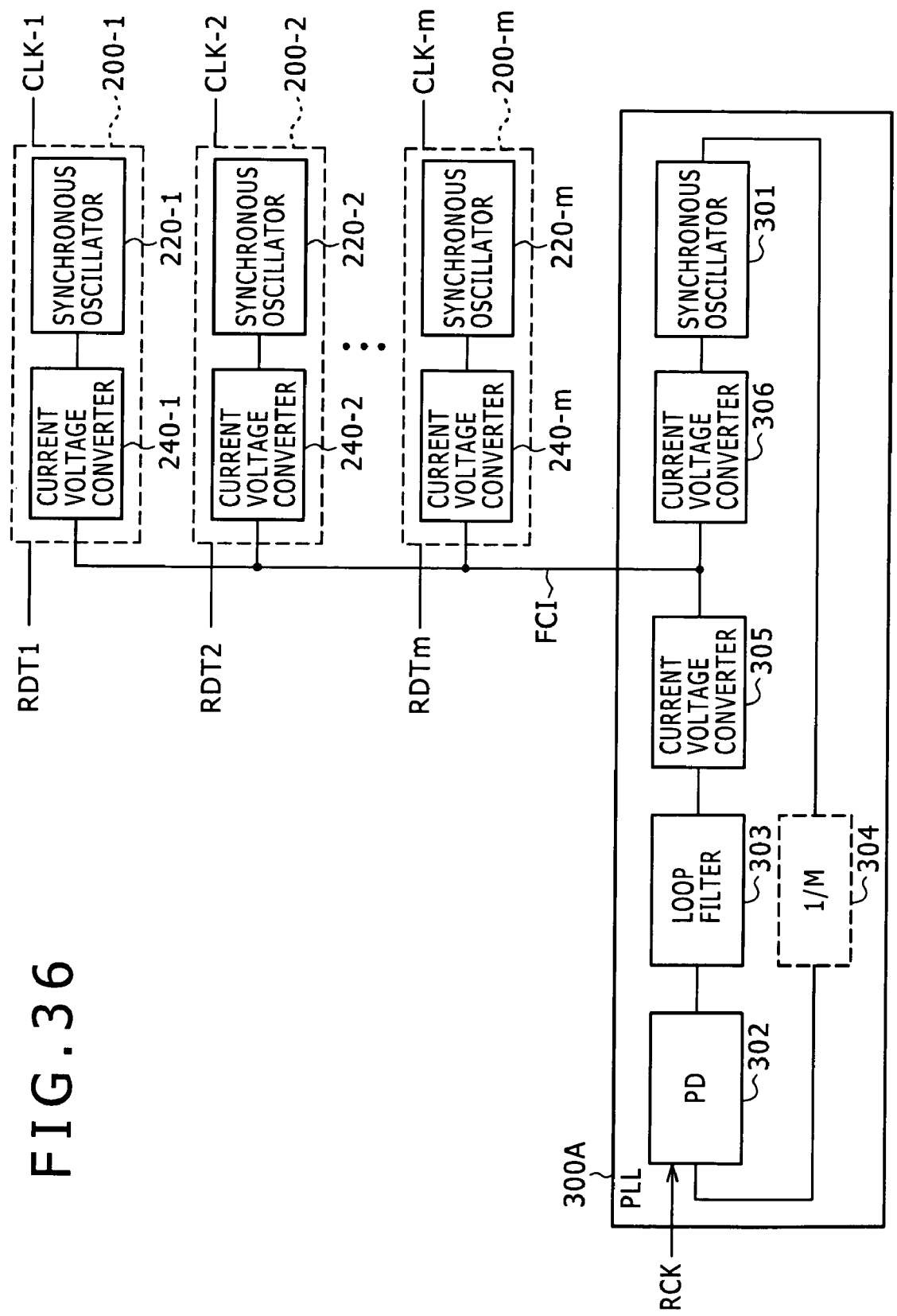
FIG. 36 is block diagram illustrating a second exemplary connection of the clock recovery apparatus practiced as embodiments of the invention.

Referring to FIG. 36, there is shown a block diagram illustrating the second exemplary connection of the clock recovery apparatus associated with embodiments of the invention The second exemplary connection differs from the first exemplary connection in that oscillation frequency control current FCI is supplied by a PLL 300A instead of supplying oscillation frequency control voltage FCV by the PLL 300.

In order to realize this configuration, a voltage-current converter (a VI converter) 305 is arranged on the output side of a loop filter 303 of the PLL 300A and the output of the voltage-current converter 305 is supplied as oscillation frequency control current FCI.

In addition, in the PLL 300A, a current-voltage converter (an IV converter) 306 is arranged on the input side of the synchronous oscillator 301.

Further, current-voltage converters (IV converters) 230-1 through 230-*m* are arranged on the input side of the synchronous oscillators 220-1 through 220-*m* of the clock recovery apparatuses 200-1 through 200-*m*.

In this configuration, because a control current is supplied instead of a control voltage, a control signal can be correctly supplied without being affected by voltage variations, thereby realizing the oscillation control with higher accuracy.

(6) The Sixth Embodiment

The First Exemplary Configuration of a Clock Distribution Circuit

Figure 37:
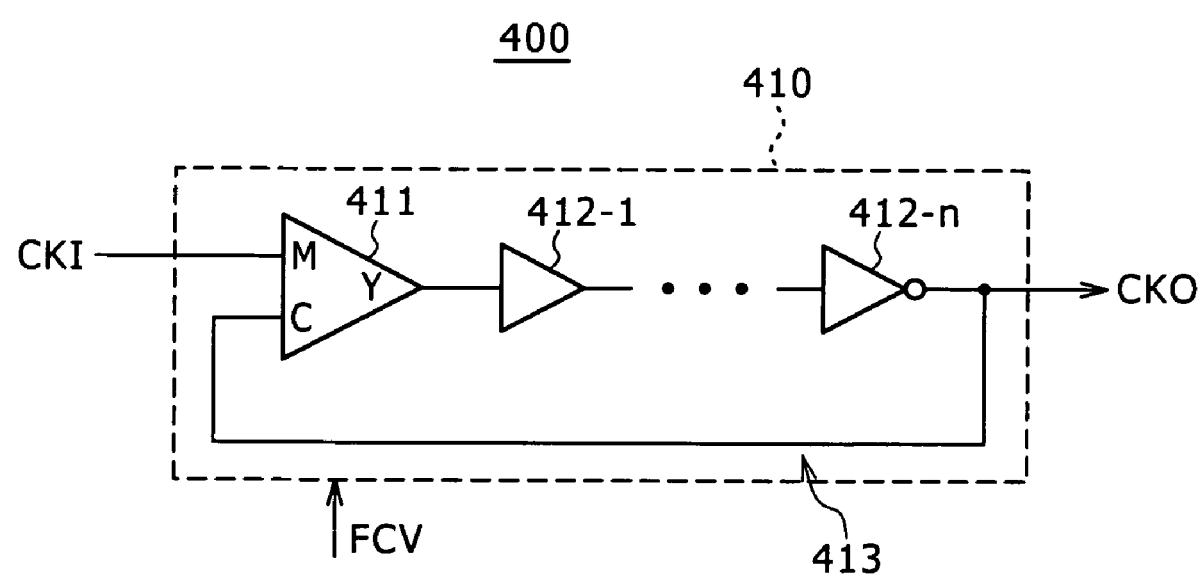
FIG. 37 is a schematic diagram illustrating an exemplary configuration of a clock distribution circuit practiced as a sixth embodiment of the invention.

Referring to FIG. 37, there is shown an exemplary configuration of a clock distribution circuit practiced as the sixth embodiment of the invention.

A clock distribution circuit 400 associated with the sixth embodiment is configured by a synchronous oscillator 410 having substantially the same configuration as the synchronous oscillator 100 of the first embodiment.

As shown in FIG. 37, the synchronous oscillator 410 associated with the sixth embodiment is configured by a ring oscillator 413 including at least one injection circuit 411.

The synchronous oscillator 410 is controlled in frequency by oscillation frequency control signal FCV.

With the ring oscillator 413 shown in FIG. 37, the 2-input injection circuit 411 is arranged in the first stage, delay circuits 412-1 through 412-*n* are cascaded to the output of the injection circuit 411, and the output of the delay circuit 412-*n* in the last stage is connected to one input C of the injection circuit 411 of the first stage.

The ring oscillator 413 is basically formed such that the odd-numbered delay circuits of the delay circuits 412-1 through 412-*n* forming a ring provide an inverter function.

The injection circuit 411 of the sixth embodiment has injection signal input terminal M, clock signal input terminal C, and clock output terminal Y.

The injection circuit 411 adds to clock signal VC entered in clock signal input terminal C a signal component of the product of the clock signal VC and input clock signal CKI (VM) that is an injection signal entered in injection signal input terminal M.

Then, the injection circuit 411 outputs a result of this addition from clock output terminal Y as clock signal VY.

FIGS. 38A through 38C show timing charts indicative of exemplary operations of the clock distribution circuit associated with the sixth embodiment.

FIG. 38A shows a timing with distribution ratio N being 1 (N=1). FIG. 38B shows a timing with distribution ratio N=2. FIG. 38C shows a timing with distribution ratio N=3.

The synchronous oscillator 410 is controlled in oscillation frequency by oscillation frequency control signal FCV, takes in input clock signal CKI as input, and is formed by a ring oscillator 413 having at least one injection circuit 411.

The injection circuit 411 adds a signal component of the product of clock signal CKI that is an injection signal and clock signal VC to input clock signal VC and outputs a resultant signal.

Consequently, as shown in FIGS. 38A through 38C, the edge of output clock signal CKO is locked with the center of clock signal CKI that is an edge injection signal.

Thus, as shown in FIGS. 38A through 38C, the clock distribution circuit 400 outputs output clock signal CKO that is locked with input clock signal CKI.

It should be noted that, with the synchronous oscillator 410, the edge of output clock signal CKO is locked with the center of "H to L to H" pulse of input clock signal CKI that is the injection signal of the injection circuit 411. Therefore, the clock frequencies of these signals need not be the same; for example, the clock frequency of input clock signal CKI may be 1/N (N being a natural number) of output clock signal CKO.

Hence, the clock distribution circuit 400 associated with the sixth embodiment need not distribute high-frequency clock signals, thereby achieving saved power dissipation.

(7) The Seventh Embodiment

The Second Exemplary Configuration of the Clock Distribution Circuit

Referring to FIG. 39, there is shown an exemplary configuration of the clock distribution circuit practiced as the seventh embodiment of the invention.

A clock distribution circuit 400A associated with the seventh embodiment has an edge detector 420 for generating edge detection signal SED an injection signal from input clock signal CKI and supplying the generated edge detection signal to the input of the synchronous oscillator 410 of the sixth embodiment.

This clock distribution circuit 400A is substantially the same in configuration as the clock recovery apparatus 200 shown in FIG. 14 associated with the second embodiment except that the reception data signal and the recovery clock signal are input clock signal CKI and output clock signal CKO, respectively.

Figure 40A:
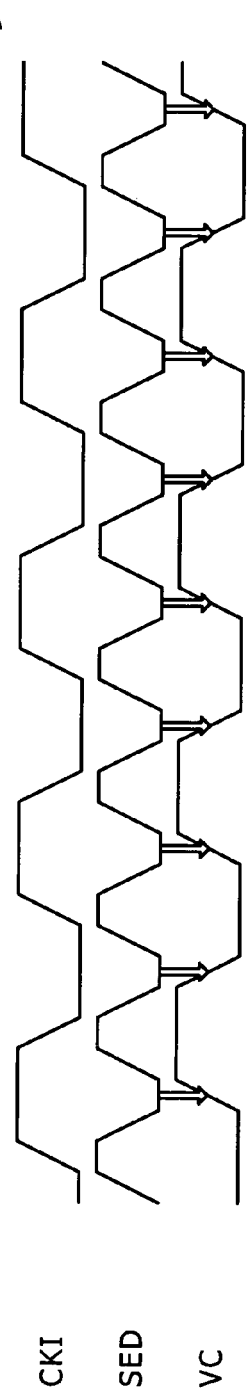
FIGS. 40A, 40B, 40C are timing charts indicative of exemplary operations of the, clock distribution circuit practiced as the seventh embodiment of the invention.
Figure 40B:
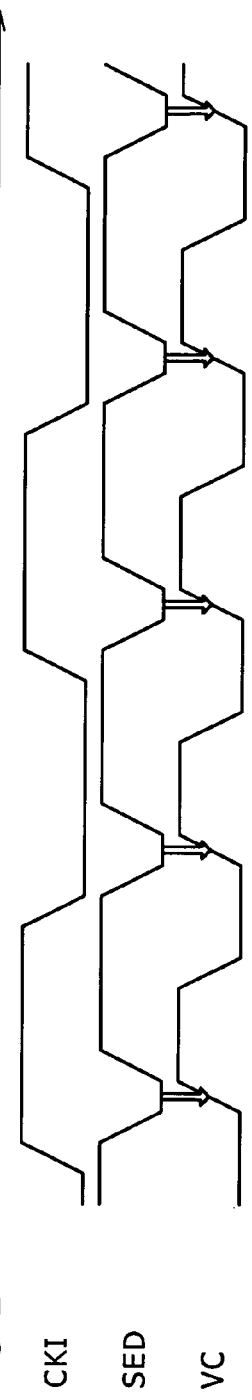
Figure 40C:
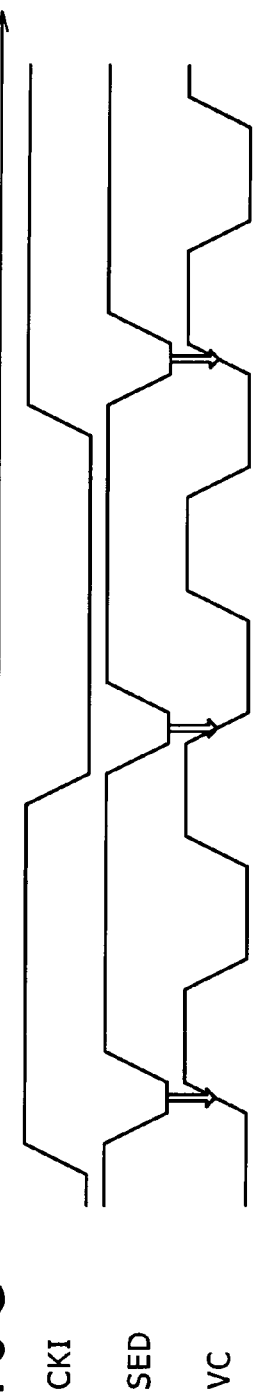

FIGS. 40A through 40C show timing charts indicative of exemplary operations of the clock distribution circuit associated with the seventh embodiment.

FIG. 40A shows a timing with distribution ratio N being 1 (N=1). FIG. 40B shows a timing with N=2. FIG. 40C shows a timing with N=3.

In the clock distribution circuit 400A, the edge of clock signal VC is locked with the center of edge detection signal SED that is an edge injection signal as shown in FIGS. 40A through 40C.

Thus, as shown in the timing charts shown FIGS. 40A through 40C, the clock distribution circuit 400A outputs output clock signal CKO that is locked with input clock signal CKI.

It should be noted that, with the synchronous oscillator 410, the edge of output clock signal CKO is locked with the center of the pulse of edge detection signal SED. Therefore, the clock frequencies of these signals need not be the same; for example, the clock frequency of input clock signal CKI may be 1/N (N being a natural number) of output clock signal CKO.

Hence, the clock distribution circuit 400A associated with the seventh embodiment need not distribute high-frequency clock signals, thereby achieving saved power dissipation.

(8) The Eighth Embodiment

The Second Exemplary Configuration of the Clock Distribution circuit

Referring to FIG. 41, there is shown an exemplary configuration of a clock distribution circuit practiced as the eighth embodiment of the invention.

With a clock distribution circuit 400B associated with the eighth embodiment, a rising edge and a falling edge are detected by an edge detector 420B and injection circuits 411A and 411B are arranged in the first and middle stages of a synchronous oscillator 410B.

This clock distribution circuit 400B is substantially the same in configuration as the clock recovery apparatus shown in FIG. 18 associated with the third embodiment except that a reception data signal and a recovery clock signal are input clock signal CKI and output clock signal CKO, respectively.

Figure 42A:
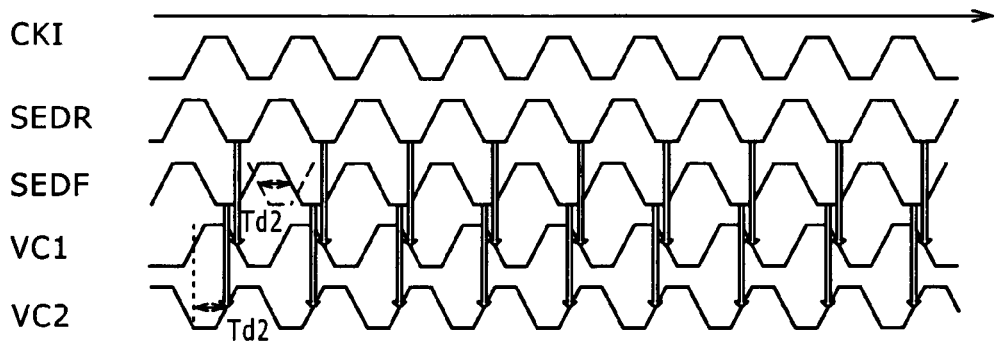
FIGS. 42A, 42B and 42C are timing charts indicative of exemplary operations of the clock distribution circuit practiced as the eighth embodiment of the invention.
Figure 42B:
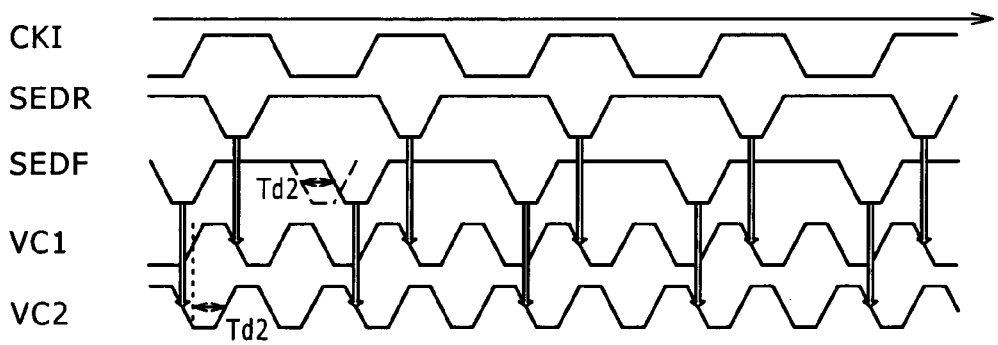
Figure 42C:
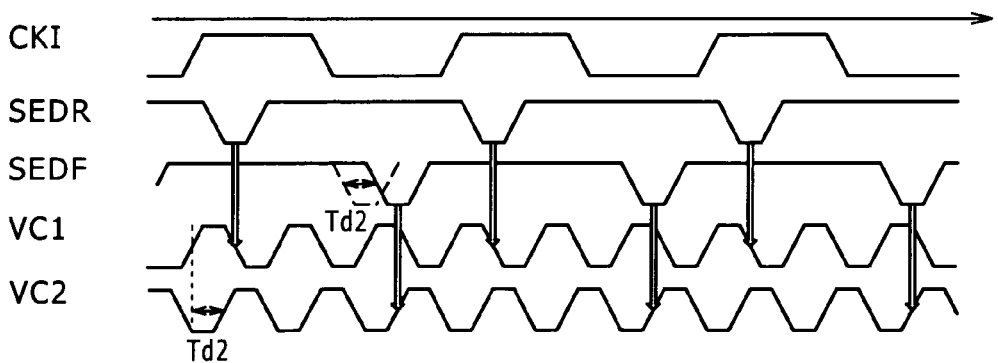

FIGS. 42A through 42C show timing charts indicative of exemplary operations of the clock distribution circuit associated with the eighth embodiment.

FIG. 42A shows a timing with distribution ratio N being 1 (N=1). FIG. 42B shows a timing with N=2. FIG. 42C shows a timing with N=3.

In the clock distribution circuit 400B, as shown in FIGS. 42A through 42C, the edge of clock signal VC is locked with the center of falling-edge detection signal SEDF and rising-edge detection signal SEDR that are edge injection signals.

Thus, as shown in the timing charts shown FIGS. 42A through 42C, the clock distribution circuit 400B outputs output clock signal CKO that is locked with input clock signal CKI.

It should be noted that, with the synchronous oscillator 410B, the edge of output clock signal CKO is locked with the center of the pulse of an edge detection signal. Therefore, the clock frequencies of these signals need not be the same; for example, the clock frequency of input clock signal CKI may be 1/N (N being a natural number) of output clock signal CKO.

Hence, the clock distribution circuit 400B associated with the eighth embodiment need not distribute high-frequency clock signals, thereby achieving saved power dissipation.

It should also be noted that each of the above-mentioned clock distribution circuits 400, 400A, and 400B may also be configured by multi-mode injection circuits for not only an injection circuit but also an edge detector and a synchronous oscillator if the injection circuit in the synchronous oscillator making up these clock distribution circuits is configured by a multi-mode injection circuit shown in FIGS. 6 and on.

The edge detector is configured by an AND circuit and a delay circuit and a synchronous oscillator is configured by injection circuits and delay circuits.

It should be noted however that a multi-mode injection circuit may be used for an injection circuit, an AND circuit, and a delay circuit as described above.

Therefore, the edge detector and the synchronous oscillator may be configured by multi-mode injection circuits alone as shown in FIG. 24 for example. In this case, the delay times become equal to each other, thereby facilitating timing prediction. In addition, these multi-mode injection circuits can be arranged in an array, thereby making the arrangement area relatively small.

The First Exemplary Connection of the Clock Distribution Circuit

Figure 43:
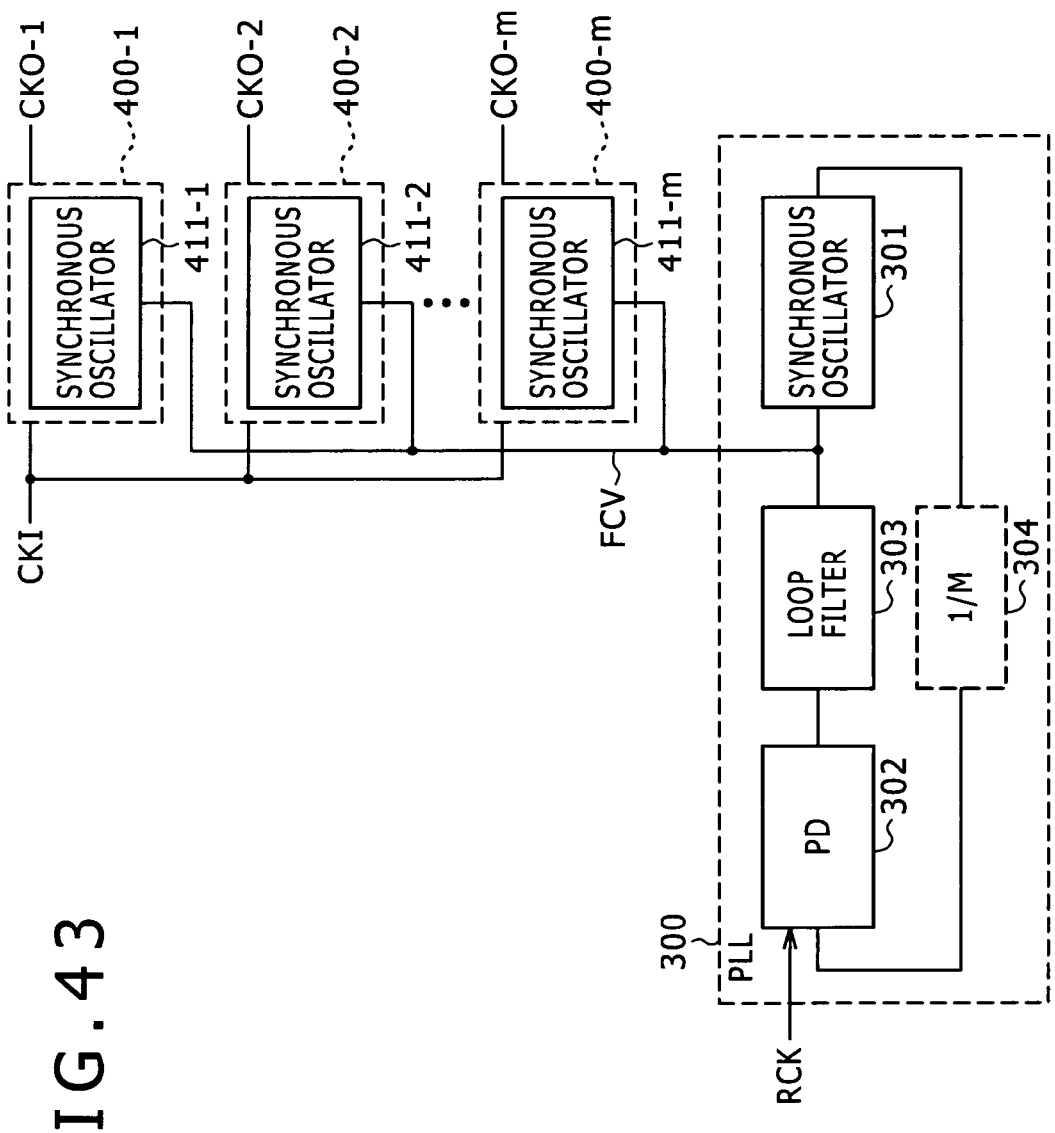
FIG. 43 is a block diagram illustrating a first exemplary connection of the clock distribution circuit practiced as embodiments of the invention.

Referring to FIG. 43, there is shown a block diagram illustrating the first exemplary connection of the clock distribution circuit associated with embodiments of the invention.

This exemplary connection is substantially the same with the exemplary connection shown in FIG. 35 of the clock recovery apparatus. For ease of understanding, components similar to those shown in FIG. 35 are denoted by the same reference numerals.

To be more specific, in this exemplary connection, two or more clock distribution circuits 400-1 through 400-m are arranged in parallel, to which oscillation frequency control voltage FCV is supplied from a phase lock circuit (PLL) 300.

In FIG. 43, the clock distribution circuits described above with reference to the sixth, seventh, and eighth embodiments are applied to the clock distribution circuits 400-1 through 400-m.

In FIG. 43, for the brevity of drawing, only the synchronous oscillators 411-1 through 411-m to which oscillation frequency control voltage FCV is supplied are shown for the clock distribution circuits 400-1 through 400-m.

The PLL 300 has a synchronous oscillator 301, a phase comparator (PD) 302, and a loop filter 303. Alternatively, a divider 304 is arranged on the output side of the voltage control oscillator 201.

The output of the loop filter 303 of the PLL 300 is outputted as oscillation frequency control voltage FCV.

The synchronous oscillator 301 of the PLL 300 has substantially the same configuration as the synchronous oscillators 220-1 through 220-m of the clock distribution circuits 400-1 through 400-m.

Consequently, the control of oscillation frequency can be executed with high accuracy.

Then, clocks CKO-1 through CKO-m locked with input clock signal CKI are outputted from the clock distribution circuits 400-1 through 400-m.

The Second Exemplary Connection of the Clock Distribution Circuit

Figure 44:
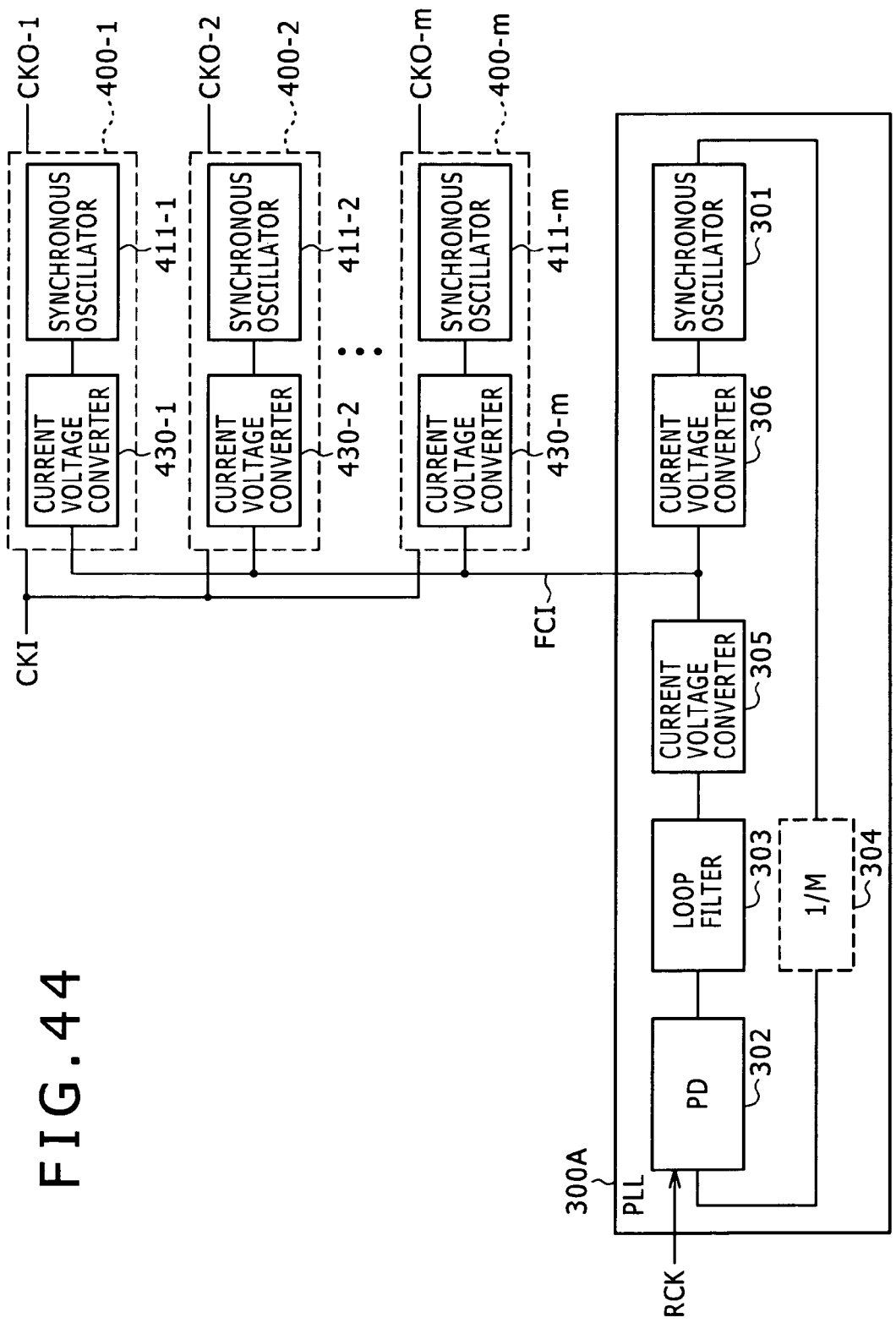
FIG. 44 is a block diagram illustrating a second exemplary connection of the clock distribution circuit practiced as embodiments of the invention.

Referring to FIG. 44, there is shown a block diagram illustrating the second exemplary connection of the clock distribution circuit associated with embodiments of the invention.

This exemplary connection is substantially the same as the exemplary connection shown in FIG. 36 of the clock recovery apparatus. For ease of understanding, components similar to those shown in FIG. 36 are denoted by the same reference numerals.

The second exemplary connection differs from the above-mentioned first exemplary connection in that oscillation frequency control current FCI is supplied by the PLL 300A instead of oscillation frequency control voltage FCV.

In accordance with the above-mentioned configuration a voltage-current converter (a VI converter) 305 is arranged on the output side of the loop filter 303 of the PLL 300A, to which the output of the voltage-current converter 305 is supplied as oscillation frequency control current FCI.

Then, in the PLL 300A, a current-voltage converter (an IV converter) 306 is arranged on the input side of the synchronous oscillator 301.

In addition, current-voltage converters (IV converters) 430-1 through 430-m are also arranged on the input side of the synchronous oscillators 411-1 through 411-m of the clock distribution circuits 400-1 through 400-m.

In this case, the control current is supplied instead of the control voltage, so that there is no problem of the influence of voltage variations, thereby correctly supplying control signals to enable the high-accuracy oscillation control.

As described above and according to embodiments of the invention, the following effects can be obtained.

The synchronous oscillator according to embodiments of the invention adds a signal component of the product of an internal clock signal and an input injection signal to the internal input clock signal in the synchronous oscillator by an injection circuit and outputs a resultant signal.

The clock recovery apparatus according to embodiments of the invention generates an injection signal indicative of the edge detection of a reception data signal and adds a signal component of the product of a clock signal input and the injection signal input to the clock signal input in a synchronous oscillator by an injection circuit, thereby outputting a resultant signal. Then, the clock recovery apparatus outputs a recovery clock signal locked with a reception data signal.

Consequently, by outputting a recovery clock signal having one half of data rate, effects of an increased data rate and lowered power dissipation can be attained.

In addition, by adjusting the amount of addition of a signal component of the product of a clock signal input and an injection signal input in an injection circuit, the durability against reception data signal jitters can be improved.

Further, an edge detector having separate circuits for detecting the rising edge of reception data signal and detecting the falling edge of reception data signal improves the durability against jitters contained in each reception data signal.

The clock distribution circuit according to embodiments of the invention generates an injection signal indicative of the edge detection of an input clock signal and adds a signal component of the product of an internal clock signal and an injection signal to the internal clock signal in a synchronous oscillator by an injection circuit, thereby outputting a resultant signal. Then, the clock distribution circuit outputs a clock signal locked with an input clock signal.

Consequently, the clock frequency of an input clock signal may be 1/N (N being a natural number) of an output clock signal. Hence, the clock distribution circuit according to embodiments of the invention need not distribute high-frequency clock signals, thereby saving power dissipation.

The present application contains subject matter related to that disclosed in Japanese Priority Patent Application JP 2010-130307 filed in the Japan Patent Office on Jun. 7, 2010 and Japanese Priority Patent Application JP 2009-211009 filed in the Japan Patent Office on Sep. 11, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A synchronous oscillator comprising:
    at least one injection circuit having an injection signal input terminal, an internal clock signal input terminal, and a clock output terminal; and
    at least one delay circuit cascaded to said injection circuit; wherein
    with said cascaded injection circuit and delay circuit, an output of a last stage is connected to an internal clock signal input terminal of a first stage to form a ring oscillator and
    said injection circuit adds a signal component of a product of an internal clock signal entered in said clock signal input terminal and an injection signal entered in said injection signal input terminal to said internal clock signal, thereby outputting a resultant signal from said clock output terminal as a clock signal.

2. The synchronous oscillator according to claim 1, wherein
said injection circuit functions as a delay circuit with said injection signal input terminal connected to a predetermined potential; and
said delay circuit forming said ring oscillator is formed by said injection circuit with said injection signal input terminal connected to a predetermined potential.

3. The synchronous oscillator according to claim 1, wherein
said injection circuit has
a first load impedance and a second load impedance;
a first transistor through a tenth transistor;
a first node connected to one of a current source and a predetermined potential;
a second node connected to said first load impedance; and
a third node connected to said second load impedance;
a source of said first transistor and a source of said second transistor being connected to said first node,
said third transistor and said fourth transistor being connected with each other in sources thereof and drains thereof, a connection node between the sources being connected to a drain of said first transistor and a connection node between the drains being connected to said second node,
a gate of said third transistor being connected to an input terminal of a first signal,
a gate of said fourth transistor being connected to said injection signal input terminal,
said fifth transistor and said sixth transistor being connected with each other in sources thereof and in drains thereof, a connection node between said sources being connected to said drain of said first transistor and a connection node between said drains being connected to said third node,
a gate of said fifth transistor being connected to an input terminal of an inverted signal of said injection signal,
a gate of said sixth transistor being connected to an input terminal of an inverted signal of said first signal,
said seventh transistor and said eighth transistor being connected with each other in sources thereof and drains thereof, a connection node between said sources being connected to a drain of said second transistor and a connection node between said drains being connected to said second node,
a gate of said seventh transistor being connected to an input terminal of a second signal,
a gate of said eighth transistor being connected to an input terminal of an inverted signal of said injection signal,
said ninth transistor and said tenth transistor being connected with each other in sources thereof and drains thereof, a connection node between said sources being connected to the drain of said second transistor and a connection node between said drains being connected to said third node,
a gate of said ninth transistor being connected to said injection signal input terminal, and
a gate of said tenth transistor being connected to an input terminal of an inverted signal of said second signal.

4. The synchronous oscillator according to claim 3, wherein
said injection circuit
functions as said injection circuit when said first signal is supplied at a level where said third transistor is conducting and said second signal is supplied at a level where said seventh transistor is not conducting,
functions as said delay circuit when said first signal is supplied at a level where said third transistor is not conducting, said second signal is supplied at a level where said seventh transistor is not conducting, and said injection signal is supplied at a level where said fourth transistor and said ninth transistor are conducting, and
functions as a logic circuit when said second signal is supplied at a level where said seventh transistor is not conducting and said injection signal is supplied at a level where said fourth transistor and said ninth transistor are conducting.

5. A clock recovery apparatus comprising:
an edge detection block configured to detect an edge of a reception data signal to output an edge detection signal; and
a synchronous oscillator configured to take in said edge detection signal as an injection signal to output a clock signal; wherein
said synchronous oscillator has
at least one injection circuit having an injection signal input terminal, an internal clock signal input terminal, and a clock output terminal and
at least one delay circuit cascaded to said at least one injection circuit,
said cascaded injection circuit and said delay circuit forming a ring oscillator with an output of a last stage connected to an internal clock signal input terminal of a first stage and
said injection circuit having a function of adding a signal component of a product of said internal clock signal and an edge detection signal that is an injection signal to be entered in said injection signal input terminal to said internal clock signal that is entered in said internal clock signal input terminal, thereby outputting a resultant signal from said clock output terminal as a clock signal.

6. The clock recovery apparatus according to claim 5, wherein
said edge detection block
detects a rising edge and a falling edge of said reception data signal to output a rising-edge detection signal and a falling-edge detection signal to said synchronous oscillator and,
in said synchronous oscillator,
two injection circuits are connected in said ring oscillator,
one of said two injection circuits is entered at said injection signal input terminal with one of said rising-edge detection signal and said falling-edge detection signal, and
the other of said two injection circuits is entered at said injection signal input terminal with the other of said rising-edge detection signal and said falling-edge detection signal.

7. The clock recovery apparatus according to claim 6, wherein
said edge detection block
has a delay circuit configured to delay said reception data signal by a time shorter than a period of said reception data signal and
generates a rising-edge detection signal and a falling-edge detection signal by a logic operation between said reception data signal and a delay signal generated by said delay circuit, thereby outputting the generated rising-edge detection signal and the generated falling-edge detection signal to said synchronous oscillator.

8. The clock recovery apparatus according to claim 5, wherein
said injection circuit is connected at said injection signal input terminal to a predetermined potential to function as a delay circuit and
said delay circuit forming said ring oscillator is formed by said at least one injection circuit with said injection signal input terminal connected to a predetermined potential.

9. A clock recovery apparatus comprising:
an injection signal generator configured to generate an edge detection signal for a first edge of a reception data signal to generate a gating signal and generate an edge detection signal for an edge of a reception data signal to generate at least one injection signal; and
a synchronous oscillator configured to take in said gating signal and said injection signal to output a clock signal; wherein
said synchronous oscillator has
a plurality of injection circuits each having an injection signal input terminal, an internal clock signal input terminal, a gating signal input terminal, and a clock output terminal and
at least one delay circuit cascaded to said plurality of injection circuits,
one of said plurality of injection circuits being entered at said gating signal input terminal with said gating signal,
at least one of said plurality of injection circuits being entered at said injection signal input terminal with said injection signal,
said plurality of cascaded injection circuits and said at least one delay circuit forming a ring oscillator with an output of a last stage connected to said internal clock signal input terminal of a first stage,
said plurality of injection circuits having a function of adding a signal component of a product of a clock signal and an edge detection signal that is an injection signal entered in said injection signal input terminal to said internal clock signal entered in said clock signal input terminal, thereby outputting a resultant signal from said clock output terminal as a clock signal, and
functioning as a logic circuit when said gating signal is entered in said gating signal input terminal.

10. The clock recovery apparatus according to claim 9, wherein
in said synchronous oscillator,
two injection circuits are connected in said ring oscillator,
said gating signal is entered in said injection circuit of the first stage, and
said injection signal is entered in said injection circuit of a subsequent stage.

11. The clock recovery apparatus according to claim 9, wherein
said injection signal generator
generates said gating signal and said plurality of injection signals to output generated gating signal and the generated plurality of injection signals to said synchronous oscillator and,
in said synchronous oscillator,
said gating signal and one of said plurality of injection signals are entered in one of said plurality of injection circuits.

12. The clock recovery apparatus according to claim 11, wherein
in said synchronous oscillator,
two injection circuits are connected in said ring oscillator, one of said injection signals is entered in said injection circuit of the first stage, and
another of said plurality of injection signal and said gating signal are entered in said injection circuit of a subsequent stage.

13. The clock recovery apparatus according to claim 9, wherein
said injection signal generator has
a gating signal edge detection block configured to generate an edge detection signal for a first edge of a reception data signal to generate a gating signal; and
an injection signal edge detection block configured to generate an edge detection signal for any one of a second and subsequent edges of reception data signal to generate at least one injection signal.

14. The clock recovery apparatus according to claim 9, wherein
said plurality of injection circuits each function as a delay circuit with said injection signal input terminal and said gating signal input terminal connected to a predetermined potential and
said delay circuit forming said ring oscillator is formed by any one of said plurality of injection circuits with said injection signal input terminal and said gating signal input terminal connected to a predetermined potential.

15. The clock recovery apparatus according to claim 5, wherein
said injection circuit has
a first load impedance and a second load impedance;
a first transistor through a tenth transistor;
a first node connected to one of a current source and a predetermined potential;
a second node connected to said first load impedance; and
a third node connected to said second load impedance;
a source of said first transistor and a source of said second transistor being connected to said first node,
said third transistor and said fourth transistor being connected with each other in sources thereof and drains thereof, a connection node between the sources being connected to a drain of said first transistor and a connection node between the drains being connected to said second node,
a gate of said third transistor being connected to an input terminal of a first signal,
a gate of said fourth transistor being connected to said injection signal input terminal,
said fifth transistor and said sixth transistor being connected with each other in sources thereof and in drains thereof, a connection node between said sources being connected to said drain of said first transistor and a connection node between said drains being connected to said third node,
a gate of said fifth transistor being connected to an input terminal of an inverted signal of said injection signal,
a gate of said sixth transistor being connected to an input terminal of an inverted signal of said first signal,
said seventh transistor and said eighth transistor being connected with each other in sources thereof and drains thereof, a connection node between said sources being connected to a drain of said second transistor and a connection node between said drains being connected to said second node,
a gate of said seventh transistor being connected to an input terminal of a second signal,
a gate of said eighth transistor being connected to an input terminal of an inverted signal of said injection signal, said ninth transistor and said tenth transistor being connected with each other in sources thereof and drains thereof, a connection node between said sources being connected to the drain of said second transistor and a connection node between said drains being connected to said third node, a gate of said ninth transistor being connected to said injection signal input terminal, and a gate of said tenth transistor being connected to an input terminal of an inverted signal of said second signal.

16. The clock recovery apparatus according to claim 9, wherein said injection circuit has a first load impedance and a second load impedance;

a first transistor through a tenth transistor;

a first node connected to one of a current source and a predetermined potential;

a second node connected to said first load impedance; and a third node connected to said second load impedance;

a source of said first transistor and a source of said second transistor being connected to said first node, said third transistor and said fourth transistor being connected with each other in sources thereof and drains thereof, a connection node between the sources being connected to a drain of said first transistor and a connection node between the drains being connected to said second node, a gate of said third transistor being connected to an input terminal of a first signal, a gate of said fourth transistor being connected to said injection signal input terminal, said fifth transistor and said sixth transistor being connected with each other in sources thereof and in drains thereof, a connection node between said sources being connected to said drain of said first transistor and a connection node between said drains being connected to said third node, a gate of said fifth transistor being connected to an input terminal of an inverted signal of said injection signal, a gate of said sixth transistor being connected to an input terminal of an inverted signal of said first signal, said seventh transistor and said eighth transistor being connected with each other in sources thereof and drains thereof, a connection node between said sources being connected to a drain of said second transistor and a connection node between said drains being connected to said second node, a gate of said seventh transistor being connected to an input terminal of a second signal, a gate of said eighth transistor being connected to an input terminal of an inverted signal of said injection signal, said ninth transistor and said tenth transistor being connected with each other in sources thereof and drains thereof, a connection node between said sources being connected to the drain of said second transistor and a connection node between said drains being connected to said third node, a gate of said ninth transistor being connected to said injection signal input terminal, and a gate of said tenth transistor being connected to an input terminal of an inverted signal of said second signal.

17. The clock recovery apparatus according to claim 15, wherein said injection circuit functions as said injection circuit when said first signal is supplied at a level where said third transistor is conducting and said second signal is supplied at a level where said seventh transistor is not conducting, functions as said delay circuit when said first signal is supplied at a level where said third transistor is not conducting, said second signal is supplied at a level where said seventh transistor is not conducting, and said injection signal is supplied at a level where said fourth transistor and said ninth transistor are conducting, and functions as a logic circuit when said second signal is supplied at a level where said seventh transistor is not conducting and said injection signal is supplied at a level where said fourth transistor and said ninth transistor are conducting.

18. The clock recovery apparatus according to claim 16, wherein said injection circuit functions as said injection circuit when said first signal is supplied at a level where said third transistor is conducting and said second signal is supplied at a level where said seventh transistor is not conducting, functions as said delay circuit when said first signal is supplied at a level where said third transistor is not conducting, said second signal is supplied at a level where said seventh transistor is not conducting, and said injection signal is supplied at a level where said fourth transistor and said ninth transistor are conducting, and functions as a logic circuit when said second signal is supplied at a level where said seventh transistor is not conducting and said injection signal is supplied at a level where said fourth transistor and said ninth transistor are conducting.

19. The clock recovery apparatus according to claim 17, wherein said edge detection block has a delay circuit configured to delay said reception data signal by a time shorter than a period of said reception data signal and a logic circuit, and generates a rising-edge detection signal and falling-edge detection signal by executing a logic operation between said reception data signal and a delay signal of said delay circuit by said logic circuit and outputs the generated rising-edge detection signal and the generated falling-edge detection signal to said synchronous oscillator;

said delay circuit and said logic circuit in said edge detection block, and a delay circuit of said synchronous oscillator being formed by said injection circuit.

20. The clock recovery apparatus according to claim 18, wherein said edge detection block has a delay circuit configured to delay said reception data signal by a time shorter than a period of said reception data signal and a logic circuit, and generates a rising-edge detection signal and falling-edge detection signal by executing a logic operation between said reception data signal and a delay signal of said delay circuit by said logic circuit and outputs the generated rising-edge detection signal and the generated falling-edge detection signal to said synchronous oscillator;

said delay circuit and said logic circuit in said edge detection block, and a delay circuit of said synchronous oscillator being formed by said injection circuit.

21. The clock recovery apparatus according to claim 5, further comprising an oscillation control signal generation block configured to generate an oscillation frequency control signal, wherein said synchronous oscillator is capable of outputting said clock signal having an oscillation frequency controlled by an oscillation frequency control signal and said oscillation control signal generation block has an oscillator that is substantially the same in configuration as said synchronous oscillator and oscillates at a frequency in accordance with a control voltage, thereby generating said oscillation frequency control signal through a phase lock loop including said synchronous oscillator.

22. The clock recovery apparatus according to claim 9, further comprising an oscillation control signal generation block configured to generate an oscillation frequency control signal, wherein said synchronous oscillator is capable of outputting said clock signal having an oscillation frequency controlled by an oscillation frequency control signal and said oscillation control signal generation block has an oscillator that is substantially the same in configuration as said synchronous oscillator and oscillates at a frequency in accordance with a control voltage, thereby generating said oscillation frequency control signal through a phase lock loop including said synchronous oscillator.

23. A clock distribution circuit comprising a synchronous oscillator configured to output a clock signal in accordance with an input clock signal, wherein said synchronous oscillator has at least one injection circuit having an injection signal input terminal, an internal clock signal input terminal, and a clock output terminal and at least one delay circuit cascaded to said injection circuit, said injection circuit and said delay circuit cascaded thereto being connected at an output of a last stage to an internal clock signal input terminal of a first stage to form a ring oscillator and said injection circuit having a function of adding a signal component of a product of said internal clock signal and an injection signal entered in said injection signal input terminal to said internal clock signal entered in said clock signal input terminal to output a resultant signal from said clock output terminal as a clock signal.

24. The clock distribution circuit according to claim 23, further comprising an edge detection block configured to detect an edge of said input clock signal to output an edge detection signal to said synchronous oscillator, wherein said synchronous oscillator takes in said edge detection signal as an injection signal to output a clock signal.

25. The clock distribution circuit according to claim 24, wherein said edge detection block detects a rising edge and a falling edge of said input clock signal to output the detected rising-edge signal and the detected falling-edge signal to said synchronous oscillator and, in said synchronous oscillator, two injection circuits are connected in said ring oscillator, one of said two injection circuits is entered at said injection signal input terminal with one of said rising-edge detection signal and said falling-edge detection signal, and the other of said two injection circuits is entered at said injection signal input terminal with the other of said rising-edge detection signal and said falling-edge detection signal.

26. The clock distribution circuit according to claim 25, wherein said edge detection block has a delay circuit configured to delay said input clock signal by a time shorter than a period of said input clock signal and generates a rising-edge detection signal and a falling-edge detection signal by a logic operation between said input clock signal and a delay signal generated by said delay circuit, thereby outputting the generated rising-edge detection signal and the generated falling-edge detection signal to said synchronous oscillator.

27. The clock distribution circuit according to claim 23, wherein said injection circuit is connected at said injection signal input terminal to a predetermined potential to function as a delay circuit and said delay circuit forming said ring oscillator is formed by said at least one injection circuit with said injection signal input terminal connected to a predetermined potential.

28. The clock distribution circuit according to claim 23, wherein said injection circuit has a first load impedance and a second load impedance;

a first transistor through a tenth transistor;

a first node connected to one of a current source and a predetermined potential;

a second node connected to said first load impedance; and a third node connected to said second load impedance;

a source of said first transistor and a source of said second transistor being connected to said first node, said third transistor and said fourth transistor being connected with each other in sources thereof and drains thereof, a connection node between the sources being connected to a drain of said first transistor and a connection node between the drains being connected to said second node, a gate of said third transistor being connected to an input terminal of a first signal, a gate of said fourth transistor being connected to said injection signal input terminal, said fifth transistor and said sixth transistor being connected with each other in sources thereof and in drains thereof, a connection node between said sources being connected to said drain of said first transistor and a connection node between said drains being connected to said third node, a gate of said fifth transistor being connected to an input terminal of an inverted signal of said injection signal, a gate of said sixth transistor being connected to an input terminal of an inverted signal of said first signal, said seventh transistor and said eighth transistor being connected with each other in sources thereof and drains thereof, a connection node between said sources being connected to a drain of said second transistor and a connection node between said drains being connected to said second node, a gate of said seventh transistor being connected to an input terminal of a second signal, a gate of said eighth transistor being connected to an input terminal of an inverted signal of said injection signal, said ninth transistor and said tenth transistor being connected with each other in sources thereof and drains thereof, a connection node between said sources being connected to the drain of said second transistor and a connection node between said drains being connected to said third node, a gate of said ninth transistor being connected to said injection signal input terminal, and a gate of said tenth transistor being connected to an input terminal of an inverted signal of said second signal.

29. The clock distribution circuit according to claim 28, wherein said injection circuit functions as said injection circuit when said first signal is supplied at a level where said third transistor is conducting and said second signal is supplied at a level where said seventh transistor is not conducting, functions as said delay circuit when said first signal is supplied at a level where said third transistor is not conducting, said second signal is supplied at a level where said seventh transistor is not conducting, and said injection signal is supplied at a level where said fourth transistor and said ninth transistor are conducting, and functions as a logic circuit when said second signal is supplied at a level where said seventh transistor is not conducting and said injection signal is supplied at a level where said fourth transistor and said ninth transistor are conducting.

30. The clock distribution circuit according to claim 29, wherein said edge detection block has a delay circuit configured to delay said input clock signal by a time shorter than a period of said input clock signal and a logic circuit; and generates a rising-edge detection signal and falling-edge detection signal by executing a logic operation between said input clock signal and a delay signal of said delay circuit by said logic circuit and outputs the generated rising-edge detection signal and the generated falling-edge detection signal to said synchronous oscillator;

said delay circuit and said logic circuit in said edge detection block, and a delay circuit of said synchronous oscillator being formed by said injection circuit.

31. The clock distribution circuit according to claim 23, further comprising an oscillation control signal generation block configured to generate an oscillation frequency control signal, wherein said synchronous oscillator is capable of outputting said clock signal having an oscillation frequency controlled by an oscillation frequency control signal and said oscillation frequency control signal generation block has an oscillator that is substantially the same in configuration as said synchronous oscillator and oscillates at a frequency in accordance with a control voltage, thereby generating said oscillation frequency control signal through a phase lock loop including said synchronous oscillator.

32. A multi-mode injection circuit comprising:

a first load impedance and a second load impedance;

a first transistor through a tenth transistor;

a first node connected to one of a current source and a predetermined potential;

a second node connected to said first load impedance; and a third node connected to said second load impedance;

a source of said first transistor and a source of said second transistor being connected to said first node, said third transistor and said fourth transistor being connected with each other in sources thereof and drains thereof, a connection node between the sources being connected to a drain of said first transistor and a connection node between the drains being connected to said second node, a gate of said third transistor being connected to an input terminal of a first signal, a gate of said fourth transistor being connected to an injection signal input terminal, said fifth transistor and said sixth transistor being connected with each other in sources thereof and in drains thereof, a connection node between said sources being connected to said drain of said first transistor and a connection node between said drains being connected to said third node, a gate of said fifth transistor being connected to an input terminal of an inverted signal of said injection signal, a gate of said sixth transistor being connected to an input terminal of an inverted signal of said first signal, said seventh transistor and said eighth transistor being connected with each other in sources thereof and drains thereof, a connection node between said sources being connected to a drain of said second transistor and a connection node between said drains being connected to said second node, a gate of said seventh transistor being connected to an input terminal of a second signal, a gate of said eighth transistor being connected to an input terminal of an inverted signal of said injection signal, said ninth transistor and said tenth transistor being connected with each other in sources thereof and drains thereof, a connection node between said sources being connected to the drain of said second transistor and a connection node between said drains being connected to said third node, a gate of said ninth transistor being connected to said injection signal input terminal, and a gate of said tenth transistor being connected to an input terminal of an inverted signal of said second signal.

33. The multi-mode injection circuit according to claim 32, wherein said multi-mode injection circuit functions as said injection circuit when said first signal is supplied at a level where said third transistor is conducting and said second signal is supplied at a level where said seventh transistor is not conducting, functions as a delay circuit when said first signal is supplied at a level where said third transistor is not conducting, said second signal is supplied at a level where said seventh transistor is not conducting, and said injection signal is supplied at a level where said fourth transistor and said ninth transistor are conducting, and functions as a logic circuit when said second signal is supplied at a level where said seventh transistor is not conducting and said injection signal is supplied at a level where said fourth transistor and said ninth transistor are conducting.

* * * * *